(12) United States Patent
Um et al.

(10) Patent No.: US 12,514,112 B2
(45) Date of Patent: Dec. 30, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Hyunah Um, Yongin-si (KR); Hyeongmin Kim, Yongin-si (KR); Youngjin Park, Yongin-si (KR); Heechoon Ahn, Yongin-si (KR); Juhui Yun, Yongin-si (KR); Yeseul Lee, Yongin-si (KR); Hyoyoung Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 881 days.

(21) Appl. No.: 17/831,724

(22) Filed: Jun. 3, 2022

(65) Prior Publication Data

US 2023/0141905 A1    May 11, 2023

(30) Foreign Application Priority Data

Nov. 2, 2021   (KR) .......................... 10-2021-0148958

(51) Int. Cl.
*H10K 85/40*   (2023.01)
*H10K 50/15*   (2023.01)
*H10K 50/165*  (2023.01)
*H10K 85/60*   (2023.01)

(52) U.S. Cl.
CPC ............. *H10K 85/40* (2023.02); *H10K 50/15* (2023.02); *H10K 50/165* (2023.02); *H10K 85/654* (2023.02); *H10K 85/6572* (2023.02)

(58) Field of Classification Search
CPC .. H10K 2101/90; H10K 85/40; H10K 50/165; H10K 50/16
See application file for complete search history.

(56) References Cited

U.S. PATENT DOCUMENTS

| | | |
|---|---|---|
| 10,910,580 B2 | 2/2021 | Choi et al. |
| 11,515,489 B2 | 11/2022 | Wolohan et al. |
| 12,101,997 B2 | 9/2024 | Hashimoto et al. |
| 2017/0098782 A1* | 4/2017 | Choi ..................... H10K 30/865 |
| 2017/0117488 A1* | 4/2017 | Ahn ..................... H10K 85/6574 |
| 2019/0058144 A1 | 2/2019 | Lee et al. |

(Continued)

FOREIGN PATENT DOCUMENTS

| | | |
|---|---|---|
| KR | 10-2017-0040851 | 4/2017 |
| KR | 10-2018-0027468 | 3/2018 |
| KR | 10-2019-0013105 | 2/2019 |

(Continued)

*Primary Examiner* — Sean M DeGuire
(74) *Attorney, Agent, or Firm* — CANTOR COLBURN LLP

(57) ABSTRACT

A light-emitting device includes a first electrode, and second electrode facing the first electrode, and an interlayer between the first electrode and the second electrode. The interlayer includes an emission layer and a layer. The emission layer includes a first hole transport compound, a first electron transport compound, and a third compound. The layer includes the first electron transport compound, a metal-containing material, and a second electron transport compound, and the layer is between the emission layer and the second electrode.

18 Claims, 2 Drawing Sheets

(56) References Cited

U.S. PATENT DOCUMENTS

2020/0168819 A1  5/2020  Ahn et al.

FOREIGN PATENT DOCUMENTS

| KR | 10-2020-0062465 | 6/2020 |
| KR | 10-2214339 | 2/2021 |
| KR | 1020210059652 A | 5/2021 |
| KR | 1020210109549 A | 9/2021 |

* cited by examiner

LIGHT-EMITTING DEVICE AND ELECTRONIC APPARATUS INCLUDING THE SAME

CROSS-REFERENCE TO RELATED APPLICATION(S)

This application claims priority to and benefits of Korean Patent Application No. 10-2021-0148958 under 35 U.S.C. § 119, filed on Nov. 2, 2021 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Light-emitting devices are self-emissive devices that, as compared with devices of the related art, have wide viewing angles, high contrast ratios, short response times, and excellent characteristics in terms of luminance, driving voltage, and response speed.

In a light-emitting device, a first electrode is located on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce light.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Provided is a device with improved driving voltage, efficiency, and lifespan, as compared to devices in the related art.

Additional aspects will be set forth in part in the description which follows and, in part, will be apparent from the description, or may be learned by practice of the embodiments of the disclosure.

According to embodiments, a light-emitting device may include a first electrode, a second electrode facing the first electrode, and an interlayer disposed between the first electrode and the second electrode. The interlayer may include an emission layer, and a layer. The emission layer may include a first hole transport compound, a first electron transport compound, and a third compound. The layer may include the first electron transport compound, a metal-containing material, and a second electron transport compound, and the layer may be disposed between the emission layer and the second electrode.

In an embodiment, the layer may be doped with the first electron transport compound, and the layer may have a doping concentration greater than 0 wt % and equal to or less than about 20 wt %.

In an embodiment, the layer and the emission layer may contact each other.

In an embodiment, the light-emitting device may further include a buffer layer disposed between the emission layer and the layer.

In an embodiment, the buffer layer may contact the emission layer and the layer.

In an embodiment, the first hole transport compound may include a carbazole moiety and may include neither a triazine moiety, a pyrimidine moiety, nor a pyridine moiety, the first electron transport compound may include a Si moiety and may include a triazine moiety, a pyrimidine moiety, or a pyridine moiety, and the second electron transport compound may include a triazine moiety.

In an embodiment, the first hole transport compound may be represented by Formula 1, which is explained below.

In an embodiment, the first hole transport compound may be selected from Compounds HTH-1 to HTH-32, which are explained below.

In an embodiment, the first electron transport compound may be represented by Formula 2, which is explained below.

In an embodiment, the light-emitting device may further include a buffer layer disposed between the emission layer and the layer, wherein the buffer layer may include the first electron transport compound, and the first electron transport compound may be represented by Formula 2, which is explained below.

In an embodiment, the first electron transport compound may be selected from Compounds ETH-1 to ETH-44, which are explained below.

In an embodiment, the second electron transport compound may be represented by Formula 3, which is explained below.

In an embodiment, the second electron transport compound may be selected from Compounds ET-1 to ET-20, which are explained below.

In an embodiment, the third compound may be represented by Formula 401, which is explained below.

In an embodiment, the third compound may be selected from Compounds BD-1 to BD-6, which are explained below.

In an embodiment, the metal-containing material may include an alkali metal complex, an alkaline earth metal complex, or any combination thereof.

In an embodiment, the metal-containing material may include Compound ET-D1, Compound ET-D2, or LiF, which are explained below.

According to embodiments, an electronic apparatus may include the light-emitting device.

In an embodiment, the electronic apparatus may further include a thin-film transistor, wherein the thin-film transistor may include a source electrode and a drain electrode, and the first electrode of the light-emitting device may be electrically connected to at least one of the source electrode and the drain electrode.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
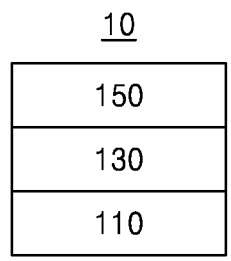
FIG. 1 is a schematic cross-section view of a structure of a light-emitting device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

A light-emitting device according to an embodiment may include a first electrode, a second electrode facing the first electrode, and an interlayer disposed between the first electrode and the second electrode.

The interlayer may include an emission layer, and a layer, wherein the emission layer may include a first hole transport compound, a first electron transport compound, and a third compound, and the layer may include the first electron transport compound, a metal-containing material, and a second electron transport compound, and the layer may be disposed between the emission layer and the second electrode.

In an embodiment, the layer may be an electron transport layer.

In an embodiment, the layer may be doped with the first electron transport compound. The layer may have a doping concentration greater than 0 wt % and equal to or less than about 20 wt %. For example, the layer may have a doping concentration greater than 0 wt % and equal to or less than about 10 wt %.

In the emission layer, a weight ratio of the first hole transport compound to the first electron transport compound may be in a range of about 9:1 to about 1:9. For example, a weight ratio of the first hole transport compound to the first electron transport compound may be in a range of about 7:3 to about 3:7. As another example, a weight ratio of the first hole transport compound to the first electron transport compound may be in a range of about 5:4 to about 4:5.

When a weight ratio of the first hole transport compound to the first electron transport compound is within the range above, hole transport may be in a desirable balance with electron transport.

In an embodiment, the first electrode may be an anode, the second electrode may be a cathode, and the light-emitting device may further include:
- a hole transport region arranged between the first electrode and the emission layer and including a hole injection layer, a hole transport layer, an electron blocking layer, or any combination thereof; and/or
- an electron transport region arranged between the second electrode and the emission layer and including a hole blocking layer, an electron injection layer, or any combination thereof may be further included.

The emission layer of the light-emitting device according to an embodiment may be formed by co-depositing the first hole transport compound and the first electron transport compound, and structures of the first hole transport compound and the first electron transport compound applied to the emission layer includes limited substituents.

A structure of the first hole transport compound may include a carbazole moiety, and a structure of the first electron transport compound has further increased structural bulkiness by a triazine, a pyrimidine, or a pyridine substituted with a silane-based derivative (detailed structures of the first hole transport compound and the first electron transport compound are described below). In an embodiment, the electron transport layer of the light-emitting device according to an embodiment may be doped with the first electron transport compound of the emission layer. Accordingly, the light-emitting device according to an embodiment may achieve charge balance in the emission layer and a delocalized light-emitting zone by controlling (for example, blocking) electron injection. As a result, triplet-polaron quenching and triplet-exciton quenching may be reduced, and interaction between a host and a dopant may be effectively controlled.

In an embodiment, the layer and the emission layer may contact each other.

In an embodiment, the light-emitting device may further include a buffer layer disposed between the emission layer and the layer. For example, the buffer layer may contact the emission layer and the layer.

In an embodiment, the light-emitting device may further include a buffer layer disposed between the emission layer and the layer, wherein the buffer layer may include the first electron transport compound, and the first electron transport compound may be represented by Formula 2, which is described below.

For charge balance in the emission layer, the light-emitting device according to an embodiment may further include the buffer layer. The buffer layer may have a single layer structure, a double layer structure, or a multi-layered structure.

In an embodiment, the first hole transport compound may include a carbazole moiety and include neither a triazine moiety, a pyrimidine moiety, nor a pyridine moiety, the first electron transport compound may include a Si moiety and may include a triazine moiety, a pyrimidine moiety, or a pyridine moiety, and the second electron transport compound may include a triazine moiety.

A Si moiety of the first electron transport compound may be bulky.

When the second electron transport compound is doped with the first electron transport compound in the layer of the light-emitting device according to an embodiment, electron transport characteristics may be effectively controlled. This is because the first electron transport compound may effectively inhibit π-π stacking in the layer by substituting the bulky silane-based derivative at triazine, pyrimidine, or pyridine. Accordingly, charge balance in the emission layer may be secured, and thus, exciton confinement may be induced to the center of the light-emitting zone.

In an embodiment, the layer (for example, an electron transport layer) may have a single layer structure, a double layer structure, or a multi-layered structure. The layer may have a doping concentration greater than 0 wt % and equal to or less than about 20 wt %. For example, a doping concentration in the layer may be greater than 0 wt % and equal to or less than about 10 wt %. When a doping concentration is greater than 20 wt %, electron trapping may occur, and thus resistance may be increased during initial electron injection, driving voltage may be increased, and efficiency and lifespan may be reduced.

In an embodiment, the first hole transport compound may be represented by Formula 1:

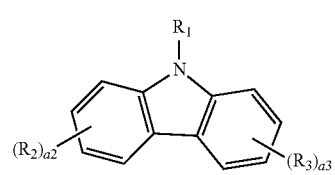

[Formula 1]

In Formula 1, $R_1$ to $R_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), a triazine moiety, a pyrimidine moiety, and a pyridine moiety may be excluded from $R_1$ to $R_3$, a2 and a3 may each independently be an integer from 1 to 4, $R_{10a}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the first hole transport compound may be selected from Compounds HTH-1 to HTH-32:

HTH-1

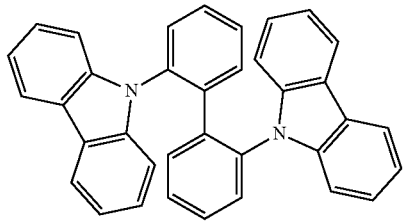

HTH-2

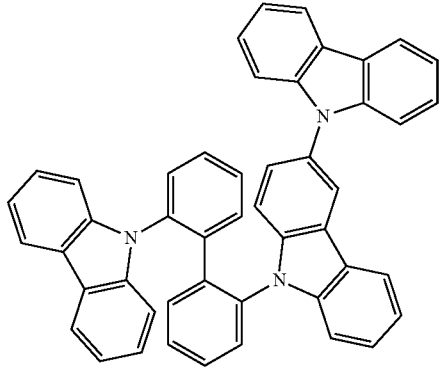

HTH-3

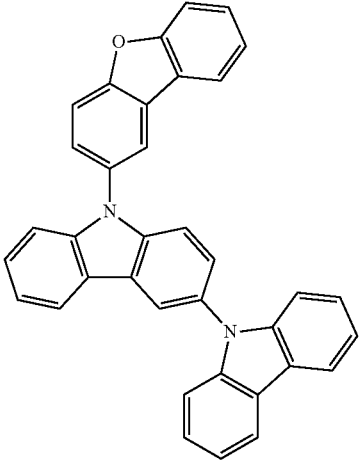

HTH-4

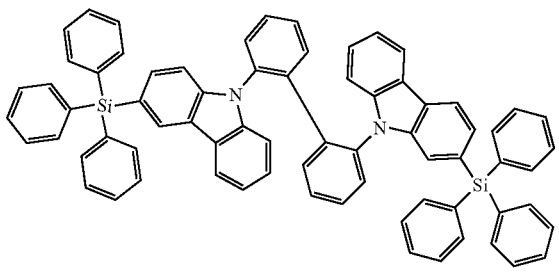

HTH-5

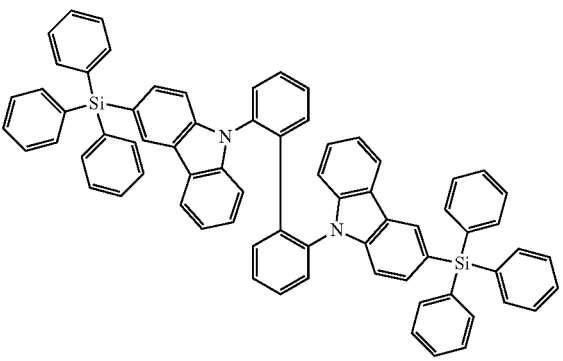

HTH-6

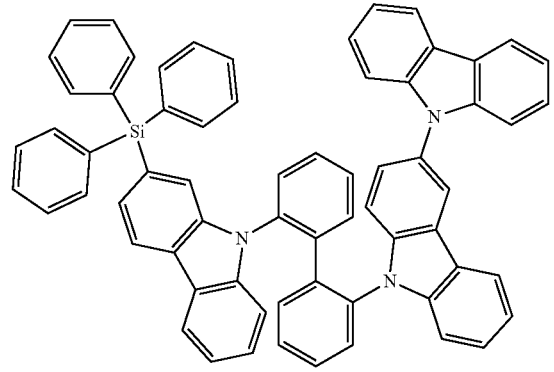

HTH-7
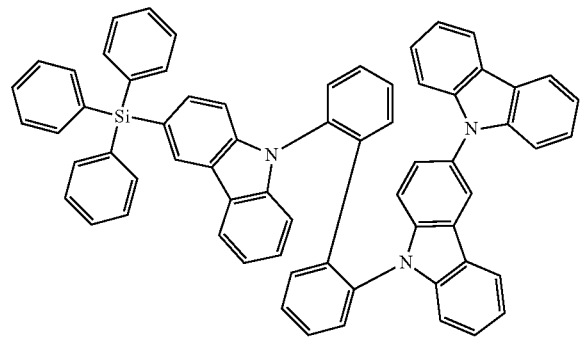
HTH-8
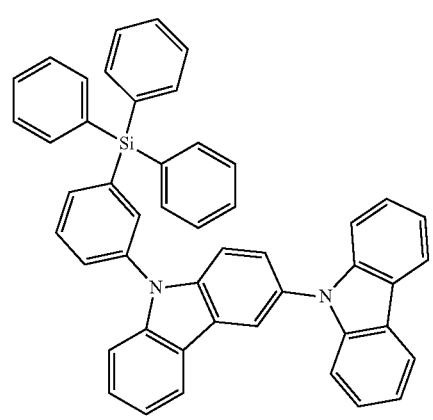
HTH-9
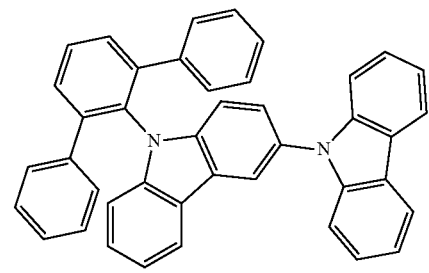
HTH-10
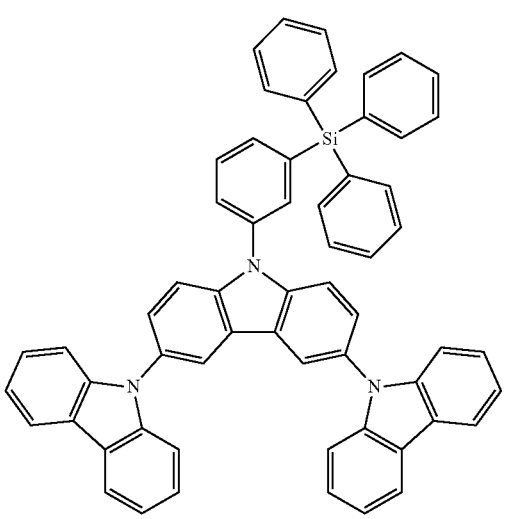
HTH-11
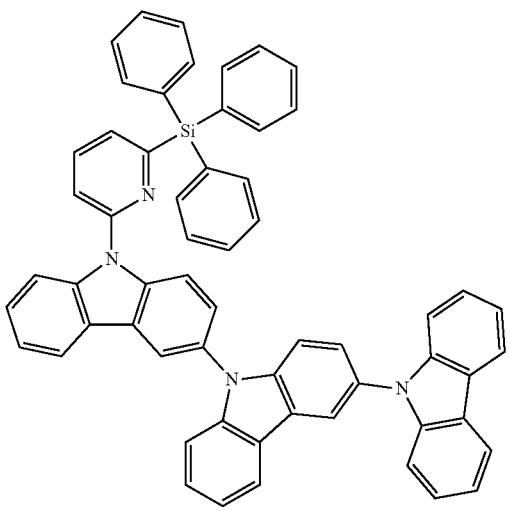
HTH-12
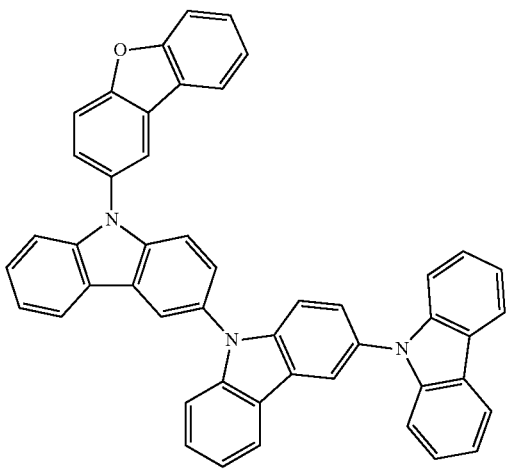
HTH-13
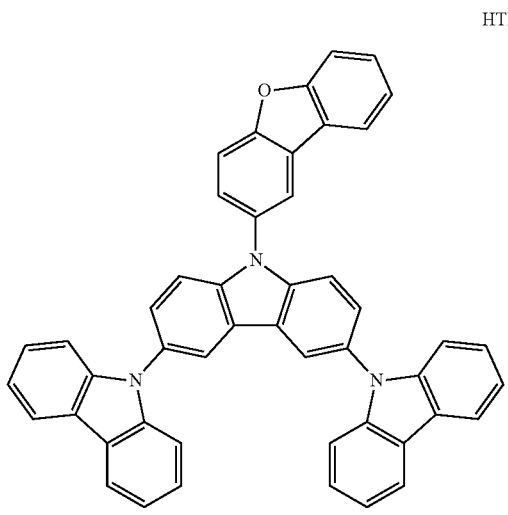

HTH-14
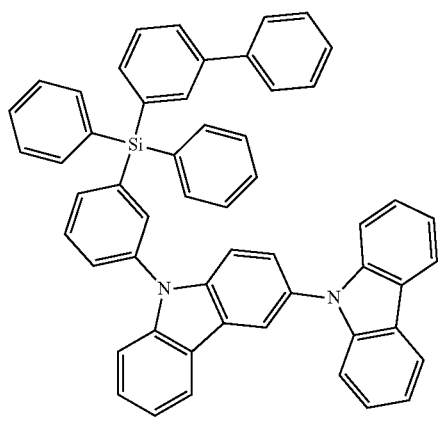
HTH-15
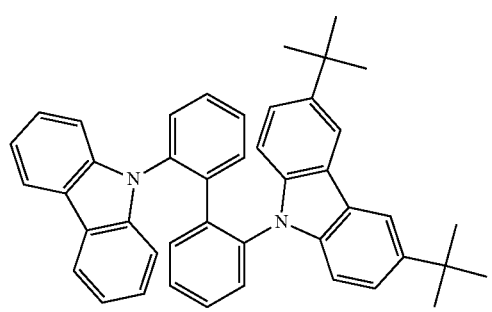
HTH-16
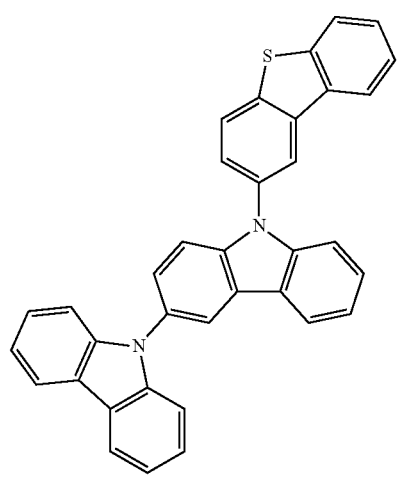
HTH-17
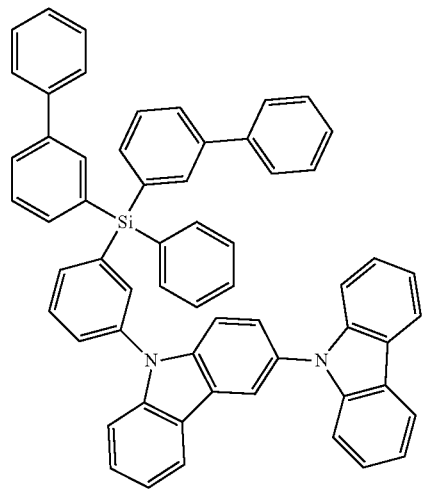
HTH-18
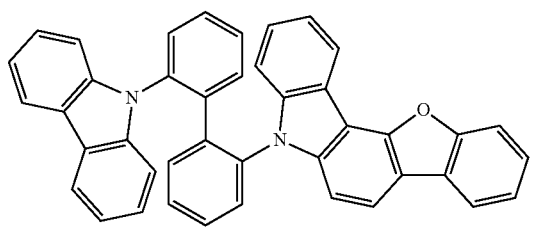
HTH-19
HTH-20
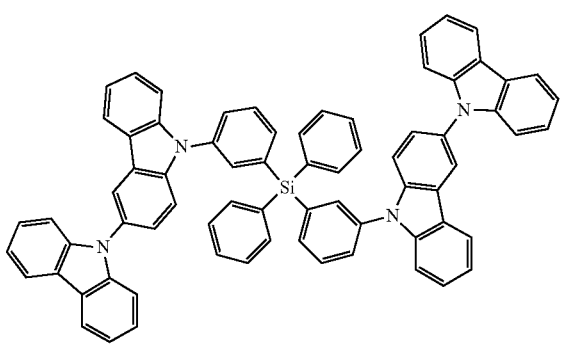

HTH-21
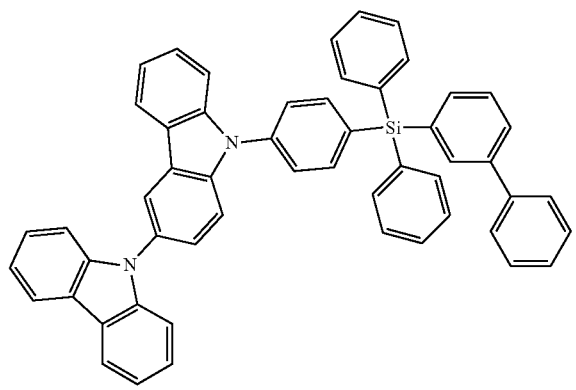
HTH-22
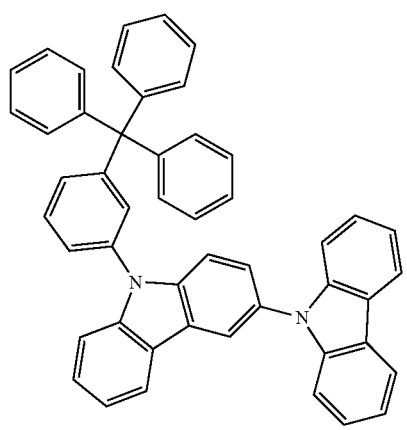
HTH-23
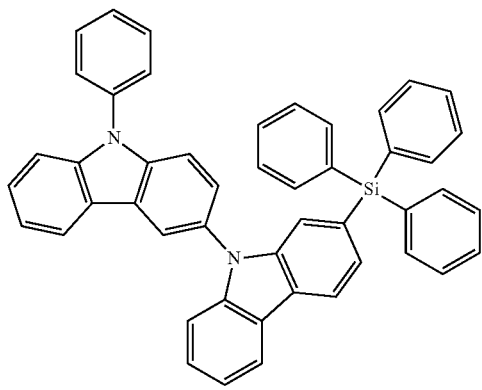
HTH-24
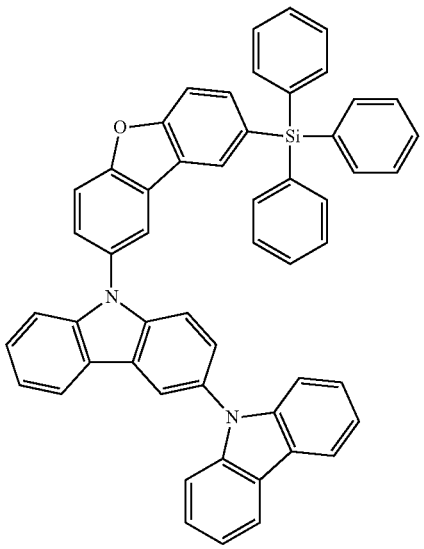
HTH-25
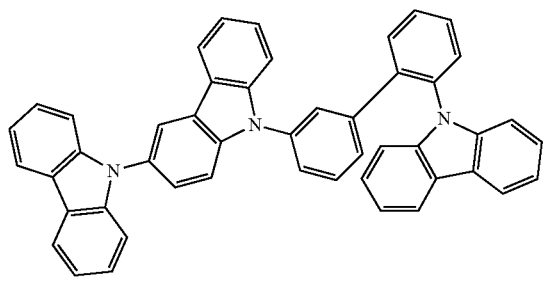
HTH-26
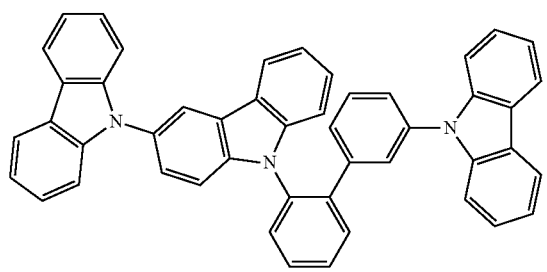
HTH-27
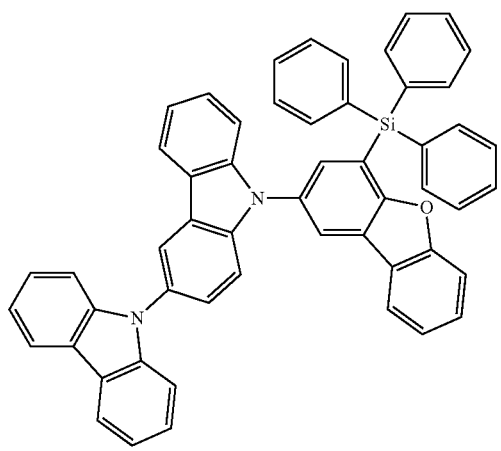

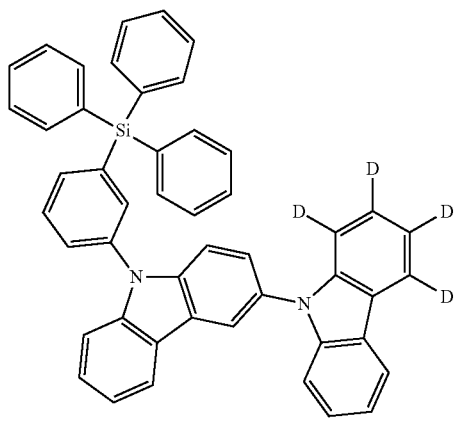

HTH-28

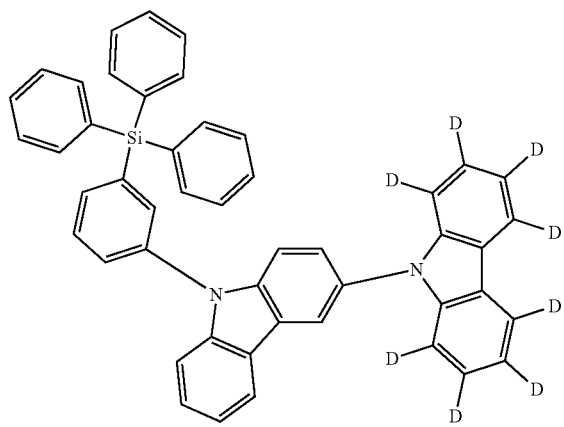

HTH-29

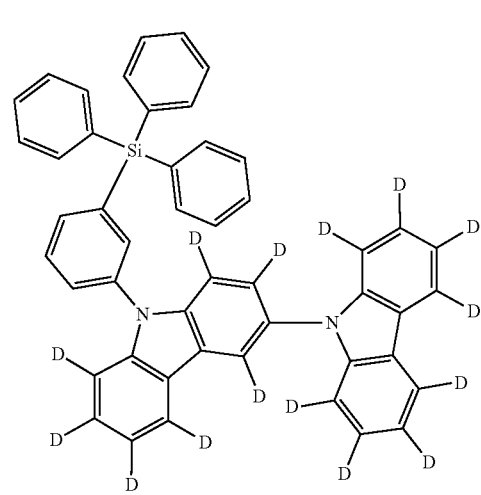

HTH-30

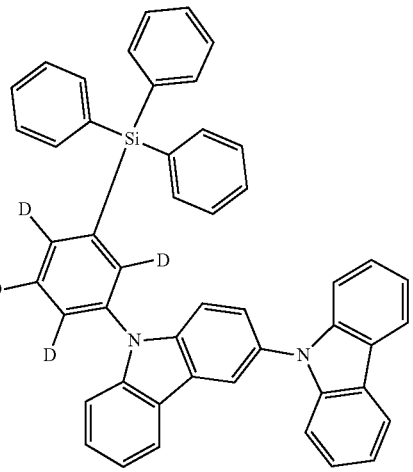

HTH-31

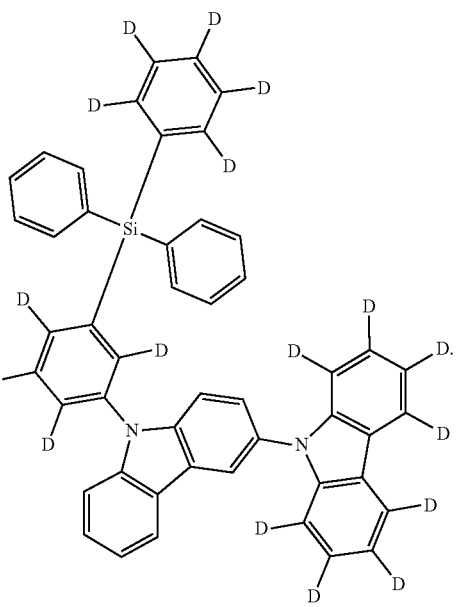

HTH-32

In an embodiment, the first electron transport compound included in the emission layer and the first electron transport compound included in the layer may each independently be represented by Formula 2:

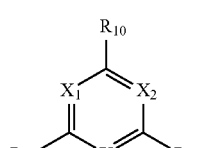

[Formula 2]

*—(L)$_l$—Si(R'$_1$R'$_2$R'$_3$)  [Formula 2-1]

In Formula 2,
X$_1$ to X$_3$ may each independently be CH or N, and at least one of X$_1$ to X$_3$ may be N,
R$_{10}$ to R$_{12}$ may each independently be a group represented by Formula 2-1, hydrogen, deuterium, —F, —Cl, —Br, —I, a hydroxyl group, a cyano group, a nitro group, an amidino group, a hydrazino group, a hydrazono group, a C₁-C₆₀ alkyl group unsubstituted or substituted with at least one R₁₀ₐ, a C₂-C₆₀ alkenyl group unsubstituted or substituted with at least one R₁₀ₐ, a C₂-C₆₀ alkynyl group unsubstituted or substituted with at least one R₁₀ₐ, a C₁-C₆₀ alkoxy group unsubstituted or substituted with at least one R₁₀ₐ, a C₃-C₁₀ cycloalkyl group unsubstituted or substituted with at least one R₁₀ₐ, a C₁-C₁₀ heterocycloalkyl group unsubstituted or substituted with at least one R₁₀ₐ, a C₃-C₁₀ cycloalkenyl group unsubstituted or substituted with at least one R₁₀ₐ, a C₁-C₁₀ heterocycloalkenyl group unsubstituted or substituted with at least one R₁₀ₐ, a C₆-C₆₀ aryl group unsubstituted or substituted with at least one R₁₀ₐ, a C₆-C₆₀ aryloxy group unsubstituted or substituted with at least one R₁₀ₐ, a C₆-C₆₀ arylthio group unsubstituted or substituted with at least one R₁₀ₐ, a C₁-C₆₀ heteroaryl group unsubstituted or substituted with at least one R₁₀ₐ, a C₁-C₆₀ heteroaryloxy group unsubstituted or substituted with at least one R₁₀ₐ, a C₁-C₆₀ heteroarylthio group unsubstituted or substituted with at least one R₁₀ₐ, a monovalent non-aromatic condensed polycyclic group unsubstituted or substituted with at least one R₁₀ₐ, a monovalent non-aromatic condensed heteropolycyclic group unsubstituted or substituted with at least one R₁₀ₐ, —B(Q₁)(Q₂), —N(Q₁)(Q₂), —P(Q₁)(Q₂), —C(=O)(Q₁), —S(=O)(Q₁), —S(=O)₂(Q₁), —P(=O)(Q₁)(Q₂), or —P(=S)(Q₁)(Q₂), at least one of R₁₀ to R₁₂ may be a group represented by Formula 2-1, R'₁ to R'₃ may each independently be a branched C₃-C₈ alkyl group unsubstituted or substituted with at least one R₁₀ₐ, a C₃-C₁₀ cycloalkyl group unsubstituted or substituted with at least one R₁₀ₐ, or a C₆-C₁₆ aryl group unsubstituted or substituted with at least one R₁₀ₐ, L may be a C₁-C₂₀ alkylene group unsubstituted or substituted with at least one R₁₀ₐ, a C₁-C₂₀ alkenylene group unsubstituted or substituted with at least one R₁₀ₐ, a C₁-C₂₀ alkynylene group unsubstituted or substituted with at least one R₁₀ₐ, a C₃-C₁₀ cycloalkylene group unsubstituted or substituted with at least one R₁₀ₐ, a C₁-C₁₀ heterocycloalkylene group unsubstituted or substituted with at least one R₁₀ₐ, a C₃-C₁₀ cycloalkenylene group unsubstituted or substituted with at least one R₁₀ₐ, a C₁-C₁₀ heterocycloalkenylene group unsubstituted or substituted with at least one R₁₀ₐ, a C₆-C₆₀ arylene group unsubstituted or substituted with at least one R₁₀ₐ, a C₁-C₆₀ heteroarylene group unsubstituted or substituted with at least one R₁₀ₐ, a divalent non-aromatic condensed polycyclic group unsubstituted or substituted with at least one R₁₀ₐ, or a divalent non-aromatic condensed heteropolycyclic group unsubstituted or substituted with at least one R₁₀ₐ, l may be an integer from 0 to 3, R₁₀ₐ may be:

deuterium, —F, —Cl, —Br, —I, a hydroxyl group, a cyano group, or a nitro group;

a C₁-C₆₀ alkyl group, a C₂-C₆₀ alkenyl group, a C₂-C₆₀ alkynyl group, or a C₁-C₆₀ alkoxy group, each unsubstituted or substituted with deuterium, —F, —Cl, —Br, —I, a hydroxyl group, a cyano group, a nitro group, a C₃-C₆₀ carbocyclic group, a C₁-C₆₀ heterocyclic group, a C₆-C₆₀ aryloxy group, a C₆-C₆₀ arylthio group, a C₇-C₆₀ arylalkyl group, a C₂-C₆₀ heteroaryl alkyl group, —N(Q₁₁)(Q₁₂), —B(Q₁₁)(Q₁₂), —C(=O)(Q₁₁), —S(=O)₂(Q₁₁), —P(=O)(Q₁₁)(Q₁₂), or any combination thereof;

a C₃-C₆₀ carbocyclic group, a C₁-C₆₀ heterocyclic group, a C₆-C₆₀ aryloxy group, a C₆-C₆₀ arylthio group, a C₇-C₆₀ arylalkyl group, or a C₂-C₆₀ heteroaryl alkyl group, each unsubstituted or substituted with deuterium, —F, —Cl, —Br, —I, a hydroxyl group, a cyano group, a nitro group, a C₁-C₆₀ alkyl group, a C₂-C₆₀ alkenyl group, a C₂-C₆₀ alkynyl group, a C₁-C₆₀ alkoxy group, a C₃-C₆₀ carbocyclic group, a C₁-C₆₀ heterocyclic group, a C₆-C₆₀ aryloxy group, a C₆-C₆₀ arylthio group, a C₇-C₆₀ arylalkyl group, a C₂-C₆₀ heteroaryl alkyl group, —N(Q₂₁)(Q₂₂), —B(Q₂₁)(Q₂₂), —C(=O)(Q₂₁), —S(=O)₂(Q₂₁), —P(=O)(Q₂₁)(Q₂₂), or any combination thereof; or —N(Q₃₁)(Q₃₂), —B(Q₃₁)(Q₃₂), —C(=O)(Q₃₁), —S(=O)₂(Q₃₁), or —P(=O)(Q₃₁)(Q₃₂), and Q₁ to Q₃, Q₁₁ to Q₁₃, Q₂₁ to Q₂₃, and Q₃₁ to Q₃₂ may each independently be: hydrogen; deuterium; —F; —Cl; —Br; —I; a hydroxyl group; a cyano group; a nitro group; a C₁-C₆₀ alkyl group; a C₂-C₆₀ alkenyl group; a C₂-C₆₀ alkynyl group; a C₁-C₆₀ alkoxy group; or a C₃-C₆₀ carbocyclic group, a C₁-C₆₀ heterocyclic group, a C₇-C₆₀ arylalkyl group, or a C₂-C₆₀ heteroaryl alkyl group, each unsubstituted or substituted with deuterium, —F, a cyano group, a C₁-C₆₀ alkyl group, a C₁-C₆₀ alkoxy group, a phenyl group, a biphenyl group, or any combination thereof.

R'₁ to R'₃ in Formula 2-1 may each independently be a substituent that makes a Si moiety bulky. The branched C₃-C₈ alkyl group may be, for example, an iso-propyl group, a t-butyl group, or the like. The C₃-C₁₀ cycloalkyl group may be, for example, a cyclopentyl group, a cyclohexyl group, or the like. The C₆-C₁₆ aryl group may be, for example, a phenyl group, a naphthyl group, an anthracenyl group, a pyrenyl group, or the like.

In an embodiment, the first electron transport compound may be selected from Compounds ETH-1 to ETH-44:

ETH-1

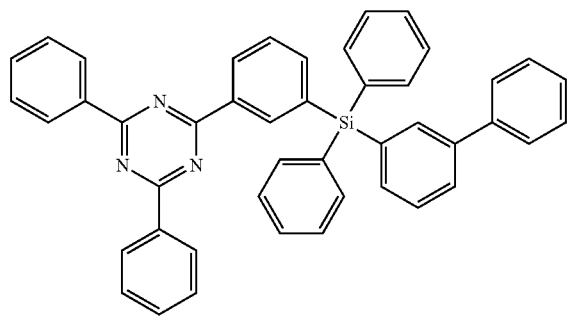

ETH-2

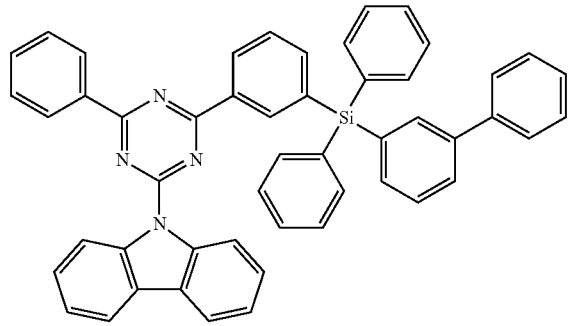

ETH-3
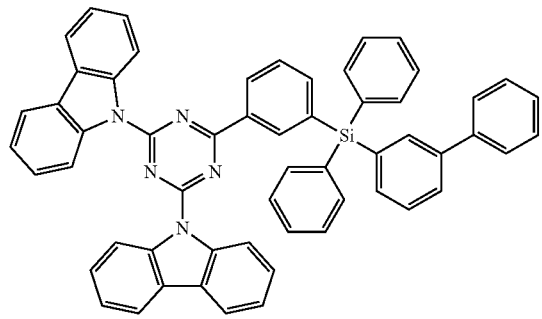
ETH-4
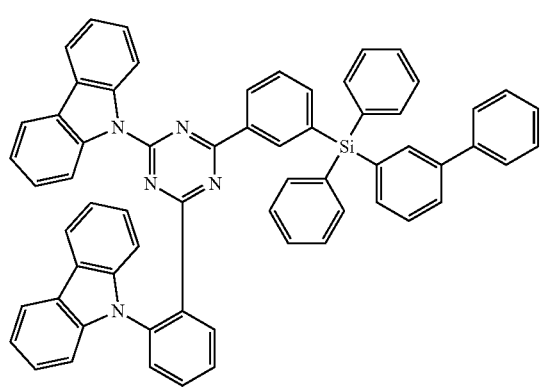
ETH-5
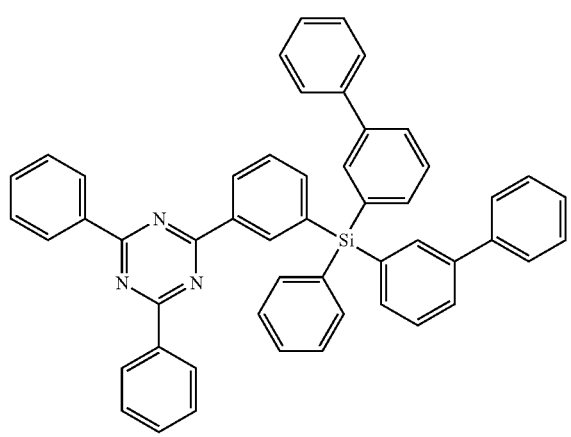
ETH-6
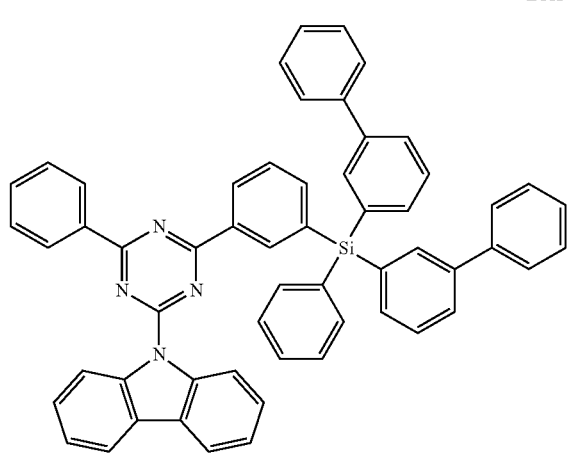
ETH-7
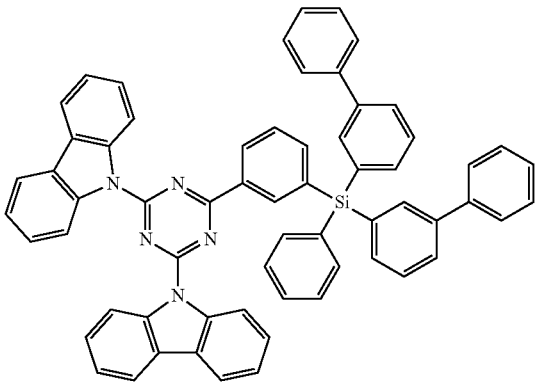
ETH-8
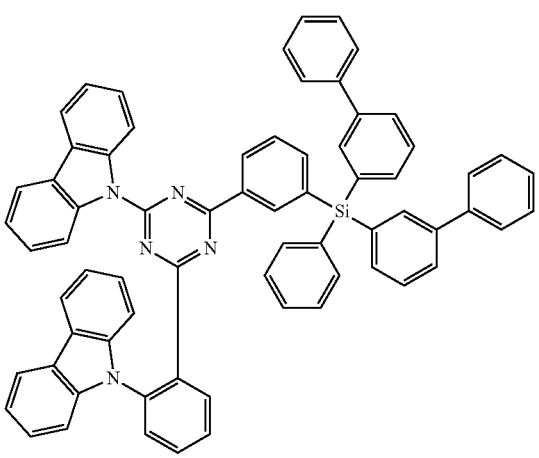
ETH-9
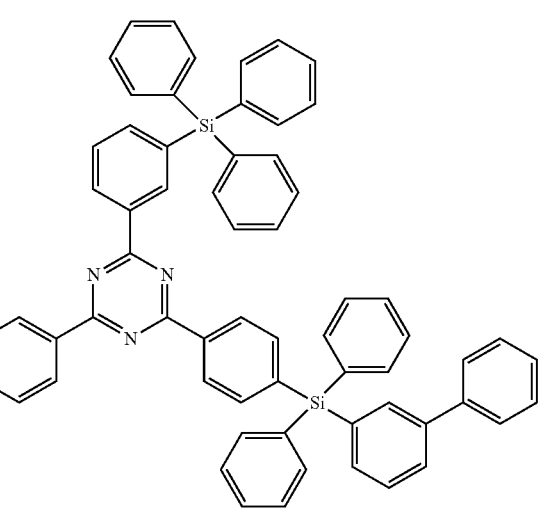

ETH-10
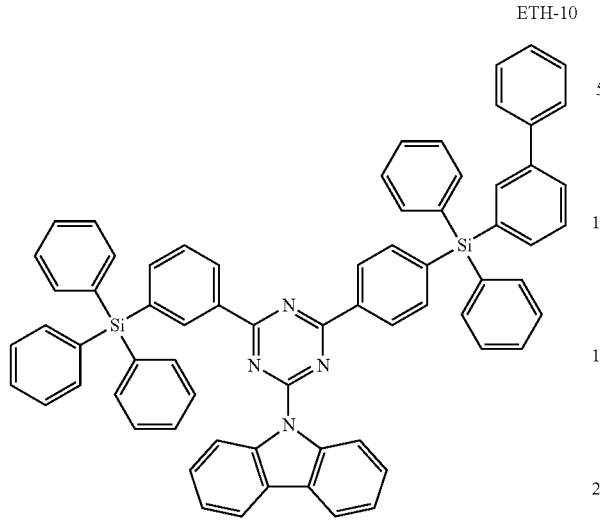
ETH-11
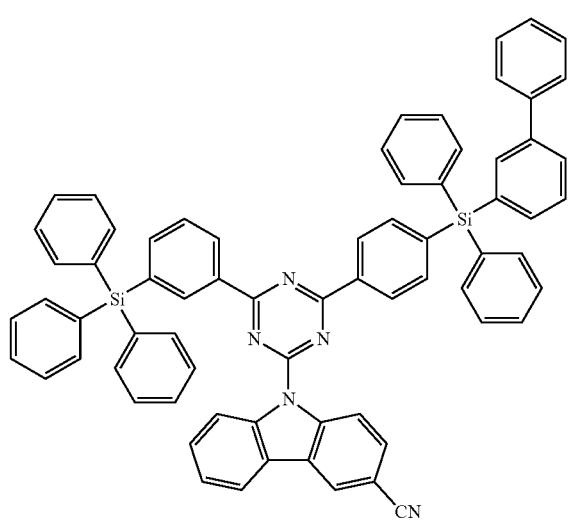
ETH-12
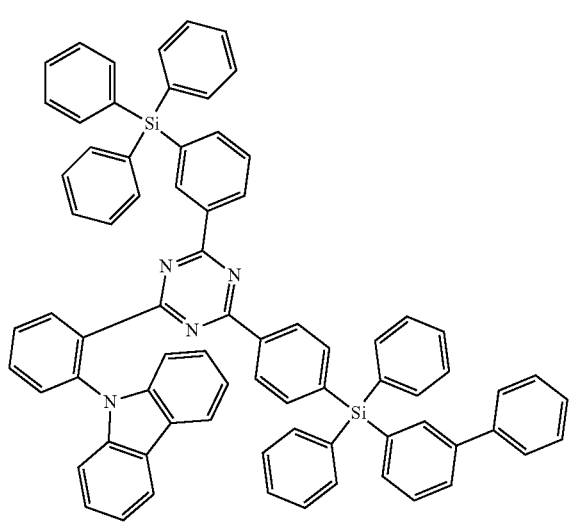
ETH-13
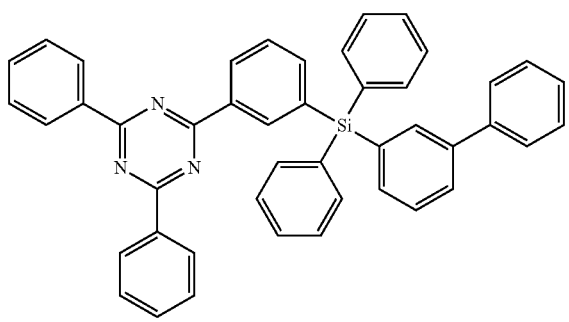
ETH-14
ETH-15
ETH-16

ETH-17
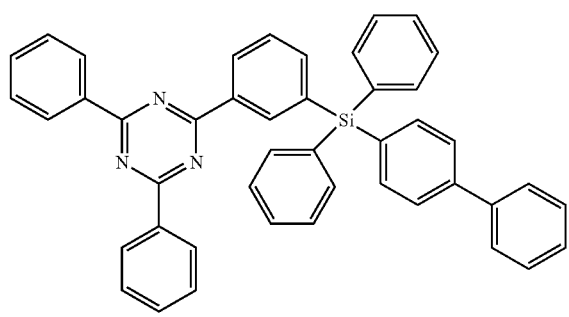
ETH-18
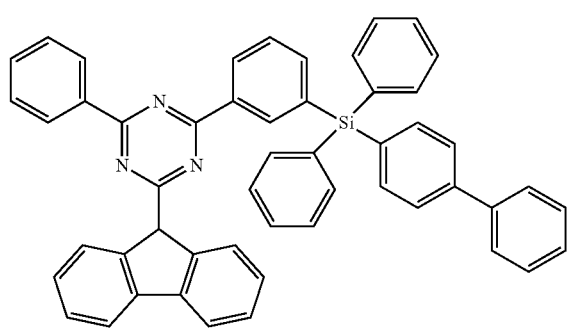
ETH-19
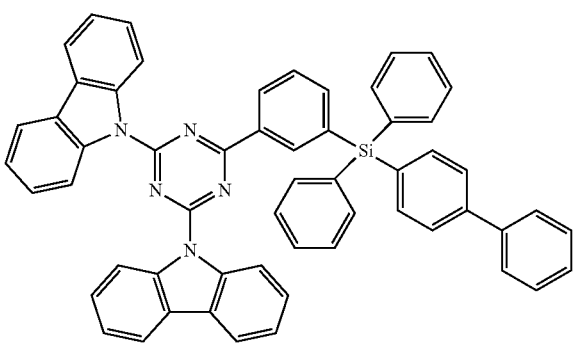
ETH-20
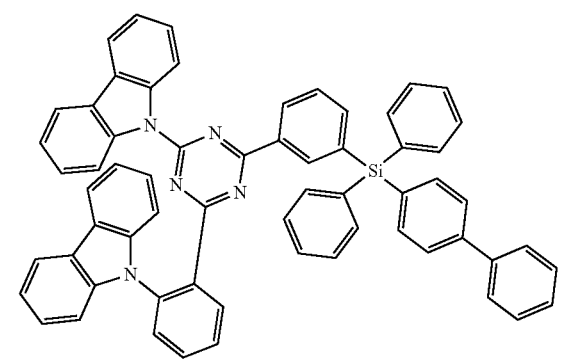
ETH-21
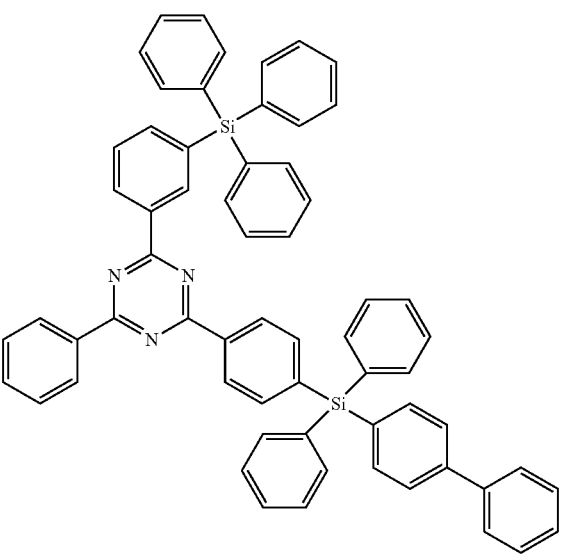
ETH-22
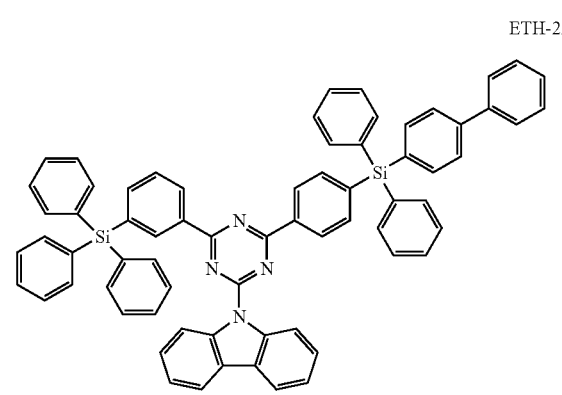
ETH-23
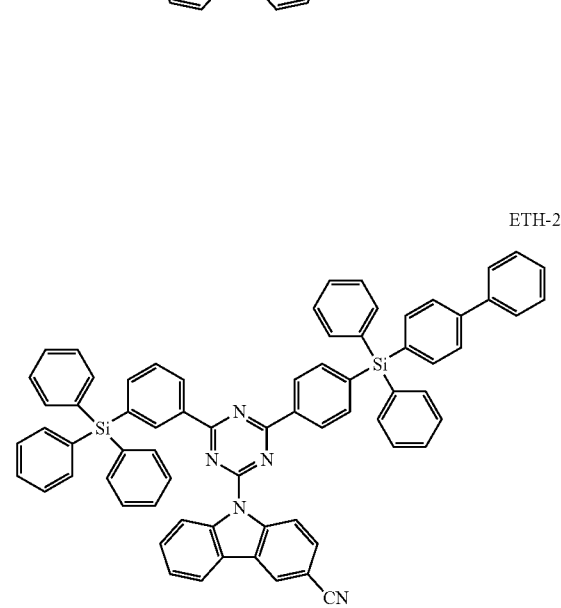

ETH-24
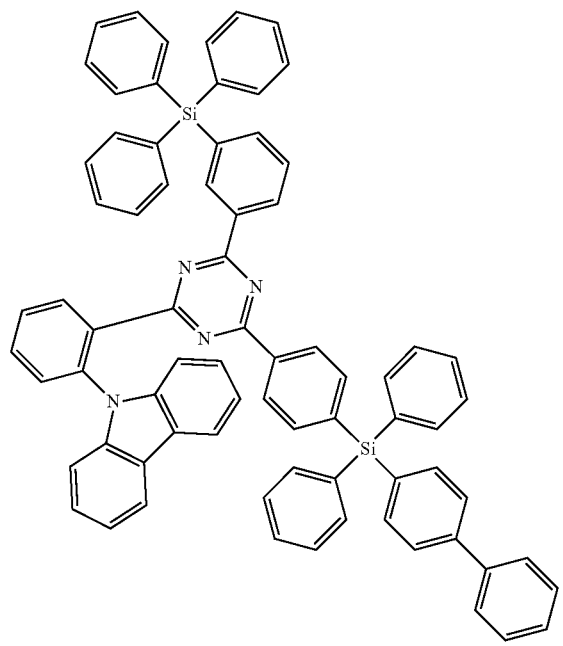
ETH-25
ETH-26
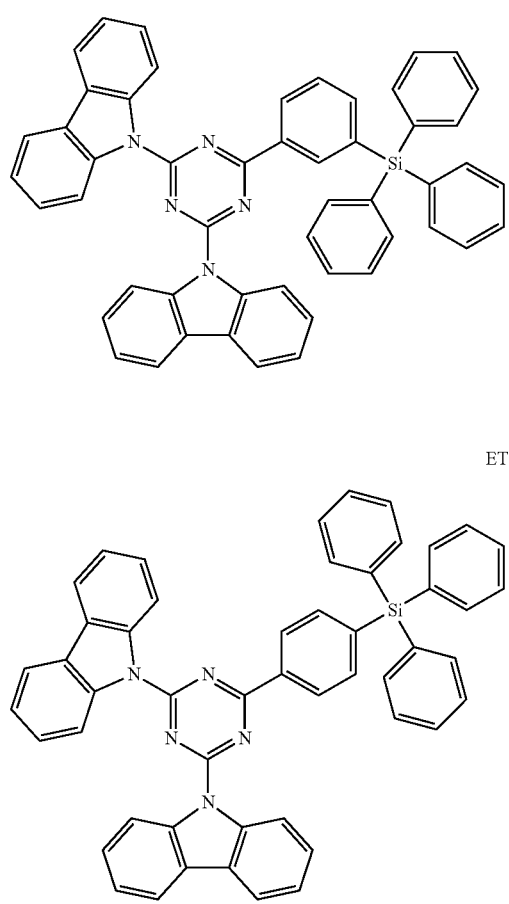
ETH-27
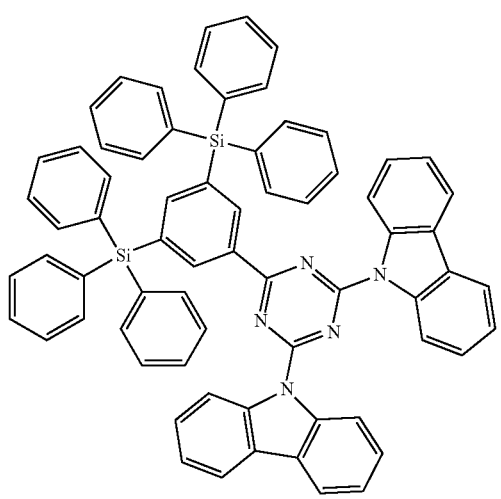
ETH-28
ETH-29
ETH-30
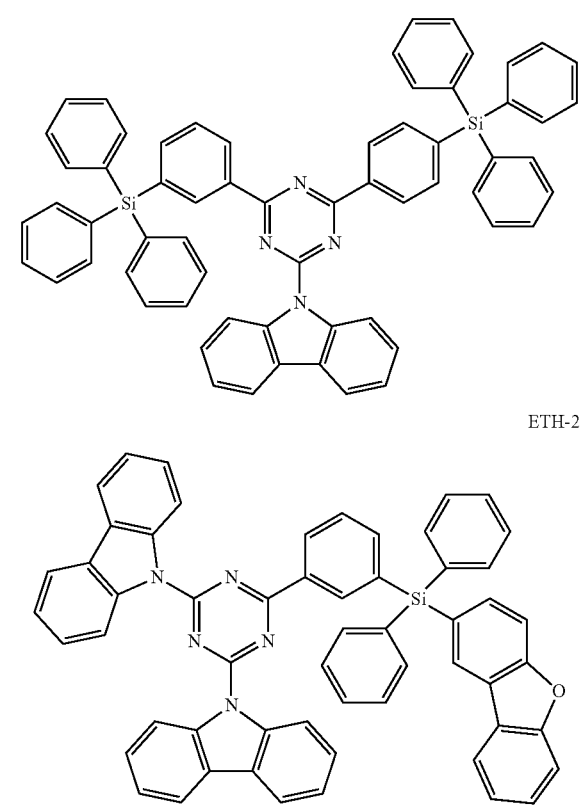
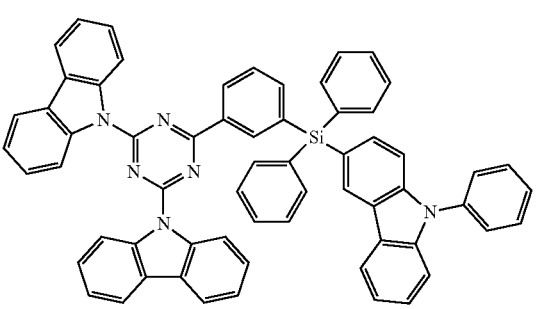

ETH-31
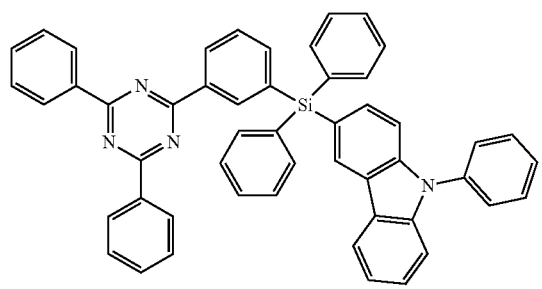
ETH-32
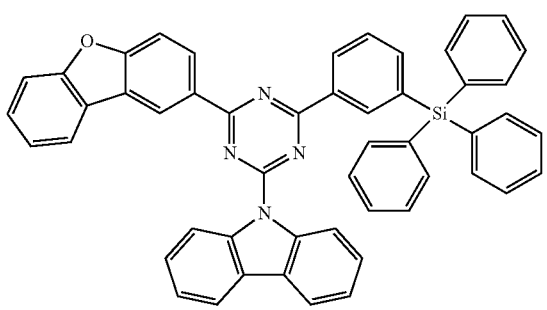
ETH-33
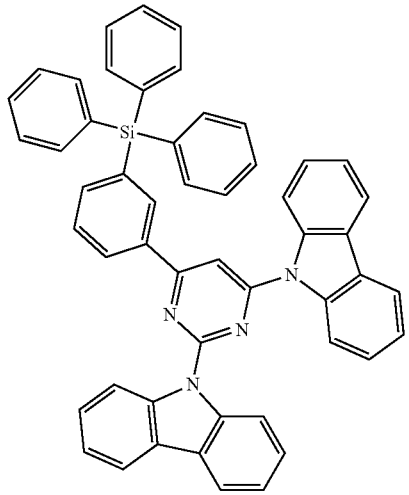
ETH-34
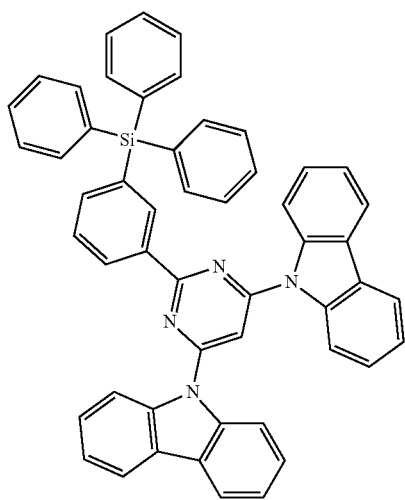
ETH-35
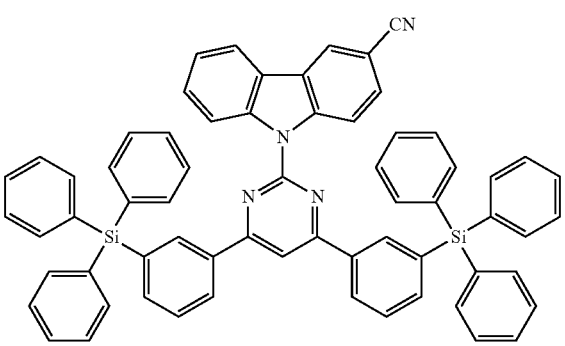
ETH-36
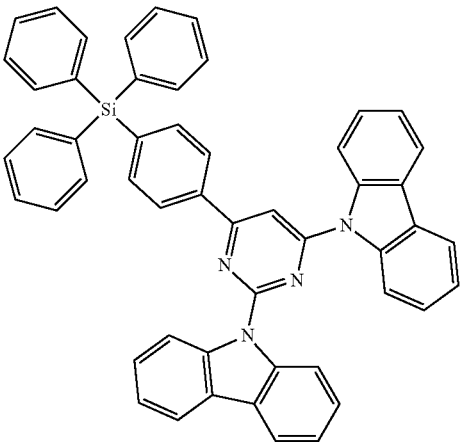
ETH-37
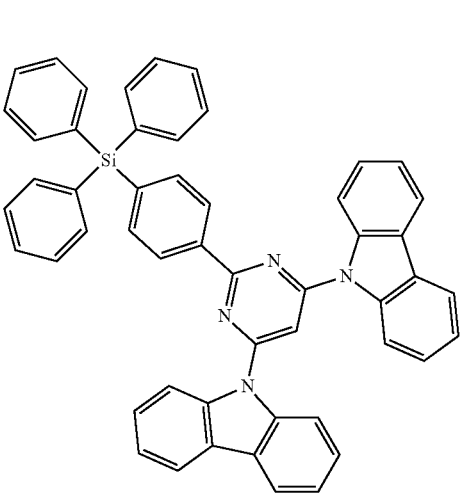

ETH-38
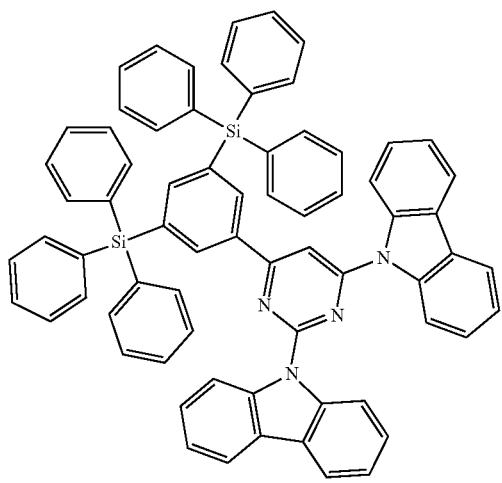
ETH-41
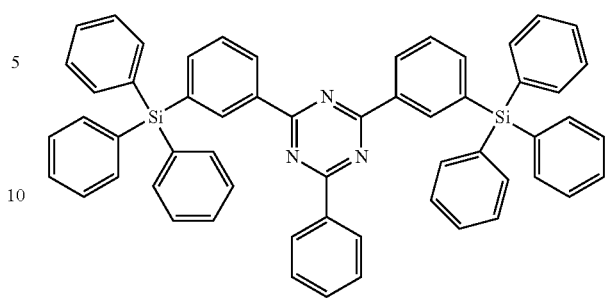
ETH-42
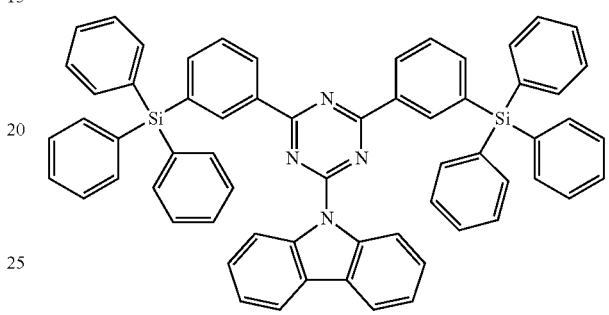
ETH-39
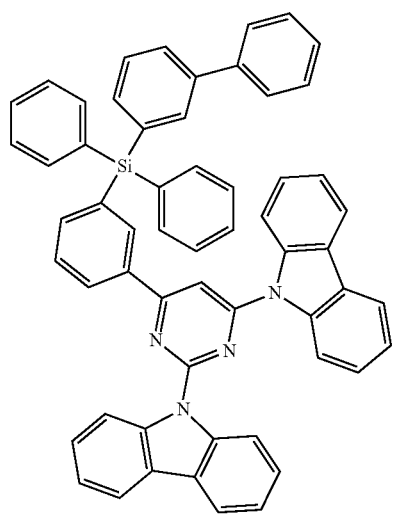
ETH-42
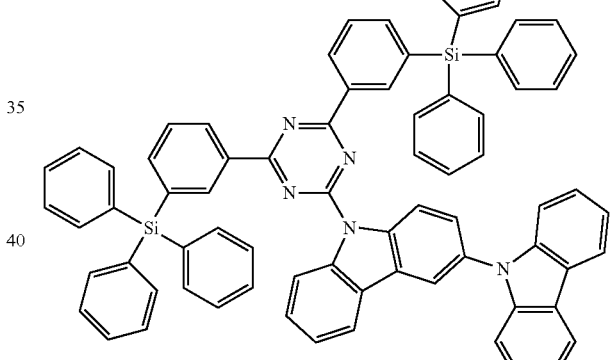
ETH-40
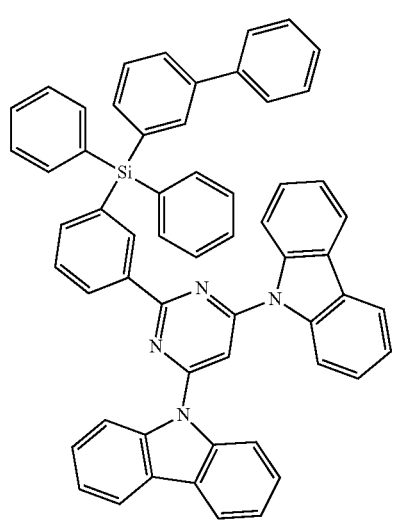
ETH-44
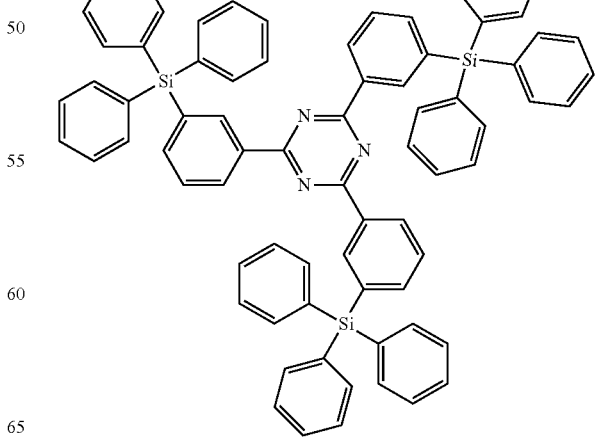

Although the first electron transport compound included in the emission layer and the first electron transport compound included in the layer may each independently be represented by Formula 2, a first electron transport compound included in the emission layer may be identical to or different from a first electron transport compound included in the layer.

In an embodiment, the second electron transport compound may be represented by Formula 3:

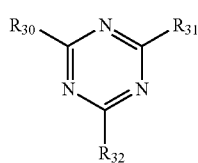

[Formula 3]

In Formula 3, $R_{30}$ to $R_{32}$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10b}$, a $C_2$-$C_{60}$ alkenyl group unsubstituted or substituted with at least one $R_{10b}$, a $C_2$-$C_{60}$ alkynyl group unsubstituted or substituted with at least one $R_{10b}$, a $C_1$-$C_{60}$ alkoxy group unsubstituted or substituted with at least one $R_{10b}$, a $C_3$-$C_{10}$ cycloalkyl group unsubstituted or substituted with at least one $R_{10b}$, a $C_1$-$C_{10}$ heterocycloalkyl group unsubstituted or substituted with at least one $R_{10b}$, a $C_3$-$C_{10}$ cycloalkenyl group unsubstituted or substituted with at least one $R_{10b}$, a $C_1$-$C_{10}$ heterocycloalkenyl group unsubstituted or substituted with at least one $R_{10b}$, a $C_6$-$C_{60}$ aryl group unsubstituted or substituted with at least one $R_{10b}$, a $C_6$-$C_{60}$ aryloxy group unsubstituted or substituted with at least one $R_{10b}$, a $C_6$-$C_{60}$ arylthio group unsubstituted or substituted with at least one $R_{10b}$, a $C_1$-$C_{60}$ heteroaryl group unsubstituted or substituted with at least one $R_{10b}$, a $C_1$-$C_{60}$ heteroaryloxy group unsubstituted or substituted with at least one $R_{10b}$, a $C_1$-$C_{60}$ heteroarylthio group unsubstituted or substituted with at least one $R_{10b}$, a monovalent non-aromatic condensed polycyclic group unsubstituted or substituted with at least one $R_{10b}$, a monovalent non-aromatic condensed heteropolycyclic group unsubstituted or substituted with at least one $R_{10b}$, —B$(Q_1)(Q_2)$, —N$(Q_1)(Q_2)$, —P$(Q_1)(Q_2)$, —C(=O)$(Q_1)$, —S(=O)$(Q_1)$, —S(=O)$_2(Q_1)$, —P(=O)$(Q_1)(Q_2)$, or —P(=S)$(Q_1)(Q_2)$, $R_{10b}$ may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof; or —N$(Q_{31})(Q_{32})$, —B$(Q_{31})(Q_{32})$, —C(=O)$(Q_{31})$, —S(=O)$_2(Q_{31})$, —P(=O)$(Q_{31})(Q_{32})$, or —Si$(Q_{41})(Q_{42})(Q_{43})$, $Q_1$ to $Q_3$, $Q_{11}$ to $Q_{13}$, $Q_{21}$ to $Q_{23}$, and $Q_{31}$ to $Q_{32}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and at least one of $Q_{41}$ to $Q_{43}$ may be: a $C_6$-$C_{20}$ aryl group substituted with a $C_1$-$C_{20}$ heteroaryl group substituted with a $C_6$-$C_{20}$ aryl group; or a $C_6$-$C_{20}$ aryl group substituted with a $C_1$-$C_{20}$ heteroaryl group substituted with a $C_1$-$C_{20}$ heteroaryl group, and the remainder of $Q_{41}$ to $Q_{43}$ may be the same as described in connection with $Q_1$.

In an embodiment, the second electron transport compound may be selected from Compounds ET-1 to ET-20:

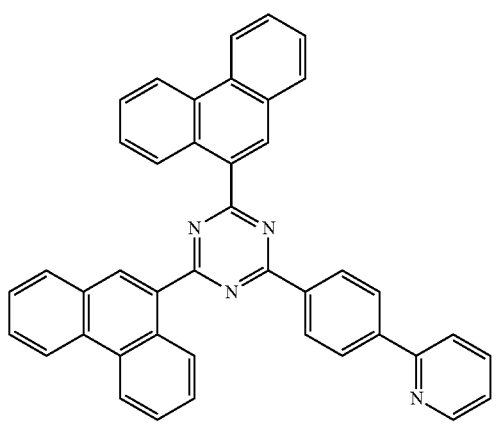

ET-1

-continued
ET-2
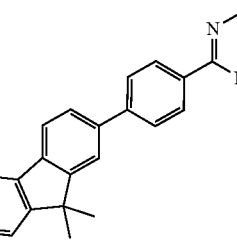
ET-3
ET-4
ET-5
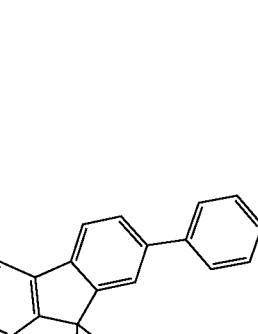
ET-6
ET-7
ET-8

ET-9
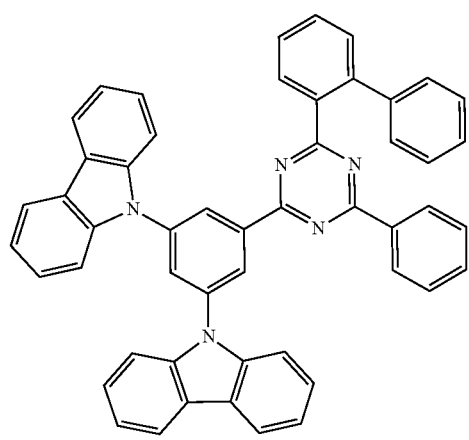
ET-10
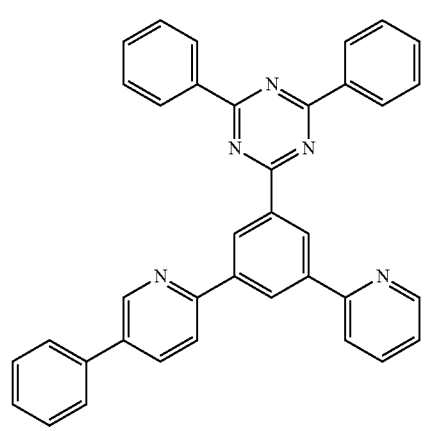
ET-11
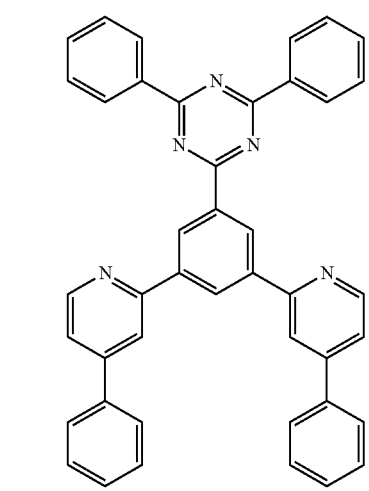
ET-12
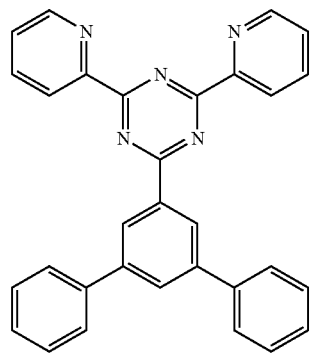
ET-13
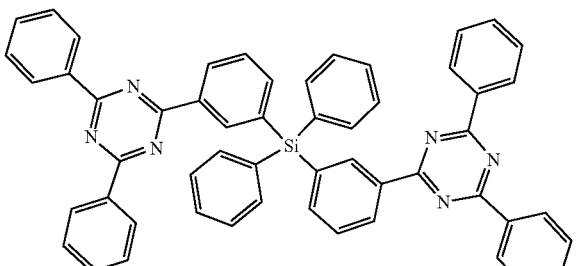
ET-14
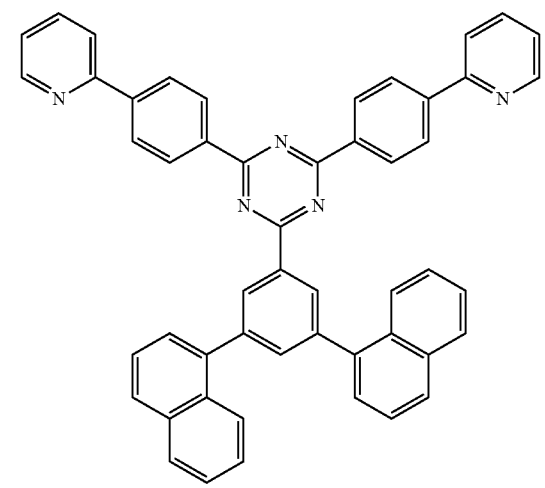
ET-15
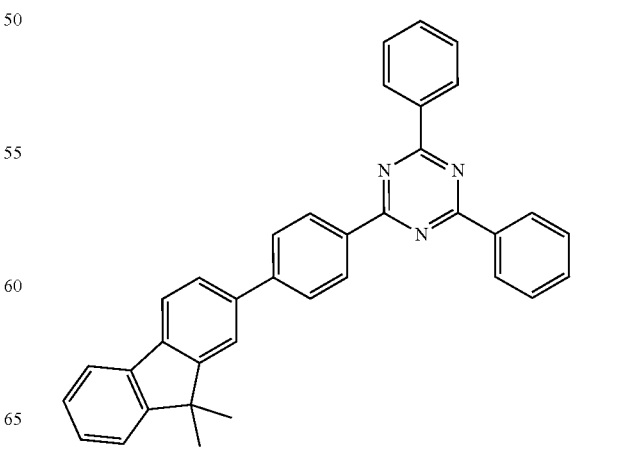

ET-16
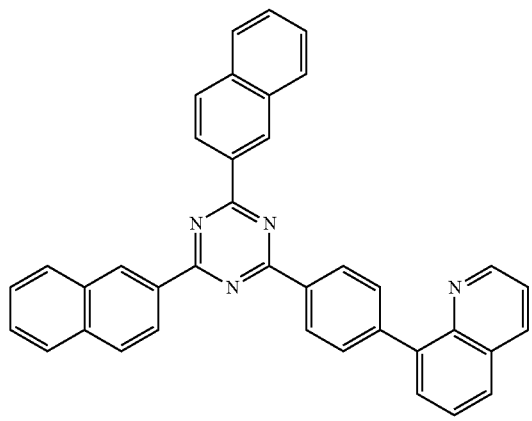

ET-17
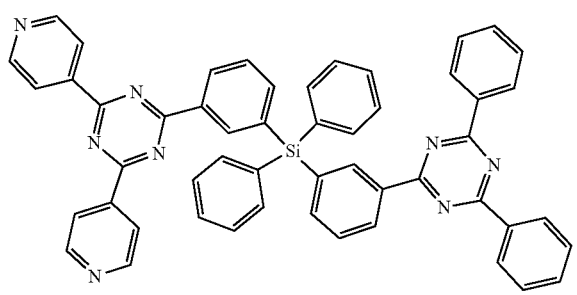

ET-18
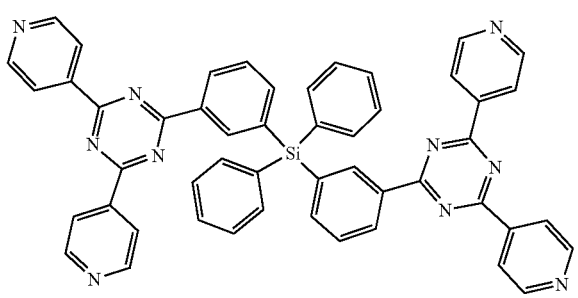

ET-19
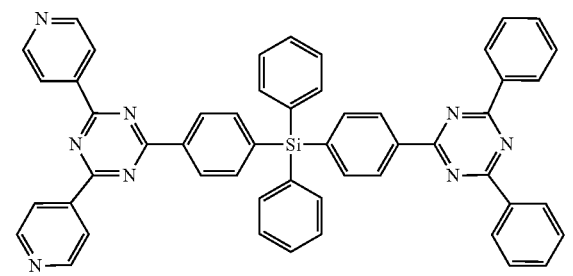

ET-20
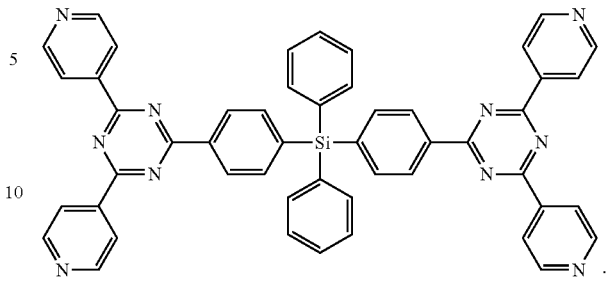

In an embodiment, the third compound may be represented by Formula 401, which is described below.

In an embodiment, the first electron transport compound and the second electron transport compound may be different compounds.

In an embodiment, the metal-containing material may include an alkali metal complex, an alkaline earth metal complex, or any combination thereof, and the alkali metal complex and the alkaline earth metal complex are described below.

According to an embodiment, an electronic apparatus may include the light-emitting device. The electronic apparatus may further include a thin-film transistor. For example, the electronic apparatus may further include a thin-film transistor, wherein the thin-film transistor may include a source electrode and a drain electrode, and the first electrode of the light-emitting device may be electrically connected to at least one of the source electrode or the drain electrode.

In an embodiment, the electronic apparatus may further include a color filter, a color conversion layer, a touch screen layer, a polarizing layer, or any combination thereof. More details for the electronic apparatus are the same as described in the specification.

The term "interlayer" as used herein refers to a single layer and/or all layers located between the first electrode and the second electrode of the light-emitting device.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

Hereinafter, a structure of the light-emitting device 10 according to an embodiment and a method of manufacturing the light-emitting device 10 will be described with reference to FIG. 1.

[First Electrode 110]

In FIG. 1, a substrate may be further included under the first electrode 110 or above the second electrode 150. The substrate may be a glass substrate or a plastic substrate. In an embodiment, the substrate may be a flexible substrate, and may include plastics with excellent heat resistance and durability, such as polyimide, polyethylene terephthalate (PET), polycarbonate, polyethylene napthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode.

When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In an embodiment, when the first electrode 110 is a semi-transmissive electrode or a reflective electrode, a material for forming the first electrode 110 may include magnesium (Mg), silver (Ag), aluminum (Al), aluminum-lithium (Al—Li), calcium (Ca), magnesium-indium (Mg—In), magnesium-silver (Mg—Ag), or any combinations thereof.

The first electrode 110 may have a structure consisting of a single layer or a structure including multiple layers. For example, the first electrode 110 may have a three-layered structure of ITO/Ag/ITO.

[Interlayer 130]

The interlayer 130 may be located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and the like, in addition to various organic materials.

In an embodiment, the interlayer 130 may include two or more emission layers sequentially stacked between the first electrode 110 and the second electrode 150 and at least one charge generation layer between the two or more emission layers. When the interlayer 130 includes the two or more emission layers and the at least one charge generation layer as described above, the light-emitting device 10 may be a tandem light-emitting device.

[Hole Transport Region in Interlayer 130]

The hole transport region may have a structure consisting of a layer consisting of a single material, a structure consisting of a layer consisting of different materials, or a structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein the layers of each structure may be stacked on the first electrode 110 in its respective stated order, but the structure of the hole transport region is not limited thereto.

For example, the hole transport region may have a multi-layered structure of a hole transport layer/emission auxiliary layer, or a hole transport layer/electron blocking layer, which are stacked in its respective stated order on the first electrode 110.

The hole transport region may include a compound represented by Formula 201, a compound represented by Formula 202, or any combination thereof:

[Formula 201]

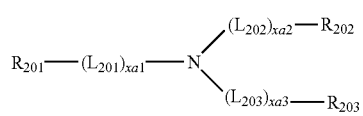

[Formula 202]

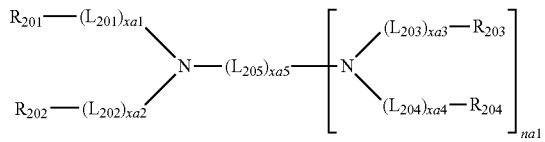

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group or the like) unsubstituted or substituted with at least one $R_{10a}$ (for example, Compound HT16), $R_{203}$ and $R_{204}$ may optionally be linked to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of groups represented by Formulae CY201 to CY217.

CY201

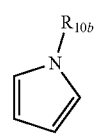

CY202

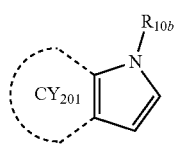

CY203

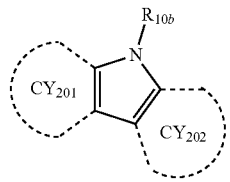

-continued

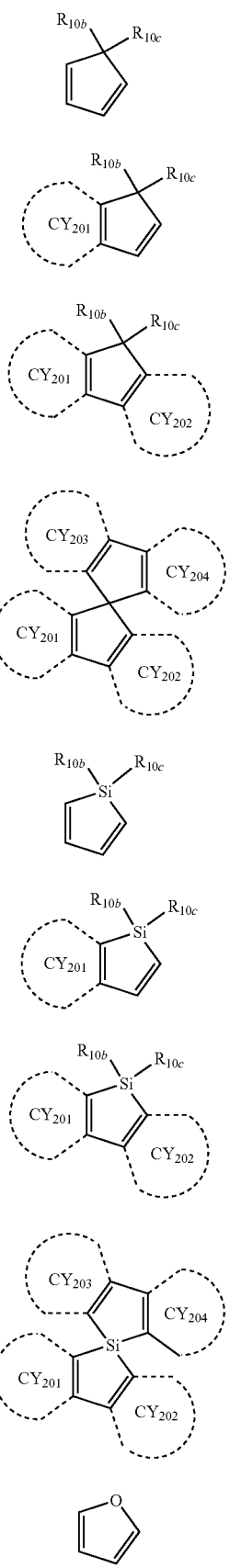

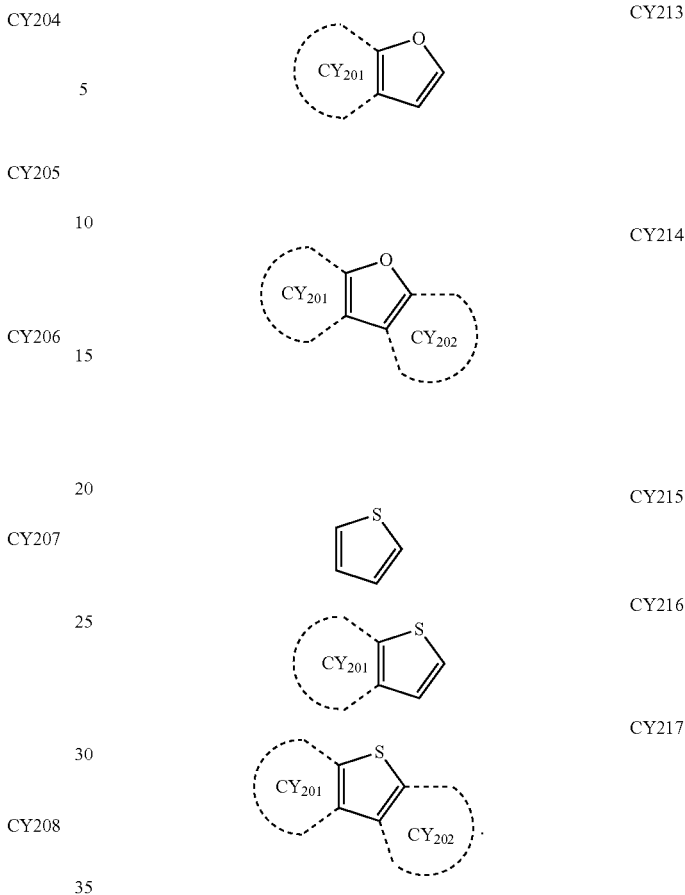

In Formulae CY201 to CY217, $R_{10b}$ and $R_{10c}$ may each independently be the same as described in connection with $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described herein.

In an embodiment, ring $CY_{201}$ to ring $CY_{204}$ in Formulae CY201 to CY217 may each independently be a benzene group, a naphthalene group, a phenanthrene group, or an anthracene group.

In an embodiment, each of Formulae 201 and 202 may include at least one of groups represented by Formulae CY201 to CY203.

In an embodiment, Formula 201 may include at least one of groups represented by Formulae CY201 to CY203 and at least one of groups represented by Formulae CY204 to CY217.

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include groups represented by Formulae CY201 to CY203.

In an embodiment, each of Formulae 201 and 202 may not include groups represented by Formulae CY201 to CY203, and may include at least one of groups represented by Formulae CY204 to CY217.

In an embodiment, each of Formulae 201 and 202 may not include groups represented by Formulae CY201 to CY217.

In an embodiment, the hole transport region may include one of Compounds HT1 to HT46, m-MTDATA, TDATA, 2-TNATA, NPB(NPD), β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

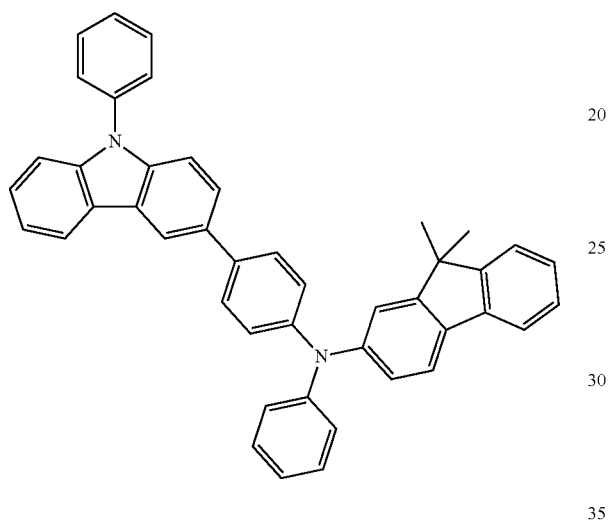

HT2

HT3

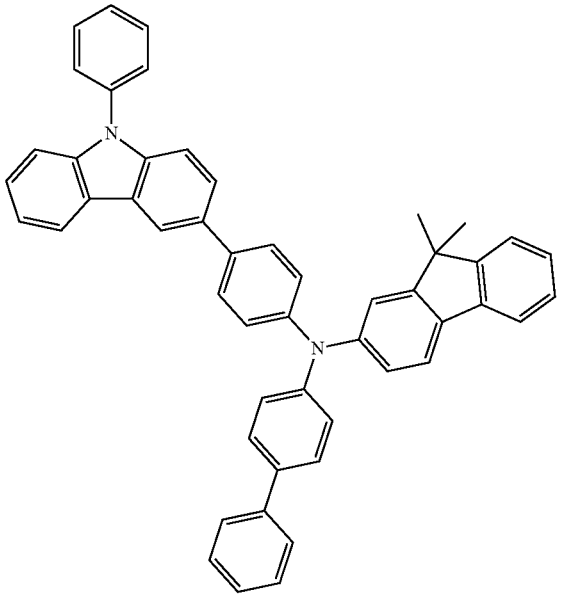

HT4

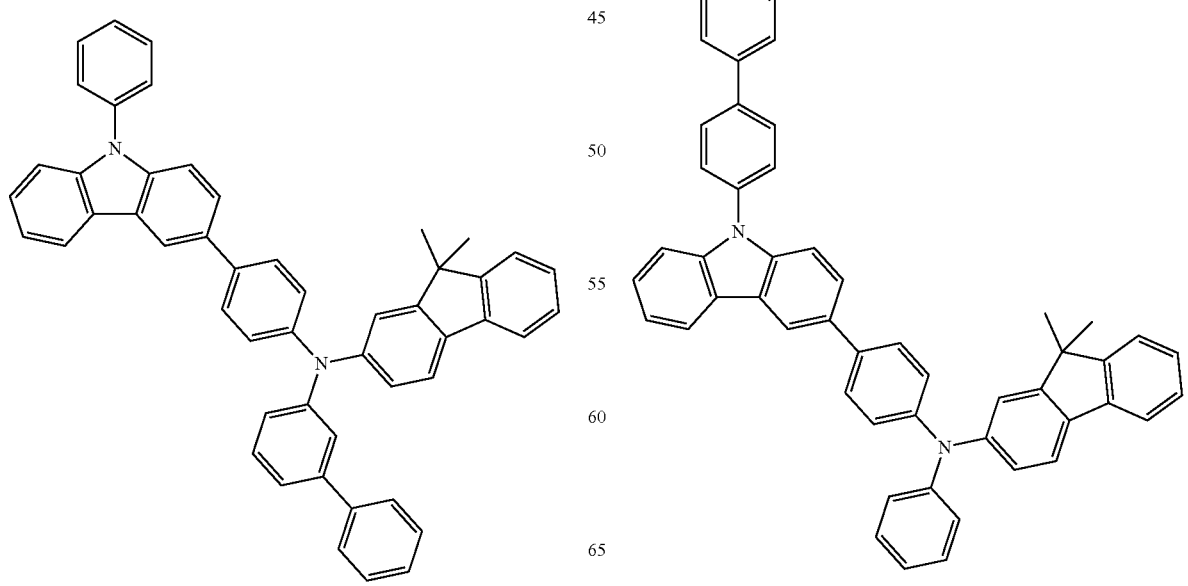

HT5
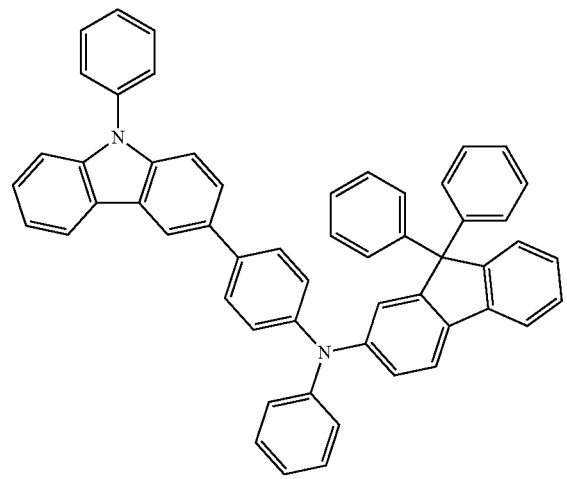
HT7
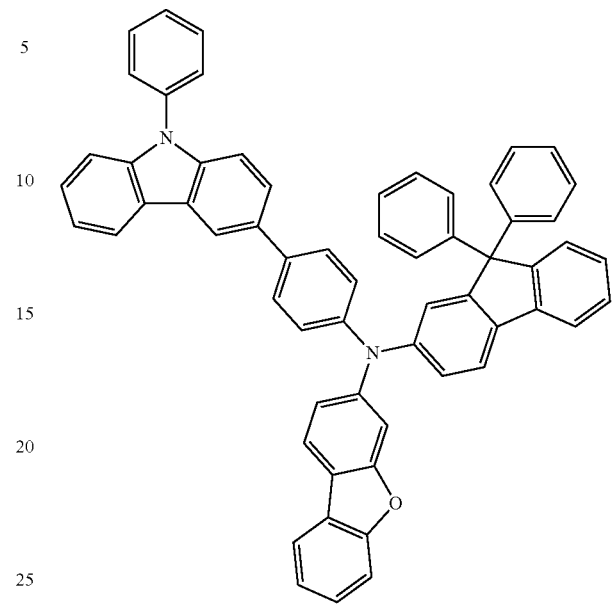
HT6
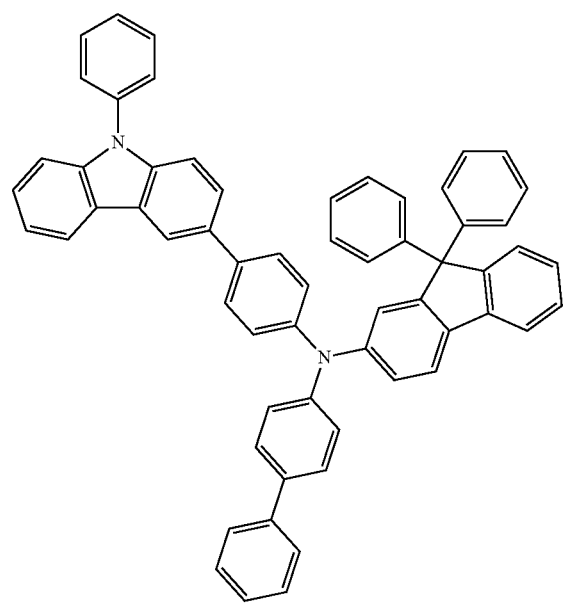
HT8
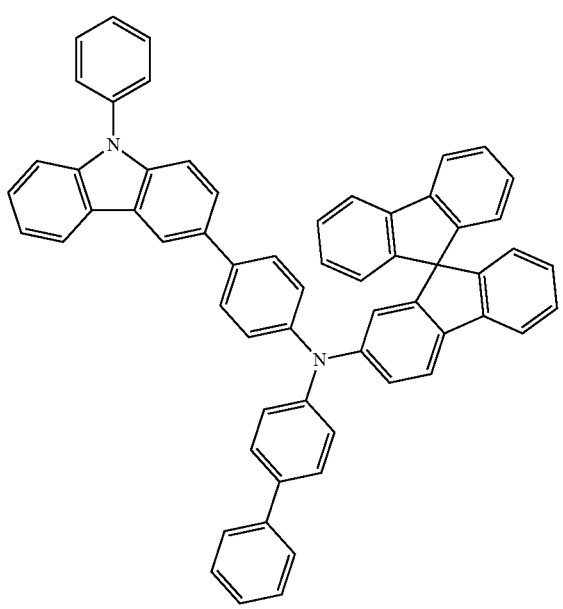

HT9
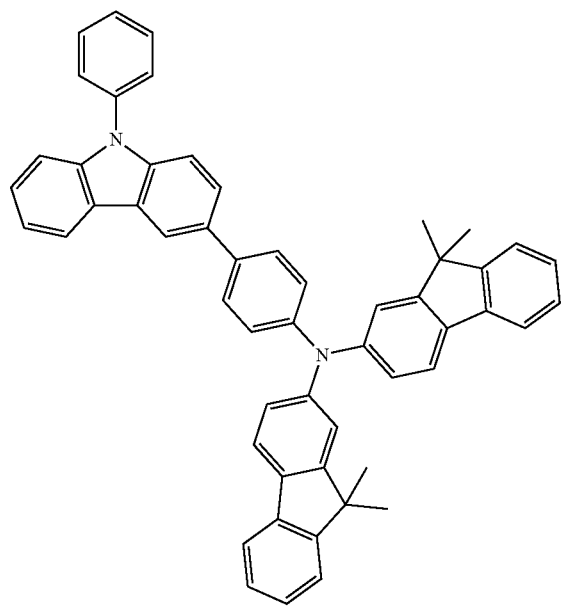
HT10
HT11
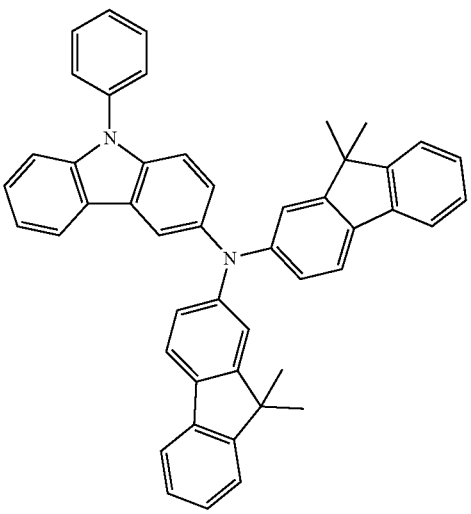
HT12
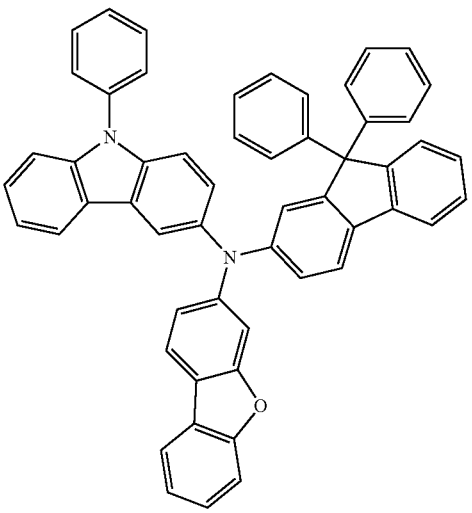

HT13
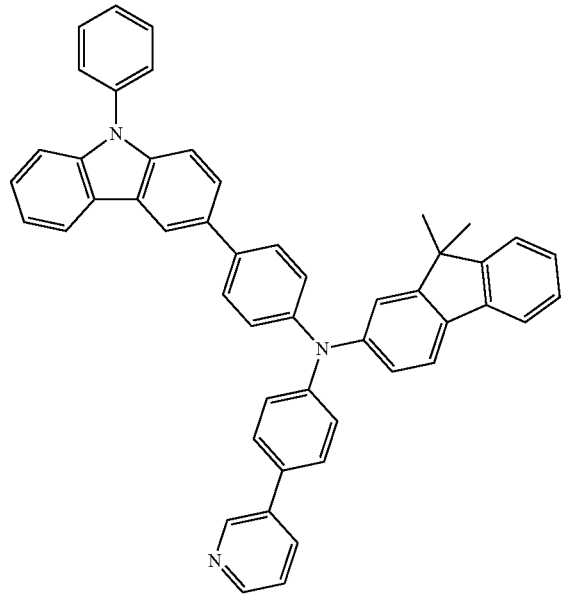
HT14
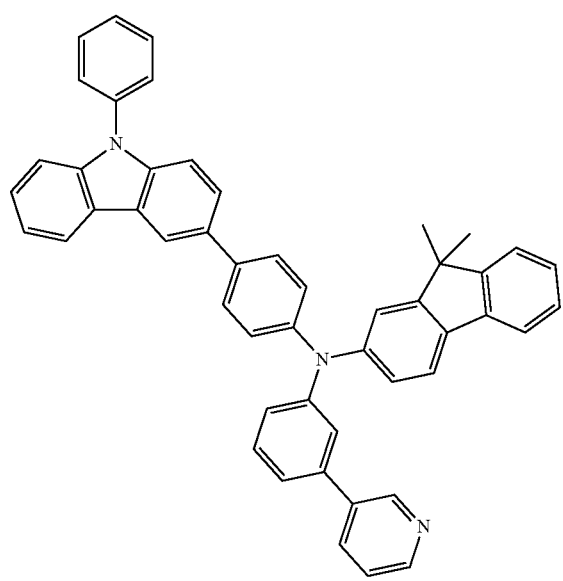
HT15
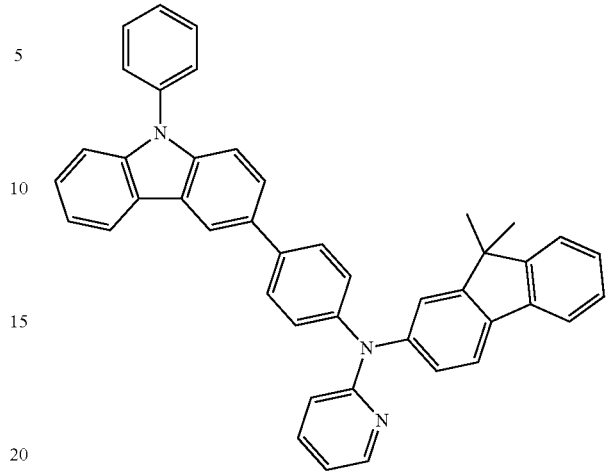
HT16
HT17
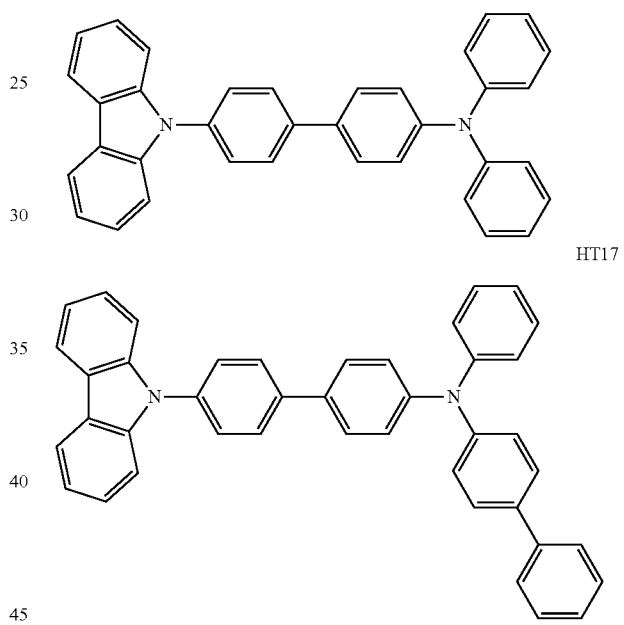
HT18
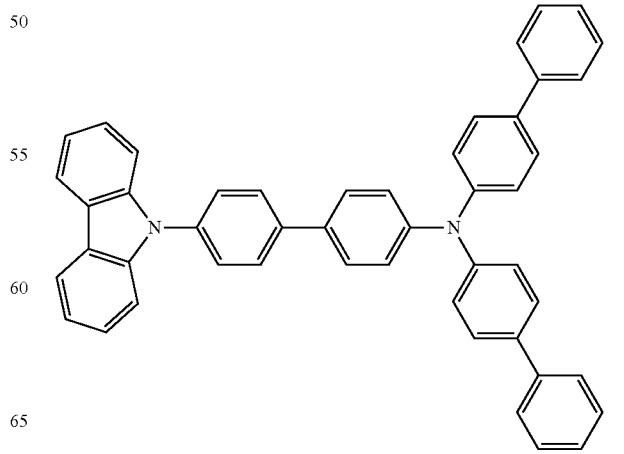

HT19
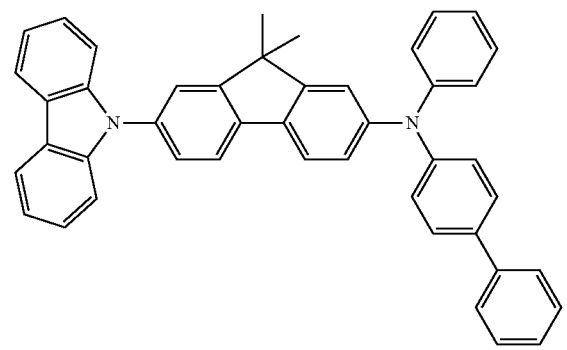
HT20
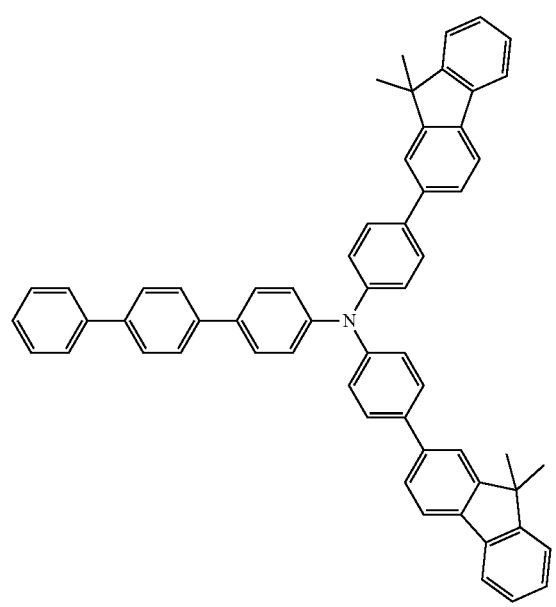
HT21
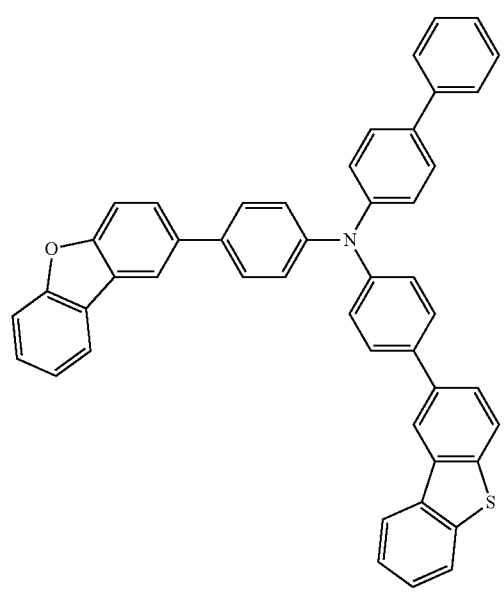
HT22
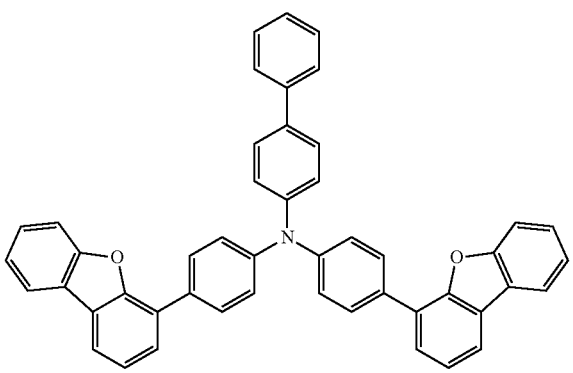
HT23
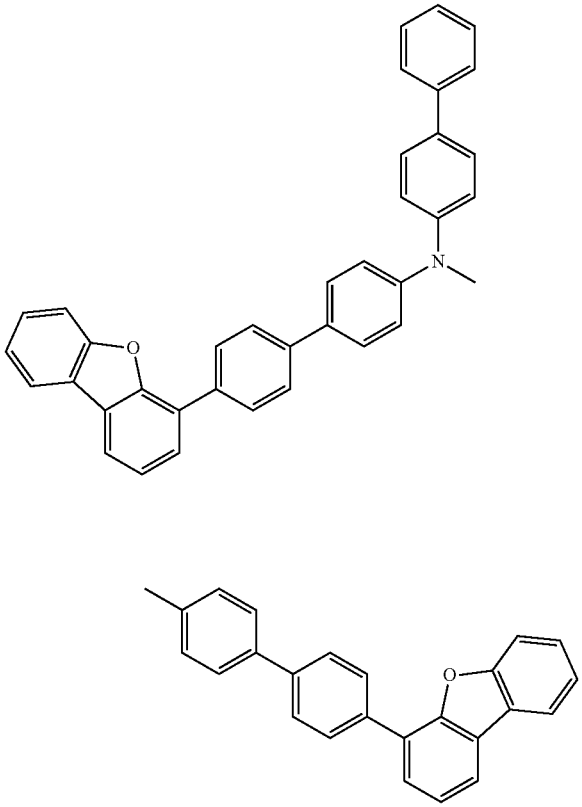
HT24
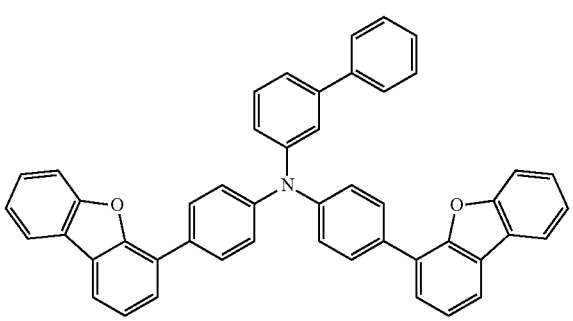

HT25
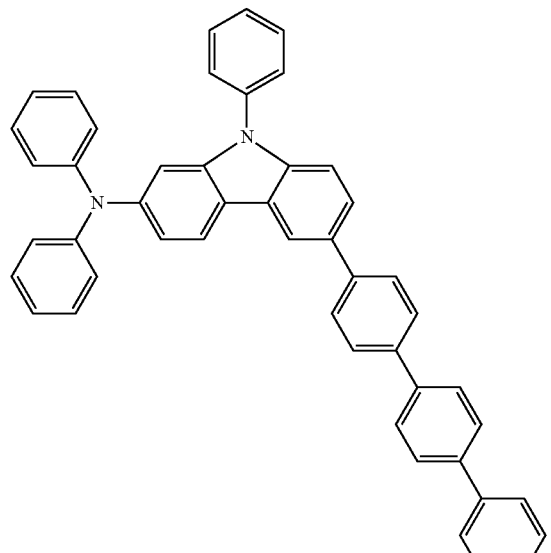
HT26
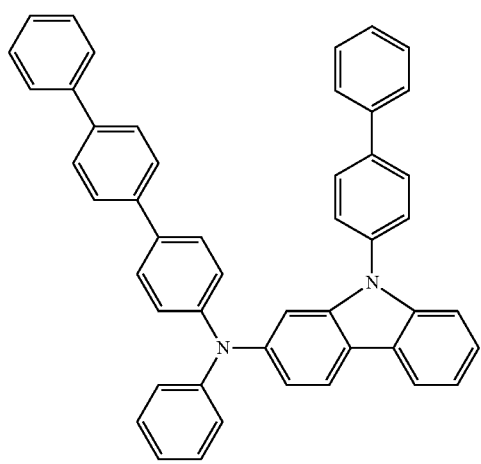
HT27
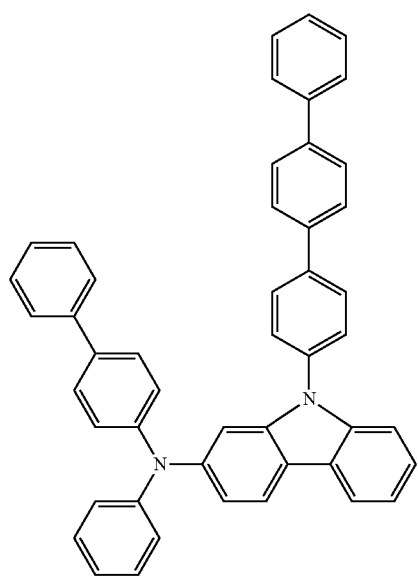
HT28
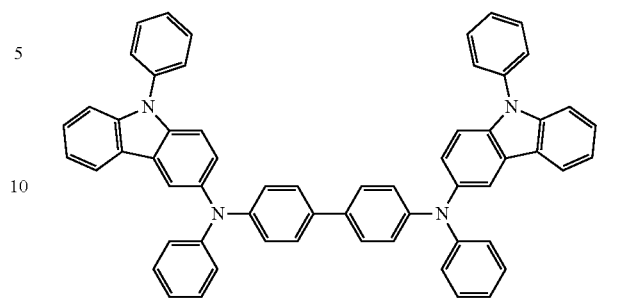
HT29
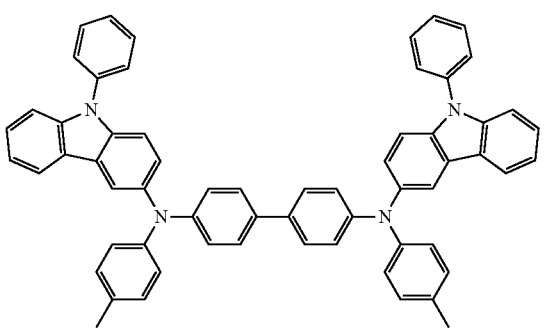
HT30
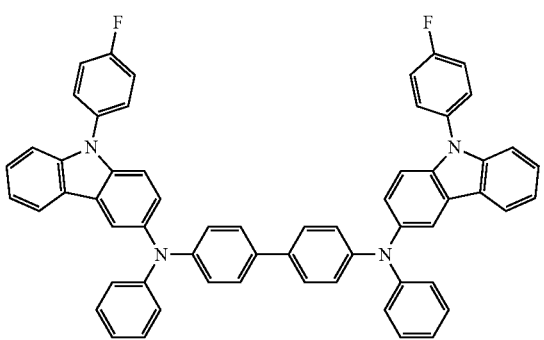
HT31
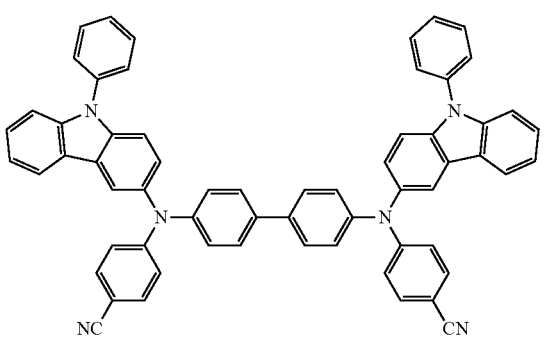

HT32
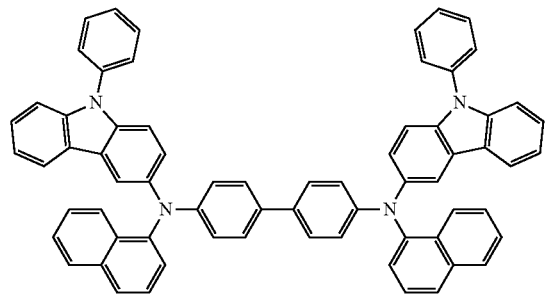
HT33
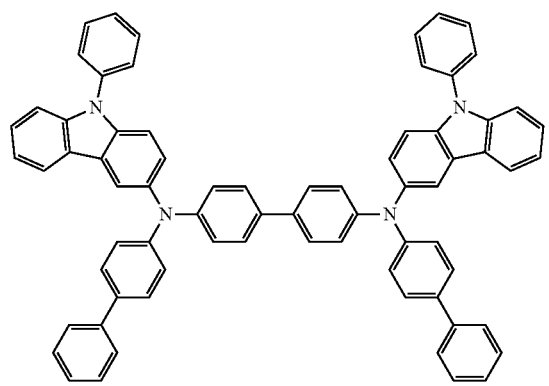
HT34
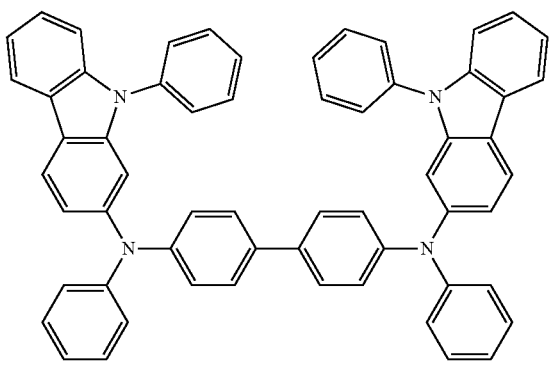
HT35
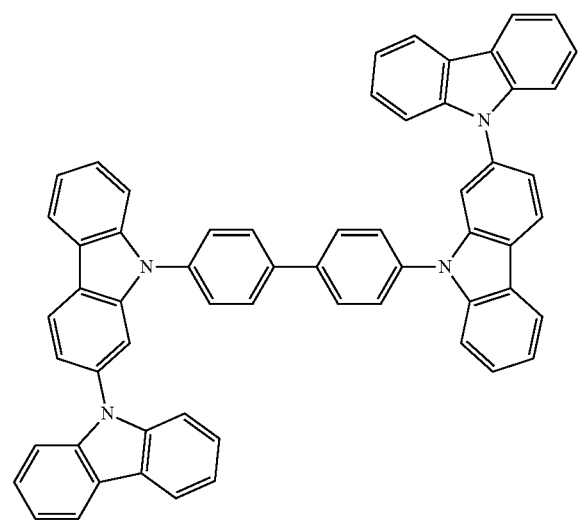
HT36
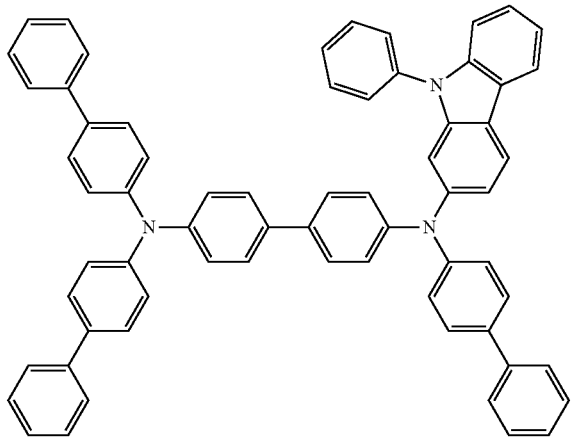
HT37
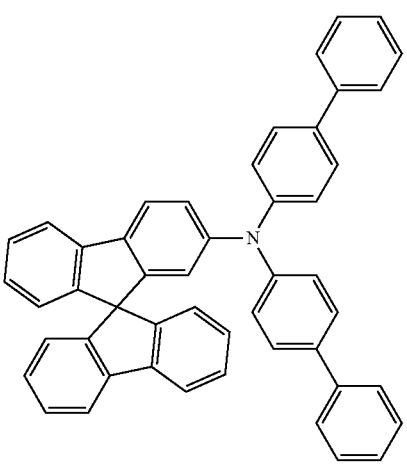
HT38
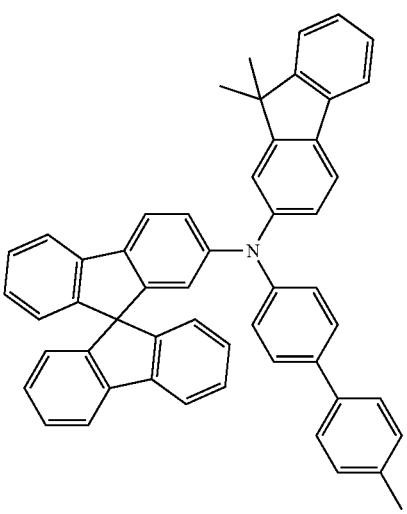

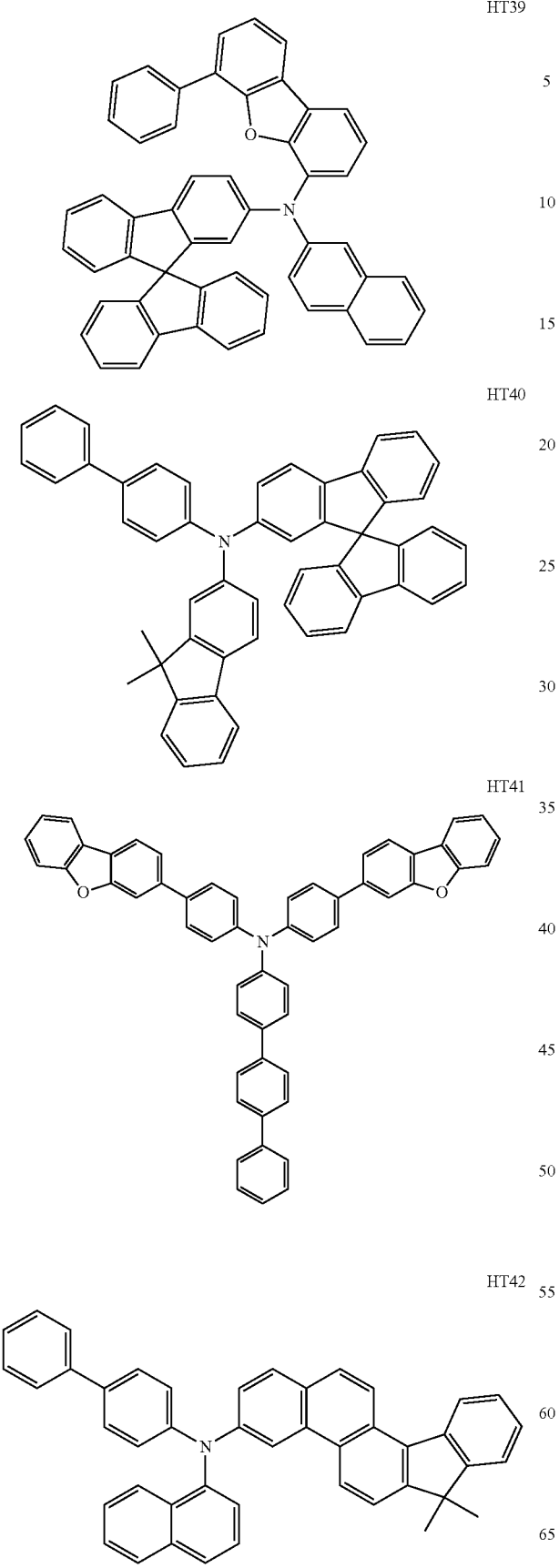
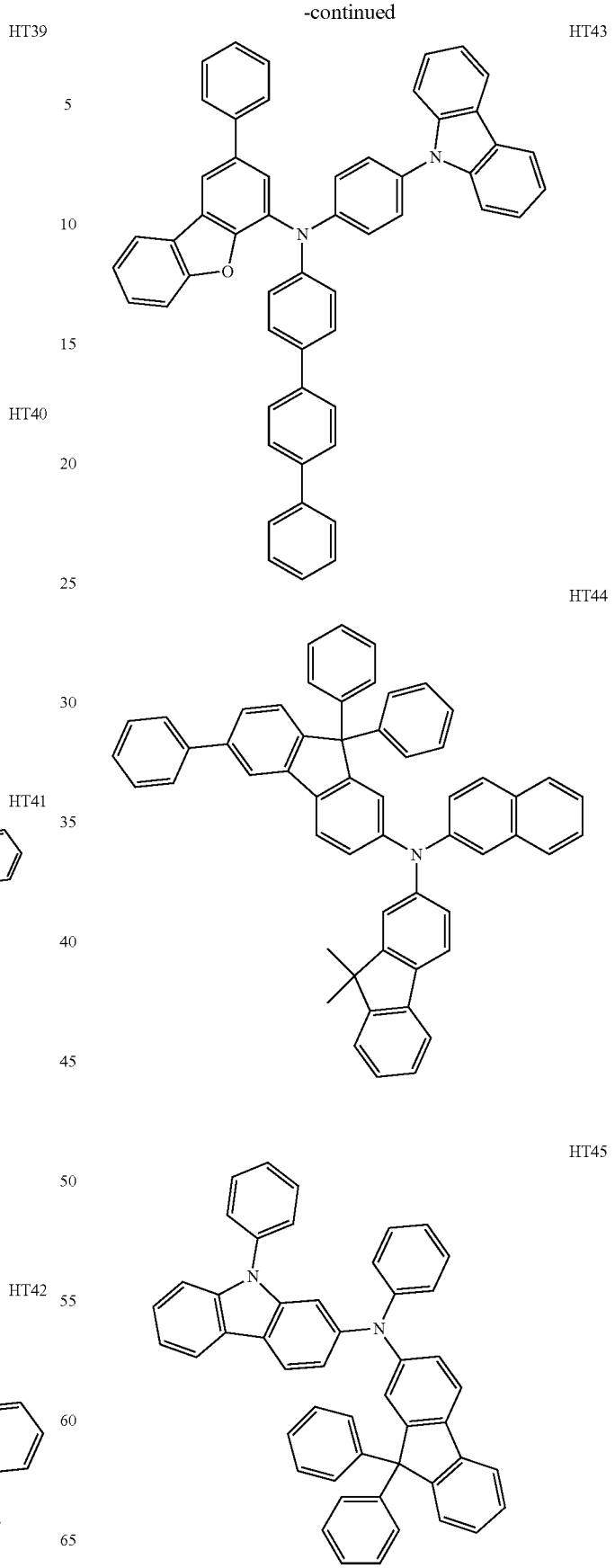

-continued
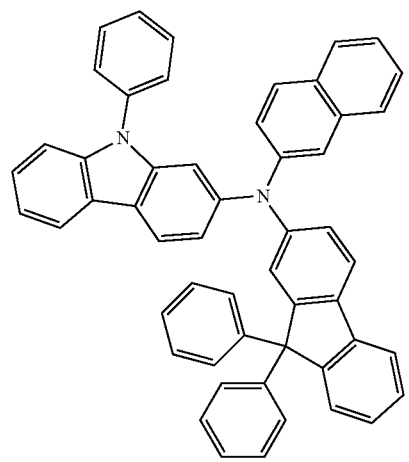
HT46
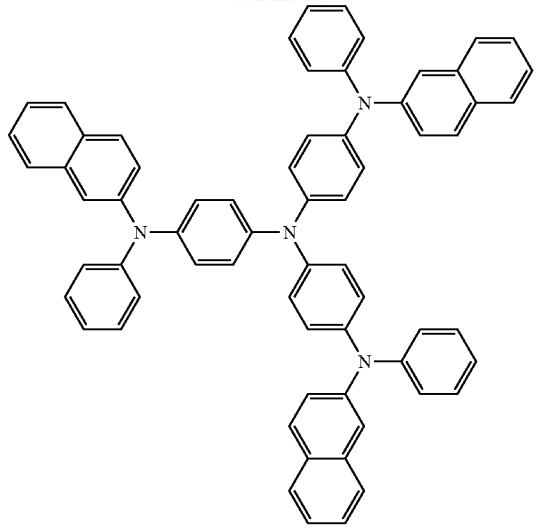
2-TNATA
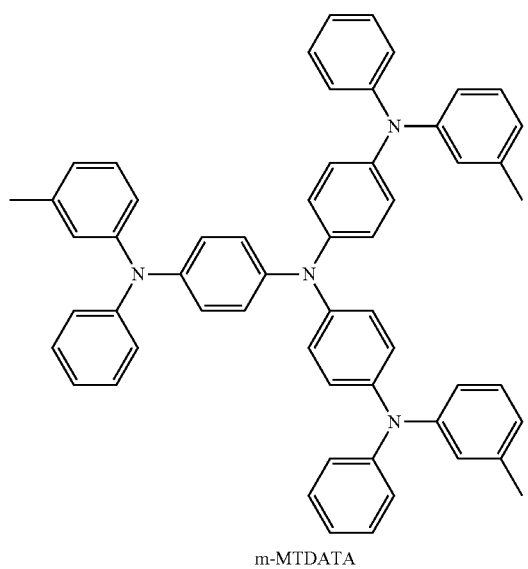
m-MTDATA
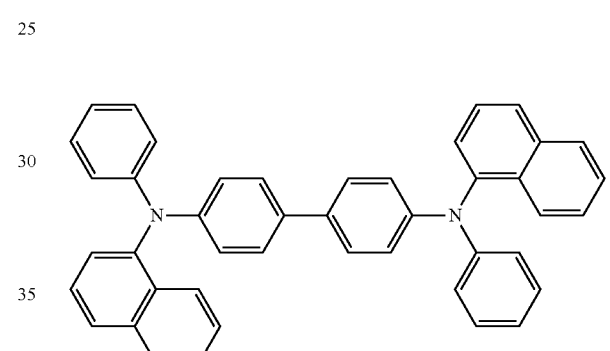
NPB
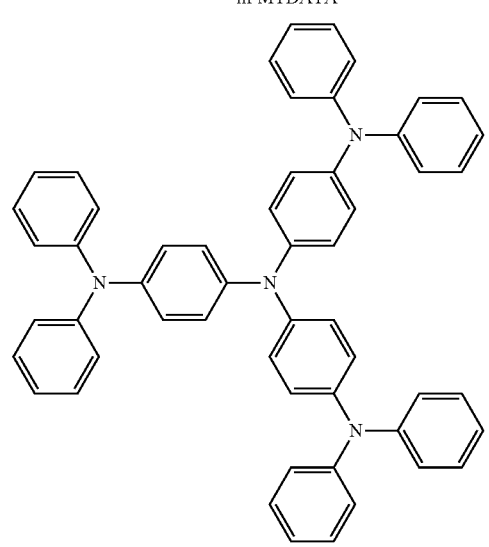
TDATA
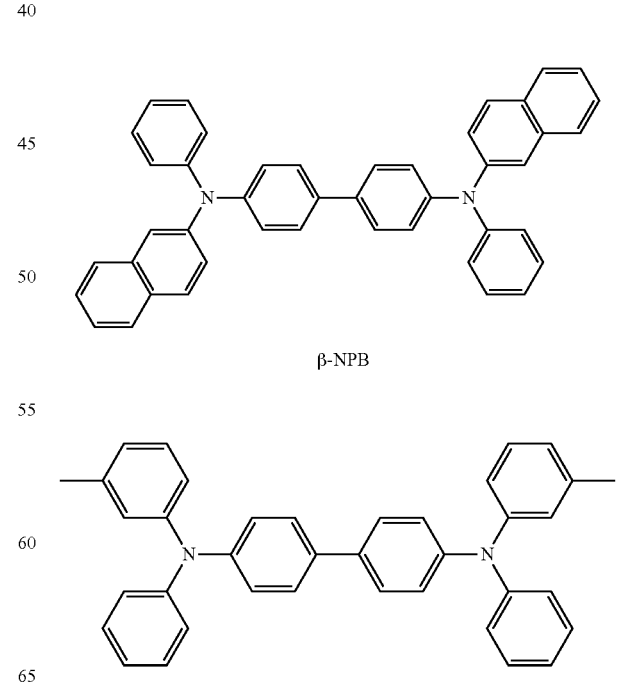
β-NPB
TPD

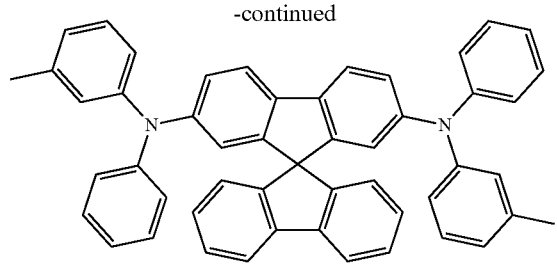

Spiro-TPD

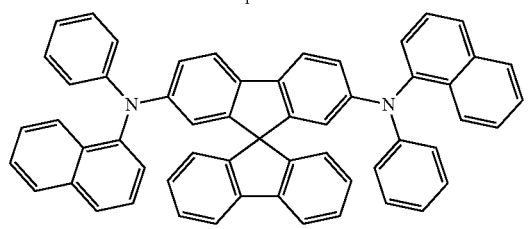

Spiro-NPB

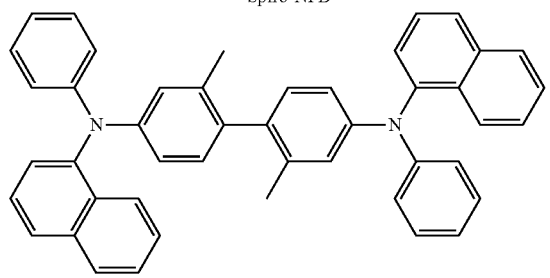

methylated-NPB

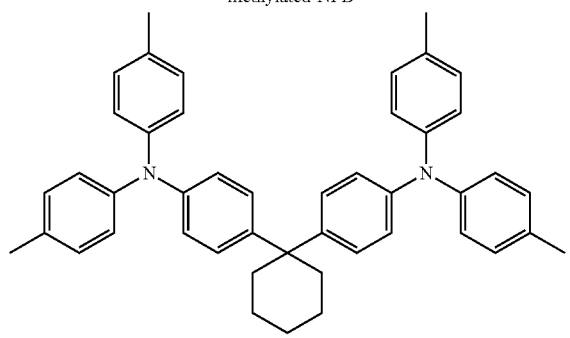

TAPC

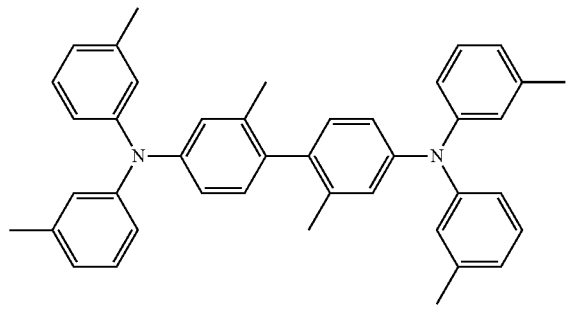

HMTPD

A thickness of the hole transport region may be in a range of about 50 Å to about 10,000 Å. For example, the thickness of the hole transport region may be in a range of about 100 Å to about 4,000 Å. When the hole transport region includes a hole transport layer, an electron blocking layer or any combination thereof, a thickness of the hole transport layer may be in a range of about 50 Å to about 2,000 Å. For example, the thickness of the hole transport layer may be in a range of about 100 Å to about 1,500 Å. When the thicknesses of the hole transport region and the hole transport layer are within the ranges described above, satisfactory hole transportation characteristics may be obtained without a substantial increase in driving voltage.

The emission auxiliary layer may increase light-emission efficiency by compensating for an optical resonance distance according to a wavelength of light emitted from the emission layer, and the electron blocking layer may block the leakage of electrons from the emission layer to the hole transport region. Materials that may be included in the hole transport region may be included in the emission auxiliary layer and the electron blocking layer.

[p-Dopant]

The hole transport region may further include, in addition to these materials, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, a compound containing element EL1 and element EL2, or any combination thereof.

Examples of the quinone derivative may include TCNQ, F4-TCNQ, and the like.

Examples of the cyano group-containing compound may include HAT-CN, a compound represented by Formula 221, and the like:

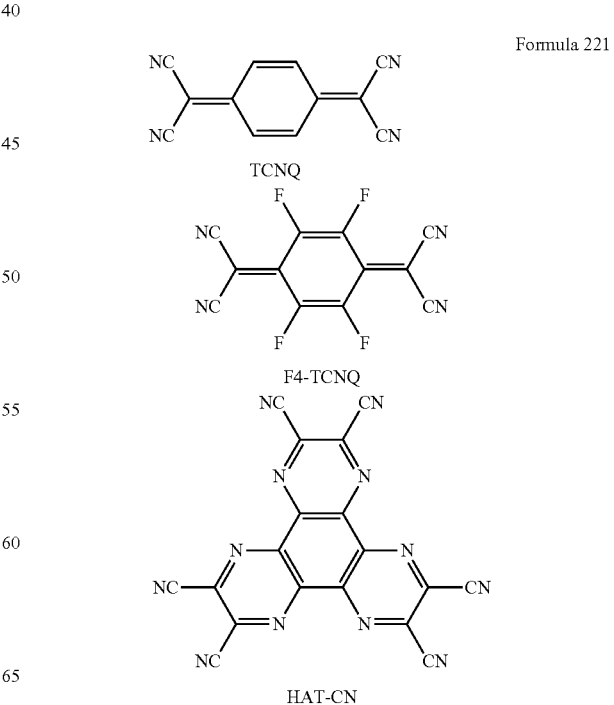

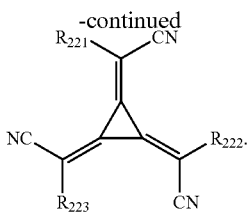

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and a halogen (for example, F, Cl, Br, I, etc.).

In an embodiment, examples of the compound containing element EL1 and element EL2 may include a metal oxide, a metal halide (for example, a metal fluoride, a metal chloride, a metal bromide, or a metal iodide), a metalloid halide (for example, a metalloid fluoride, a metalloid chloride, a metalloid bromide, or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCL, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (for example, $TiF_4$, $TiCl_4$, $TiBr_4$, $TiI_4$, etc.), a zirconium halide (for example, $ZrF_4$, $ZrCl_4$, $ZrBr_4$, $ZrI_4$, etc.), a hafnium halide (for example, $HfF_4$, $HfCl_4$, $HfBr_4$, $HfI_4$, etc.), a vanadium halide (for example, $VF_3$, $VCl_3$, $VBr_3$, $VI_3$, etc.), a niobium halide (for example, $NbF_3$, $NbCl_3$, $NbBr_3$, $NbI_3$, etc.), a tantalum halide (for example, $TaF_3$, $TaCl_3$, $TaBr_3$, $TaI_3$, etc.), a chromium halide (for example, $CrF_3$, $CrCl_3$, $CrBr_3$, $CrI_3$, etc.), a molybdenum halide (for example, $MoF_3$, $MoCl_3$, $MoBr_3$, $MoI_3$, etc.), a tungsten halide (for example, $WF_3$, $WCl_3$, $WBr_3$, $WI_3$, etc.), a manganese halide (for example, $MnF_2$, $MnCl_2$, $MnBr_2$, $MnI_2$, etc.), a technetium halide (for example, $TcF_2$, $TcCl_2$, $TcBr_2$, $TcI_2$, etc.), a rhenium halide (for example, $ReF_2$, $ReCl_2$, $ReBr_2$, $ReI_2$, etc.), an iron halide (for example, $FeF_2$, $FeCl_2$, $FeBr_2$, $FeI_2$, etc.), a ruthenium halide (for example, $RuF_2$, $RuCl_2$, $RuBr_2$, $RuI_2$, etc.), an osmium halide (for example, $OsF_2$, $OsCl_2$, $OsBr_2$, $OsI_2$, etc.), a cobalt halide (for example, $CoF_2$, $CoCl_2$, $CoBr_2$, $CoI_2$, etc.), a rhodium halide (for example, $RhF_2$, $RhCl_2$, $RhBr_2$, $RhI_2$, etc.), an iridium halide (for example, $IrF_2$, $IrCl_2$, $IrBr_2$, $IrI_2$, etc.), a nickel halide (for example, $NiF_2$, $NiCl_2$, $NiBr_2$, $NiI_2$, etc.), a palladium halide (for example, $PdF_2$, $PdCl_2$, $PdBr_2$, $PdI_2$, etc.), a platinum halide (for example, $PtF_2$, $PtCl_2$, $PtBr_2$, $PtI_2$, etc.), a copper halide (for example, CuF, CuCl, CuBr, CuI, etc.), a silver halide (for example, AgF, AgCl, AgBr, AgI, etc.), and a gold halide (for example, AuF, AuCl, AuBr, AuI, etc.).

Examples of the post-transition metal halide may include a zinc halide (for example, $ZnF_2$, $ZnCl_2$, $ZnBr_2$, $ZnI_2$, etc.), an indium halide (for example, $InI_3$, etc.), and a tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include an antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

[Emission Layer in Interlayer 130]

When the light-emitting device 10 is a full-color light-emitting device, the emission layer may be patterned into a red emission layer, a green emission layer, and/or a blue emission layer, according to a subpixel. In an embodiment, the emission layer may have a stacked structure of two or more layers of a red emission layer, a green emission layer, and a blue emission layer, in which the two or more layers may contact each other or may be separated from each other. In an embodiment, the emission layer may include two or more materials of a red light-emitting material, a green light-emitting material, and a blue light-emitting material, in which the two or more materials are mixed with each other in a single layer to emit white light.

The emission layer may include a host and a dopant. The host may be the same as described in connection with the first hole transport compound or the first electron transport compound.

An amount of the dopant in the emission layer may be in a range of about 0.01 parts by weight to about 15 parts by weight, based on 100 parts by weight of the host.

A thickness of the emission layer may be in a range of about 100 Å to about 1,000 Å. For example, the thickness of the emission layer may be in a range of about 200 Å to about 600 Å. When the thickness of the emission layer is within these ranges, excellent light-emission characteristics may be obtained without a substantial increase in driving voltage.

[Dopant]

The dopant (for example, the third compound) may include at least one transition metal as a central metal.

The dopant may include a monodentate ligand, a bidentate ligand, a tridentate ligand, a tetradentate ligand, a pentadentate ligand, a hexadentate ligand, or any combination thereof.

The dopant may be electrically neutral.

For example, the dopant may include an organometallic compound represented by Formula 401:

$$M(L_{401})_{xc1}(L_{402})_{xc2}$$ [Formula 401]

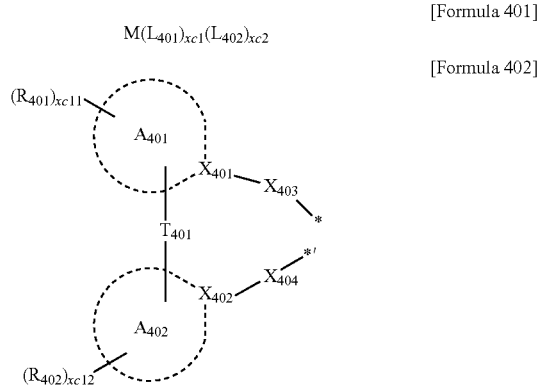

[Formula 402]

In Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, xc1 may be 1, 2, or 3, and when xc1 is 2 or more, two or more of $L_{401}$ may be identical to or different from each other, $L_{402}$ may be an organic ligand, xc2 may be 0, 1, 2, 3, or 4, and when xc2 is 2 or more, two or more of $L_{402}$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are each independently the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are each independently the same as described in connection with $Q_1$, xc11 and xc12 may each independently be an integer from 0 to 10, and

* and *' in Formula 402 each indicate a binding site to M in Formula 401.

In an embodiment, in Formula 402, $X_{401}$ may be nitrogen and $X_{402}$ may be carbon, or each of $X_{401}$ and $X_{402}$ may be nitrogen.

In an embodiment, when xc1 in Formula 402 is 2 or more, two ring $A_{401}$(s) in two or more of $L_{401}$ may be optionally linked to each other via $T_{402}$, which is a linking group, and two ring $A_{402}$(s) may optionally be linked to each other via $T_{403}$, which is a linking group (see Compounds PD1 to PD4 and PD7). $T_{402}$ and $T_{403}$ are each independently the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The dopant may include, for example, one of Compounds PD1 to PD25, one of Compounds BD1 to BD6, or any combination thereof:

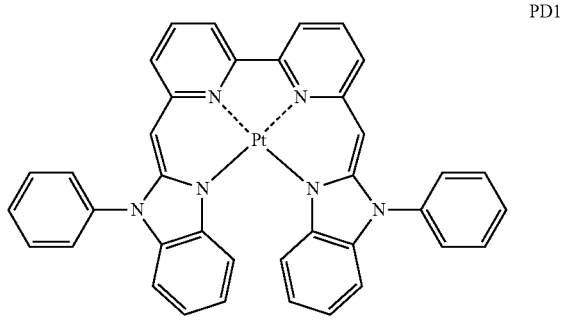

PD1

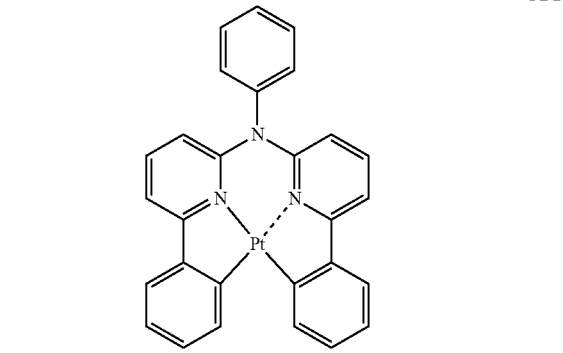

PD2

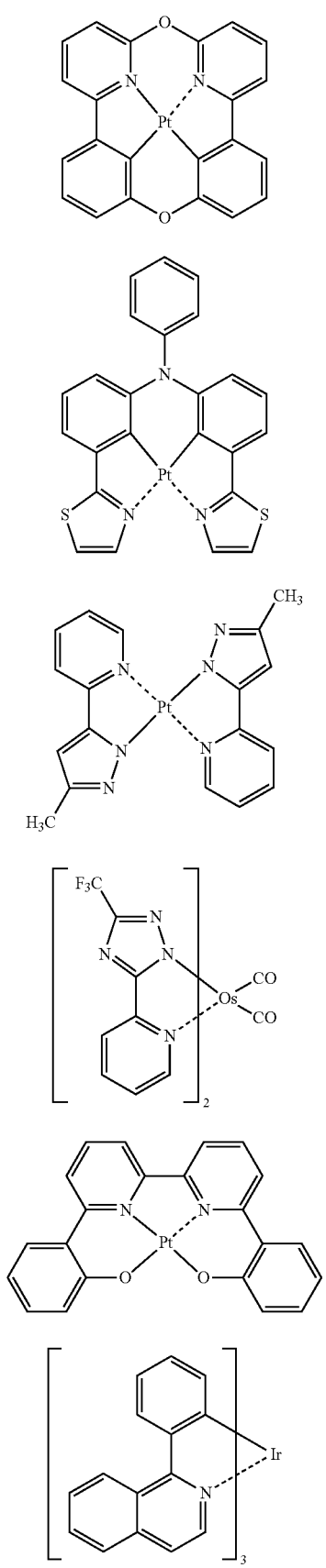
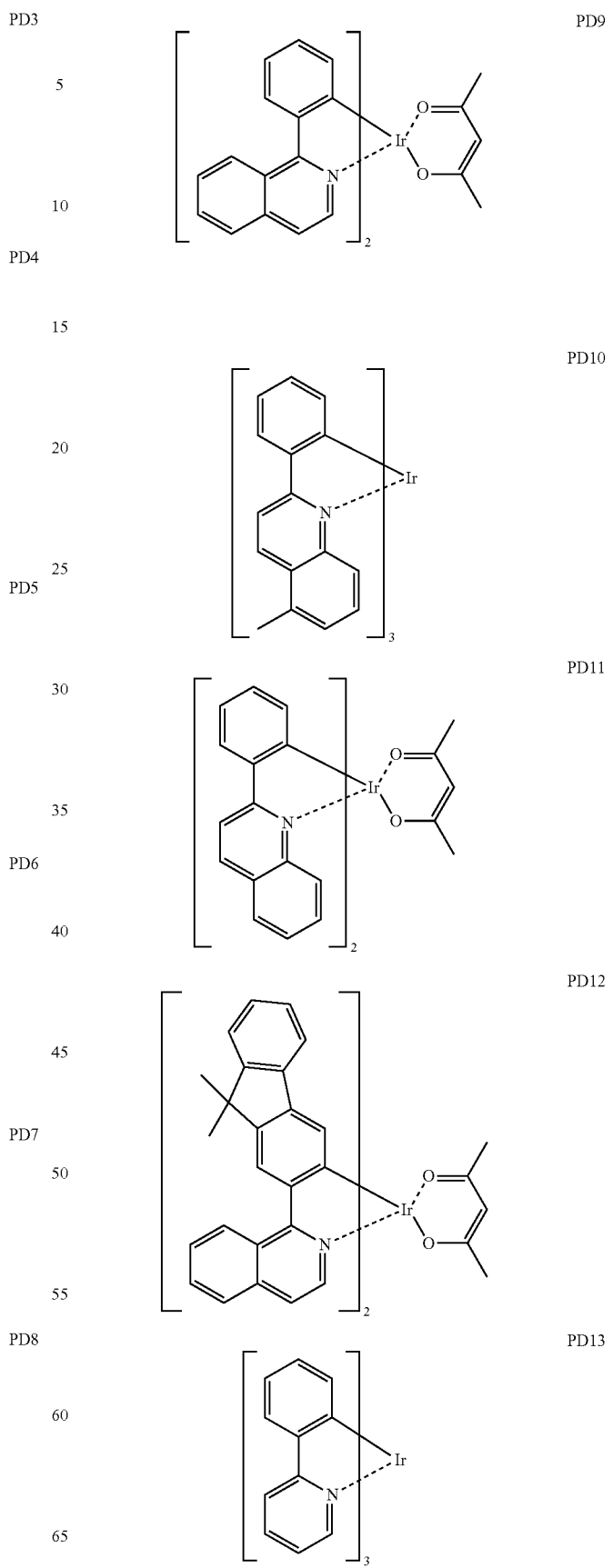

PD14
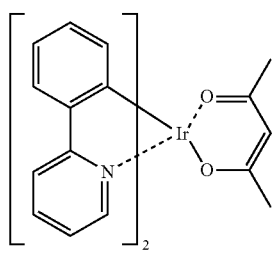
PD15
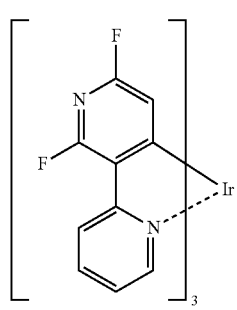
PD16
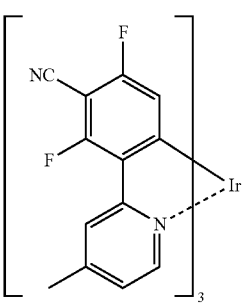
PD17
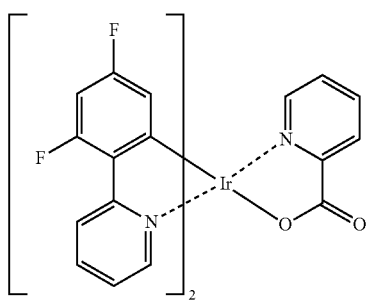
PD18
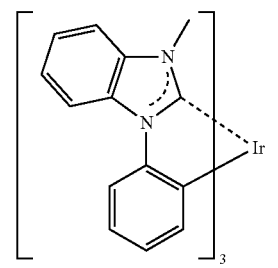
PD19
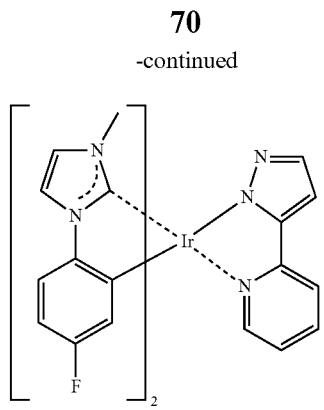
PD20
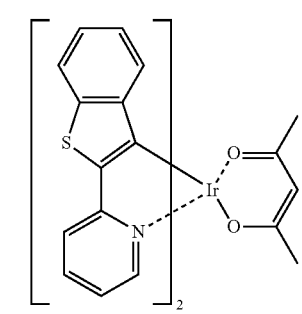
PD21
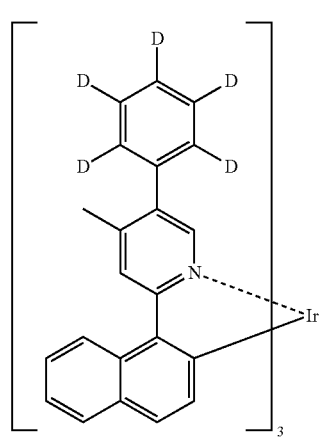
PD22
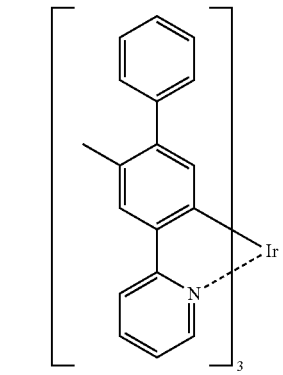

PD23
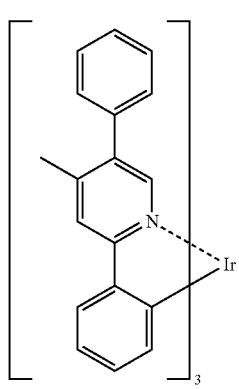
BD2
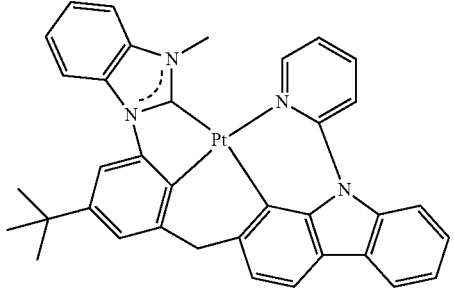
PD24
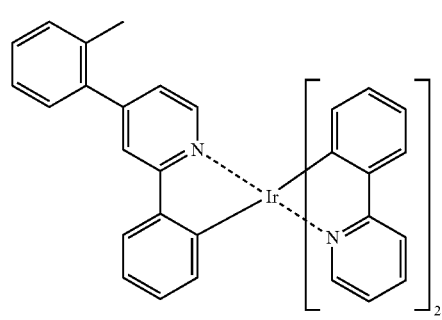
BD3
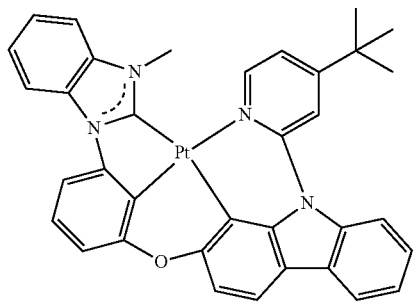
PD25
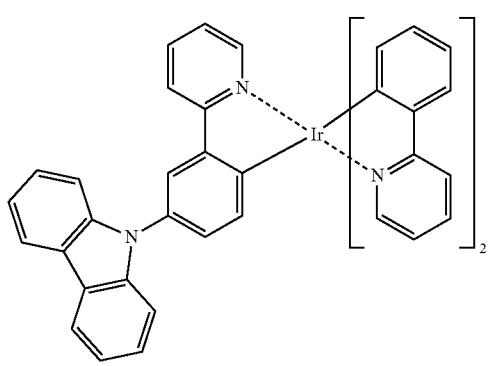
BD4
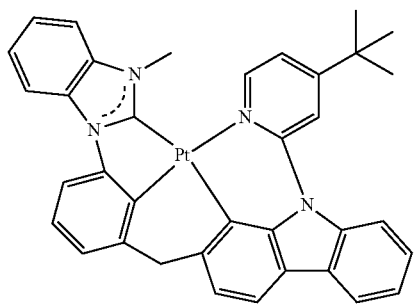
BD1
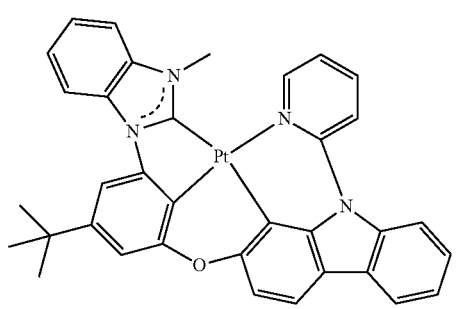
BD5
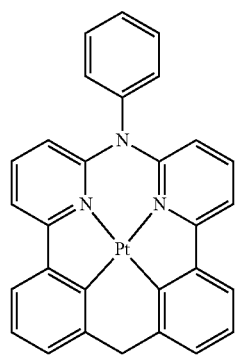

-continued

BD6

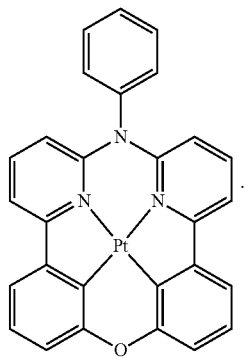

[Quantum Dot]

The electronic apparatus may include quantum dots. For example, the electronic apparatus may include a color conversion layer, and the color conversion layer may include quantum dots.

In the specification, a quantum dot may be a crystal of a semiconductor compound, and may include any material capable of emitting light of various emission wavelengths according to a size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, or any process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more readily performed than vapor deposition methods, such as metal organic chemical vapor deposition (MOCVD) or molecular beam epitaxy (MBE), and which requires low costs.

The quantum dot may include a Group II-VI semiconductor compound, a Group III-V semiconductor compound, a Group III-VI semiconductor compound, a Group I-III-VI semiconductor compound, a Group IV-VI semiconductor compound, a Group IV element or compound, or any combination thereof.

Examples of the Group II-VI semiconductor compound may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Group III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. In an embodiment, the Group III-V semiconductor compound may further include a Group II element. Examples of the Group III-V semiconductor compound further including a Group II element may include InZnP, InGaZnP, InAlZnP, and the like.

Examples of the Group III-VI semiconductor compound may include: a binary compound, such as GaS, GaSe, $Ga_2Se_3$, GaTe, InS, InSe, $In_2Se_3$, or InTe; a ternary compound, such as $InGaS_3$, or $InGaSe_3$; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, PbTe, or the like; a ternary compound, such as SnSeS, SnSeTe, SnSTe, PbSeS, PbSeTe, PbSTe, SnPbS, SnPbSe, SnPbTe, or the like; a quaternary compound, such as SnPbSSe, SnPbSeTe, SnPbSTe, or the like; or any combination thereof.

Examples of the Group IV element or compound may include: a single element material, such as Si or Ge; a binary compound, such as SiC or SiGe; or any combination thereof.

Each element included in a multi-element compound such as a binary compound, a ternary compound, and a quaternary compound, may be present in a particle at a uniform concentration or at a non-uniform concentration.

In an embodiment, the quantum dot may have a single structure or a core-shell structure. In the case that the quantum dot has a single structure, the concentration of each element included in the corresponding quantum dot may be uniform. In an embodiment, when the quantum dot has a core-shell structure, a material contained in the core and the material contained in the shell may be different from each other.

The shell of the quantum dot may serve as a protective layer to prevent chemical degeneration of the core to maintain semiconductor characteristics and/or may serve as a charging layer to impart electrophoretic characteristics to the quantum dot. The shell may be a single layer or a multilayer. An element that is present at an interface between the core and the shell of the quantum dot may have a concentration gradient that decreases toward the center of the quantum dot.

Examples of the shell of the quantum dot may include a metal oxide, a metalloid oxide, a non-metal oxide, a semiconductor compound, and any combination thereof. Examples of a metal oxide, a metalloid oxide, or a non-metal oxide may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, a Group II-VI semiconductor compound, a Group III-V semiconductor compound, a Group III-VI semiconductor compound, a Group I-III-VI semiconductor compound, a Group IV-VI semiconductor compound, or any combination thereof. Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be equal to or less than about 45 nm. For example, a FWHM of an emission wavelength spectrum of the quantum dot may be equal to or less than about 40 nm. For example, a FWHM of an emission wavelength spectrum of the quantum dot may be equal to or less than about 30 nm. Within these ranges, color purity or color reproducibility may be increased. Light emitted through the quantum dot may be emitted in all directions, so that a wide viewing angle may be improved.

The quantum dot may be a spherical particle, a pyramidal particle, a multi-arm particle, a cubic nanoparticle, a nanotube particle, a nanowire particle, a nanofiber particle, or a nanoplate particle.

Since the energy band gap can be adjusted by controlling the size of the quantum dot, light having various wavelength bands can be obtained from the quantum dot color conversion layer. Therefore, by using quantum dots of different sizes, a light-emitting device that emits light of various wavelengths may be implemented. In an embodiment, the size of the quantum dot may be selected to emit red, green, and/or blue light. The size of the quantum dot may be configured to emit white light by combining light of various colors.

[Electron Transport Region in Interlayer 130]

The electron transport region may have a structure consisting of a layer consisting of a single material, a structure consisting of a layer consisting of different materials, or a structure including multiple layers including different materials.

The electron transport region may include an electron transport layer, a buffer layer, a hole blocking layer, an electron injection layer, or any combination thereof.

For example, the electron transport region may include a structure of a buffer layer/an electron transport layer sequentially stacked from the emission layer, but the structure of the electron transport region is not limited thereto.

The electron transport region (for example, the hole blocking layer or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601:

[Formula 601]

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are each independently the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

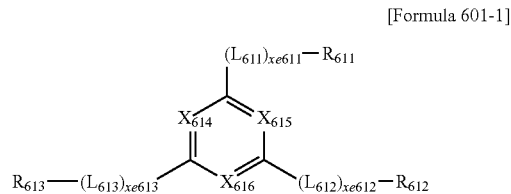
[Formula 601-1]

In Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ are each independently the same as described in connection with $L_{601}$, xe611 to xe613 are each independently the same as described in connection with xe1, $R_{611}$ to $R_{613}$ are each independently the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The second electron transport compound included in the layer (for example, the electron transport layer) of the light-emitting device according to an embodiment may be the same as described in connection with Formula 3.

The buffer layer may include a compound represented by Formula 2.

The electron transport region may include one of Compounds ET1 to ET37, 2,9-dimethyl-4,7-diphenyl-1, 10-phenanthroline (BCP), 4,7-diphenyl-1,10-phenanthroline (Bphen), $Alq_3$, BAlq, TAZ, NTAZ, or any combination thereof:

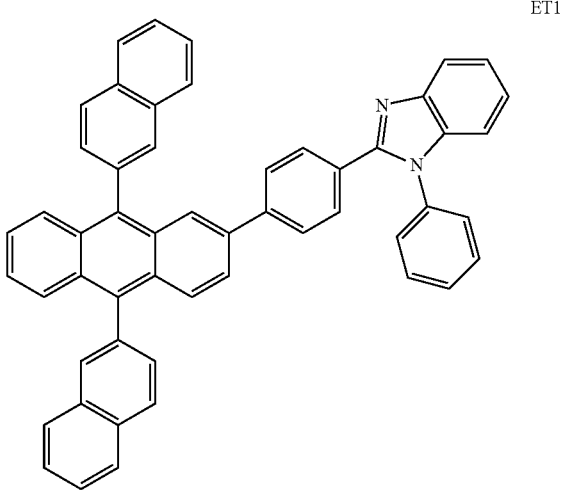
ET1

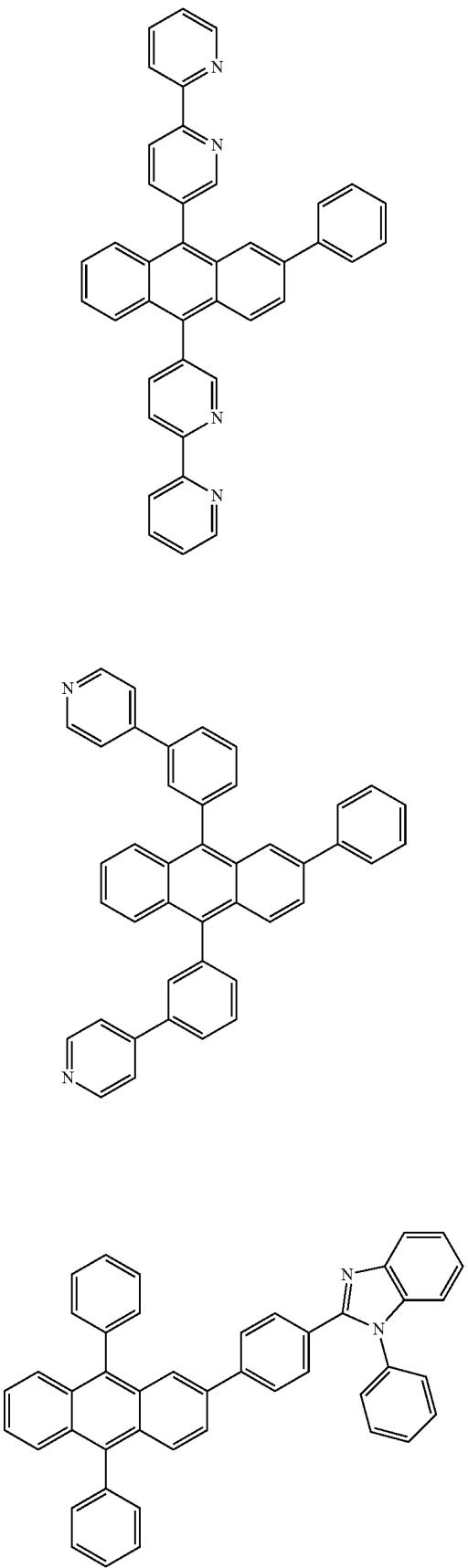
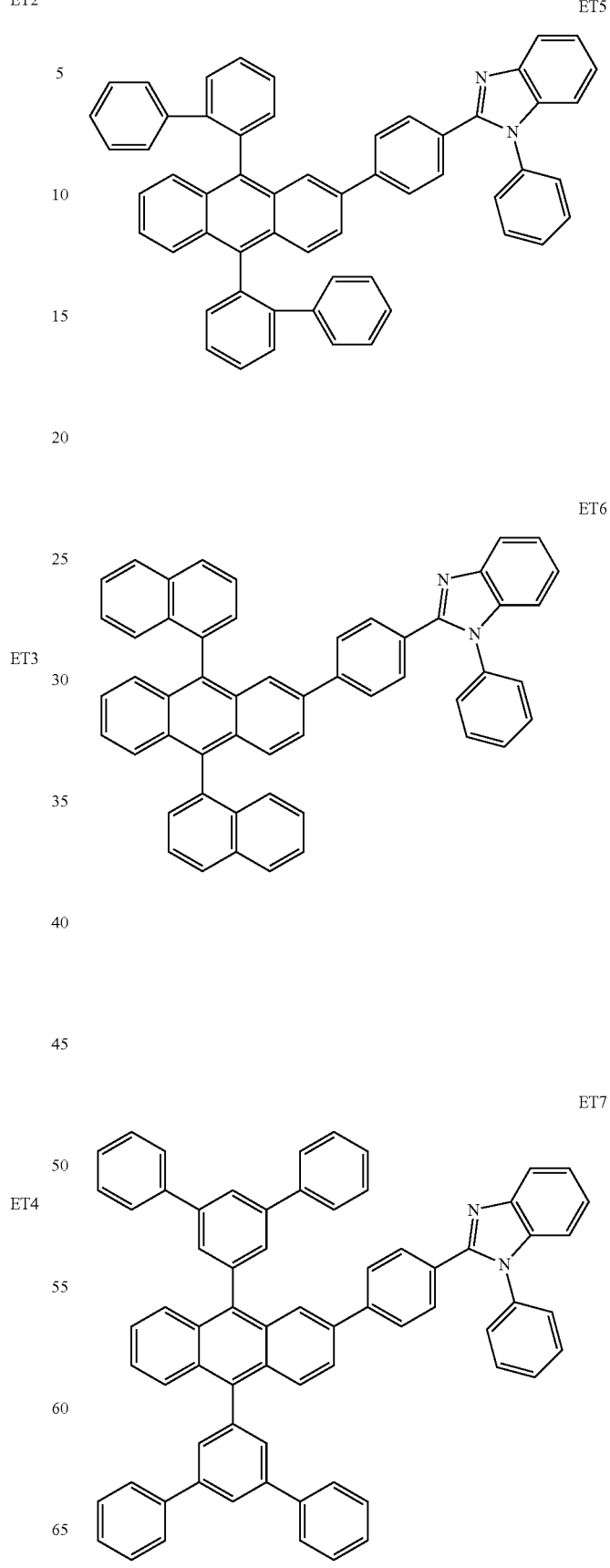

ET8
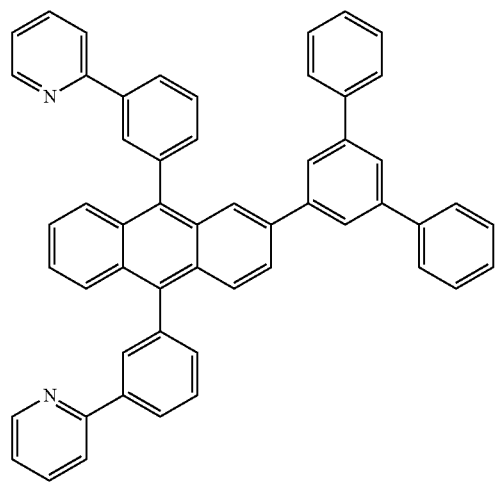
ET9
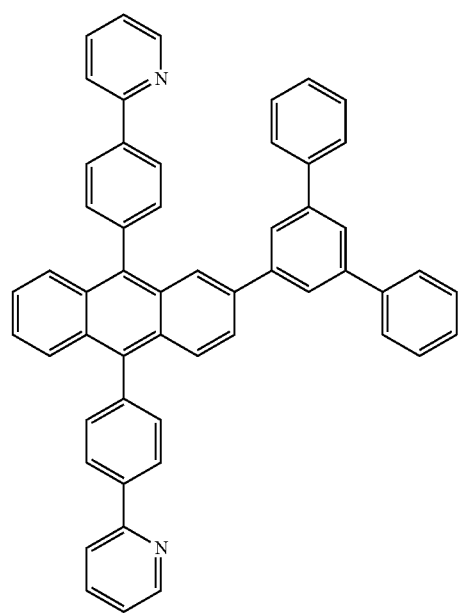
ET10
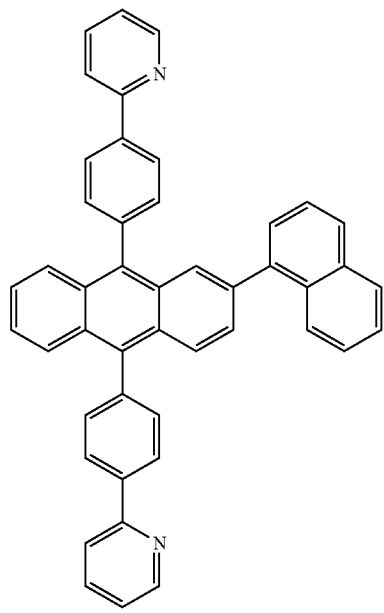
ET11
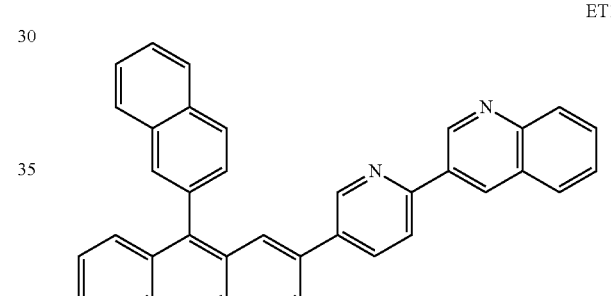
ET12
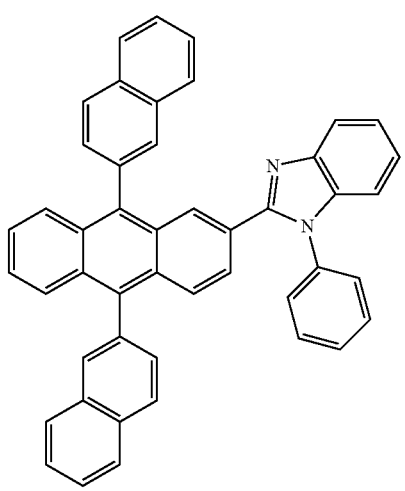

ET13
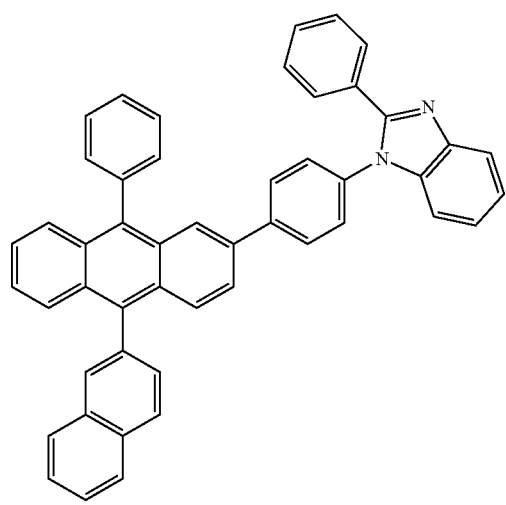
ET14
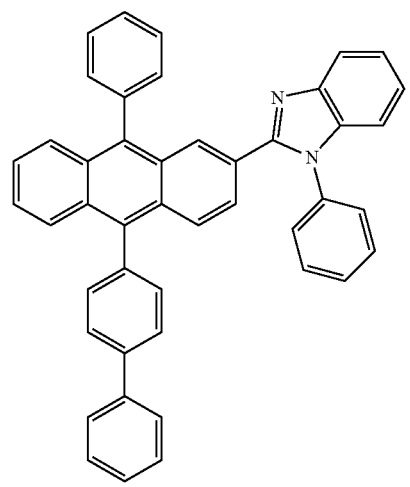
ET15
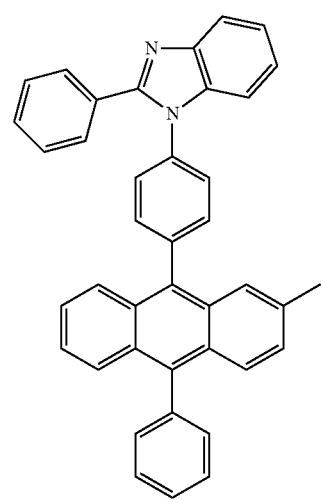
ET16
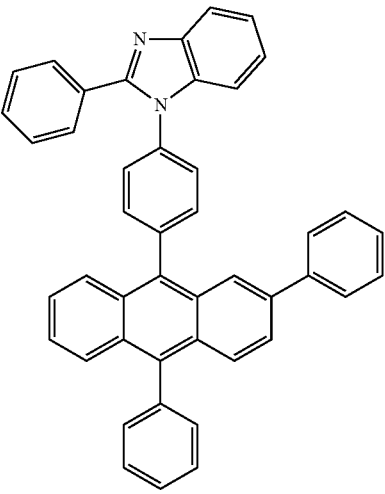
ET17
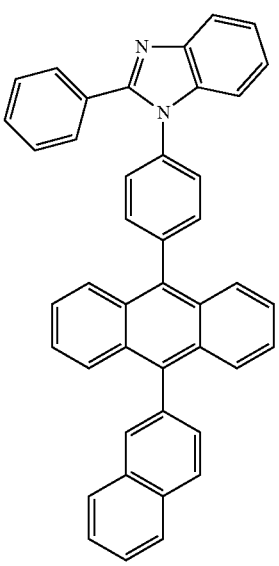
ET18
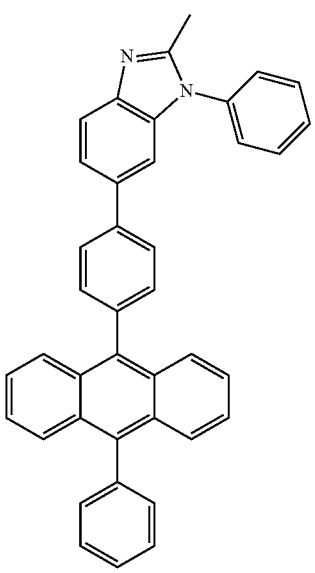

ET19
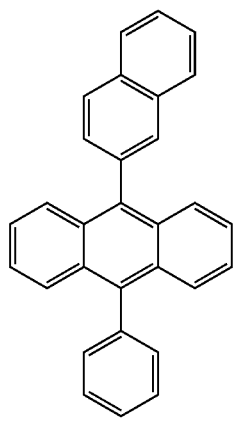
ET22
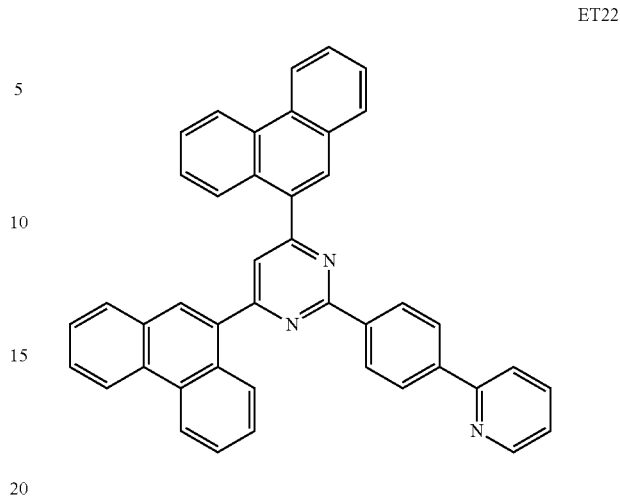
ET20
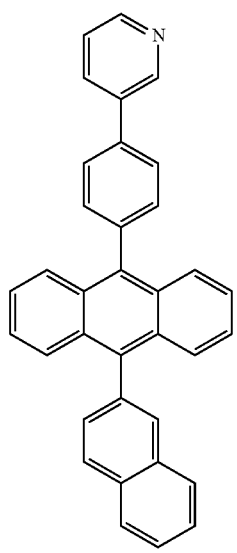
ET23
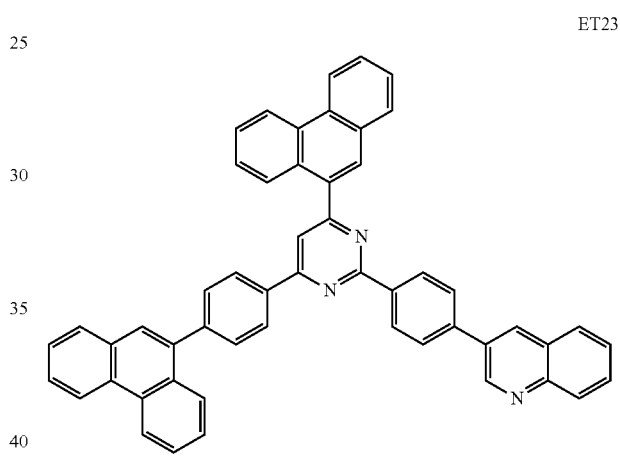
ET21
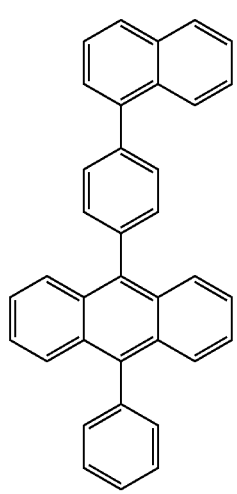
ET24
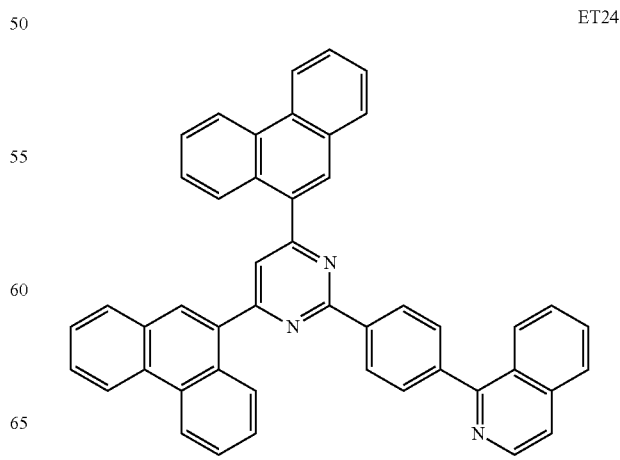

ET25
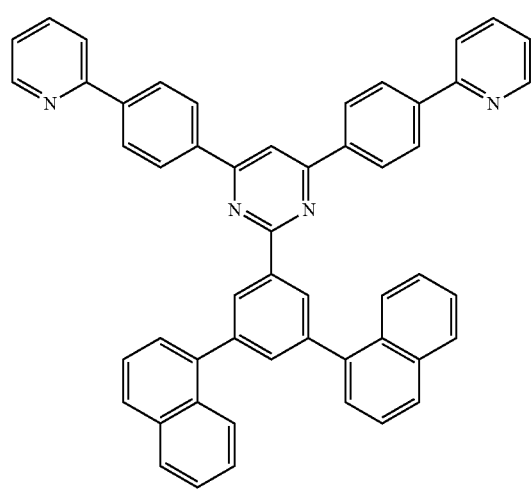
ET28
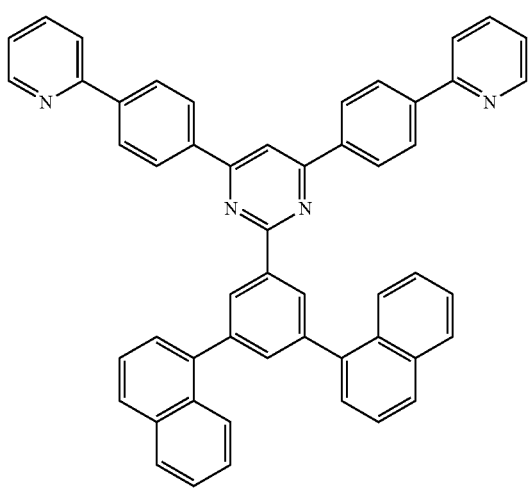
ET26
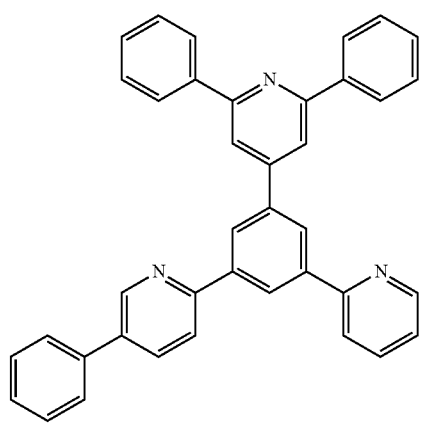
ET29
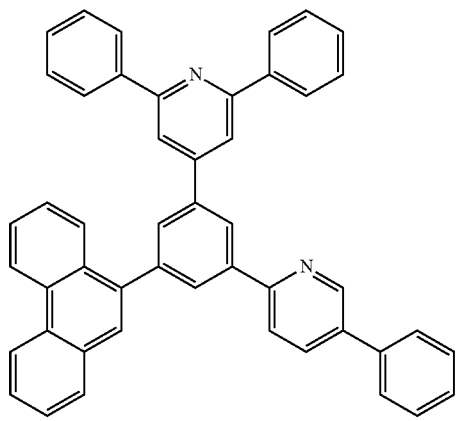
ET27
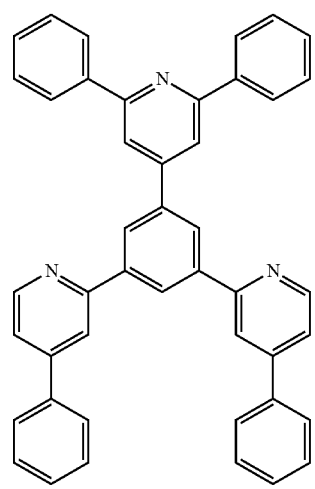
ET30
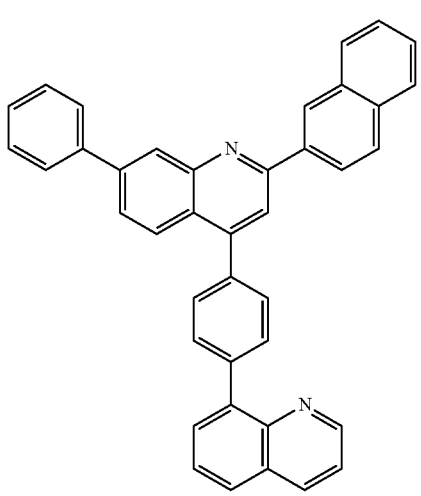

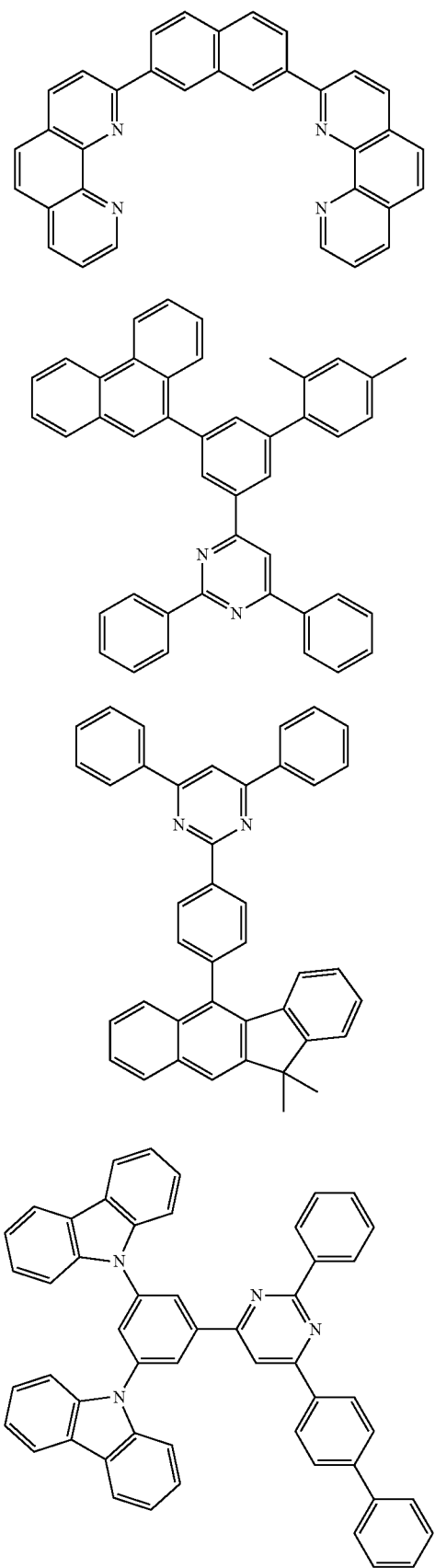
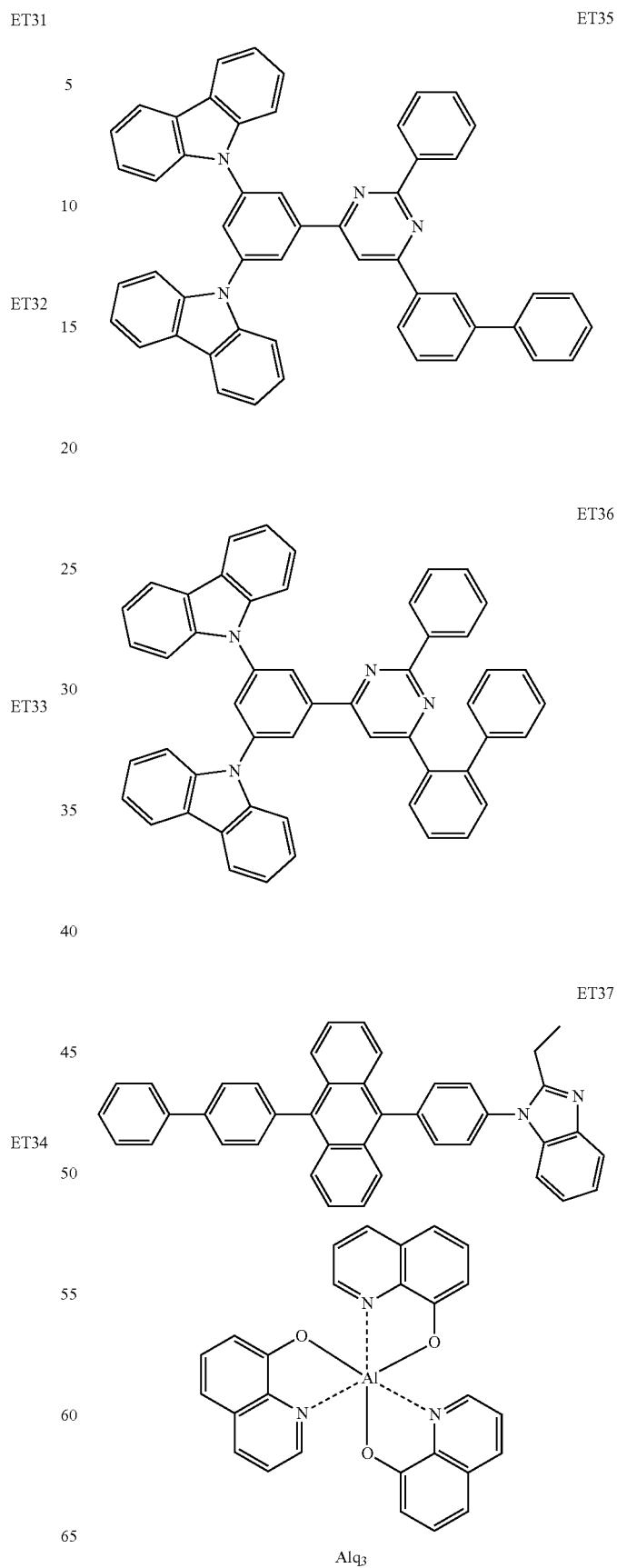

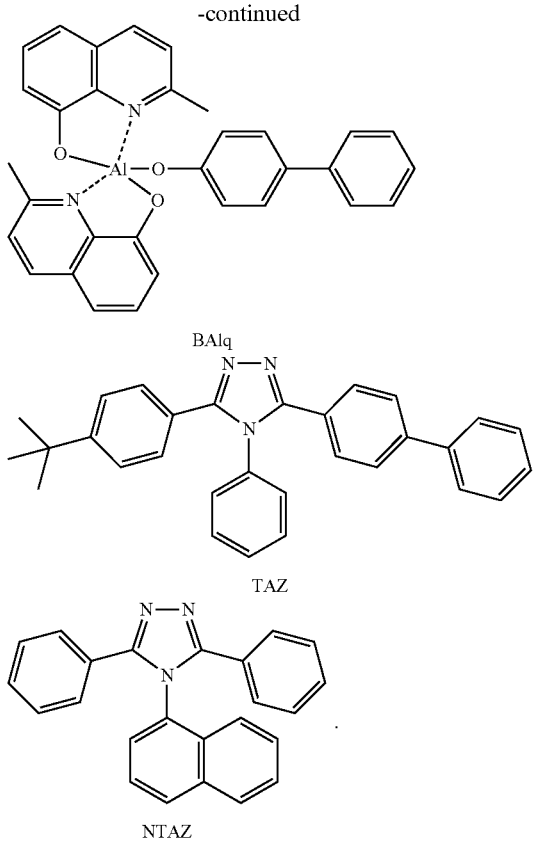

BAlq

TAZ

NTAZ

A thickness of the electron transport region may be in a range of about 100 Å to about 5,000 Å. For example, the thickness of the electron transport region may be in a range of about 160 Å to about 4,000 Å. When the electron transport region includes a hole blocking layer, an electron transport layer, or any combination thereof, a thickness of the hole blocking layer may be in a range of about 20 Å to about 1,000 Å, and a thickness of the electron transport layer may be from about 100 Å to about 1,000 Å. For example, the thickness of the hole blocking layer may be in a range of about 30 Å to about 300 Å. For example, the thickness of the electron transport layer may be in a range of about 150 Å to about 500 Å. When the thicknesses of the hole blocking layer and/or the electron transport layer are within the ranges described above, satisfactory electron-transporting characteristics may be obtained without a substantial increase in driving voltage.

A thickness of the buffer layer may be in a range of about 10 Å to about 500 Å. For example, the thickness of the buffer layer may be in a range of about 30 Å to about 300 Å. For example, the thickness of the buffer layer may be in a range of about 40 Å to about 150 Å. When a thickness of the buffer layer is less than about 10 Å, there may be a difficulty in processes, and when a thickness of the buffer layer is greater than about 500 Å, driving voltage may be rapidly increased.

The electron transport region may further include, in addition to the materials described above, a metal-containing material. For example, the electron transport layer in the electron transport region may further include a metal-containing material, in addition to the compound represented by Formula 3. A weight ratio of the compound represented by Formula 3 to the metal-containing material may be in a range of about 9:1 to about 1:9. For example, a weight ratio of the compound represented by Formula 3 to the metal-containing material may be in a range of about 7:3 to about 3:7. For example, a weight ratio of the compound represented by Formula 3 to the metal-containing material may be in a range of about 5:4 to about 4:5.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the metal ion of the alkaline earth-metal complex may each independently include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex.

The Li complex may include, for example, Compound ET-D1 (LiQ), Compound ET-D2, or Compound ET-D3 (LiF):

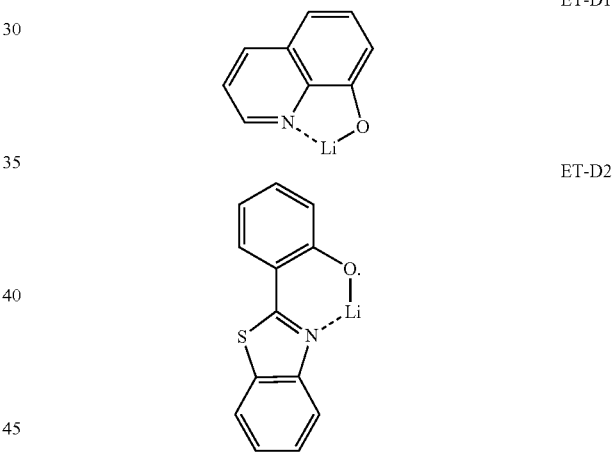

The electron transport region may include an electron injection layer that facilitates the injection of electrons from the second electrode 150. The electron injection layer may directly contact the second electrode 150.

The electron injection layer may have a structure consisting of a layer consisting of a single material, a structure consisting of a layer consisting of different materials, or a structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include oxides, halides (for example, fluorides, chlorides, bromides, or iodides), or tellurides of the alkali metal, the alkaline earth metal, and the rare earth metal, or any combination thereof.

The alkali metal-containing compound may include: alkali metal oxides, such as $Li_2O$, $Cs_2O$, or $K_2O$; alkali metal halides, such as LiF, NaF, CsF, KF, LiI, NaI, CsI, or KI; or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include a lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include one of ions of the alkali metal, ions of the alkaline earth metal, and ions of the rare earth metal, and a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may consist of an alkali metal-containing compound (for example, an alkali metal halide); or the electron injection layer may consist of an alkali metal-containing compound (for example, an alkali metal halide), and an alkali metal, an alkaline earth metal, a rare earth metal, or any combination thereof. For example, the electron injection layer may be a KI:Yb co-deposited layer, a RbI:Yb co-deposited layer, a LiF:Yb co-deposited layer, or the like.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, satisfactory electron injection characteristics may be obtained without a substantial increase in driving voltage.

[Second Electrode 150]

The second electrode 150 may be located on the interlayer 130 having such a structure. The second electrode 150 may be a cathode, which is an electron injection electrode. The second electrode 150 may include a material having a low work function, for example, a metal, an alloy, an electrically conductive compound, or any combination thereof.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer may be located outside the first electrode 110, and/or a second capping layer may be located outside the second electrode 150. For example, the light-emitting device 10 may have a structure in which the first capping layer, the first electrode 110, the interlayer 130, and the second electrode 150 are stacked in this stated order, a structure in which the first electrode 110, the interlayer 130, the second electrode 150, and the second capping layer are stacked in this stated order, or a structure in which the first capping layer, the first electrode 110, the interlayer 130, the second electrode 150, and the second capping layer are stacked in this stated order.

Light generated in an emission layer of the interlayer 130 of the light-emitting device 10 may be extracted toward the outside through the first electrode 110, which is a semi-transmissive electrode or a transmissive electrode, and through the first capping layer; and/or light generated in an emission layer of the interlayer 130 of the light-emitting device 10 may be extracted toward the outside through the second electrode 150, which is a semi-transmissive electrode or a transmissive electrode, and through the second capping layer.

The first capping layer and the second capping layer may each increase external emission efficiency according to the principle of constructive interference. Accordingly, the light extraction efficiency of the light-emitting device 10 may be increased, so that the emission efficiency of the light-emitting device 10 may be improved.

The first capping layer and second capping layer may each include a material having a refractive index equal to or greater than about 1.6 (with respect to a wavelength of about 589 nm).

The first capping layer and the second capping layer may each independently be an organic capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may be optionally substituted with a substituent containing O, N, S, Se, Si, F, Cl, Br, I, or any combination thereof.

In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In an embodiment, at least one of the first capping layer and the second capping layer may each independently include one of Compounds HT28 to HT33, one of Compounds CP1 to CP6, β-NPB, or any combination thereof:

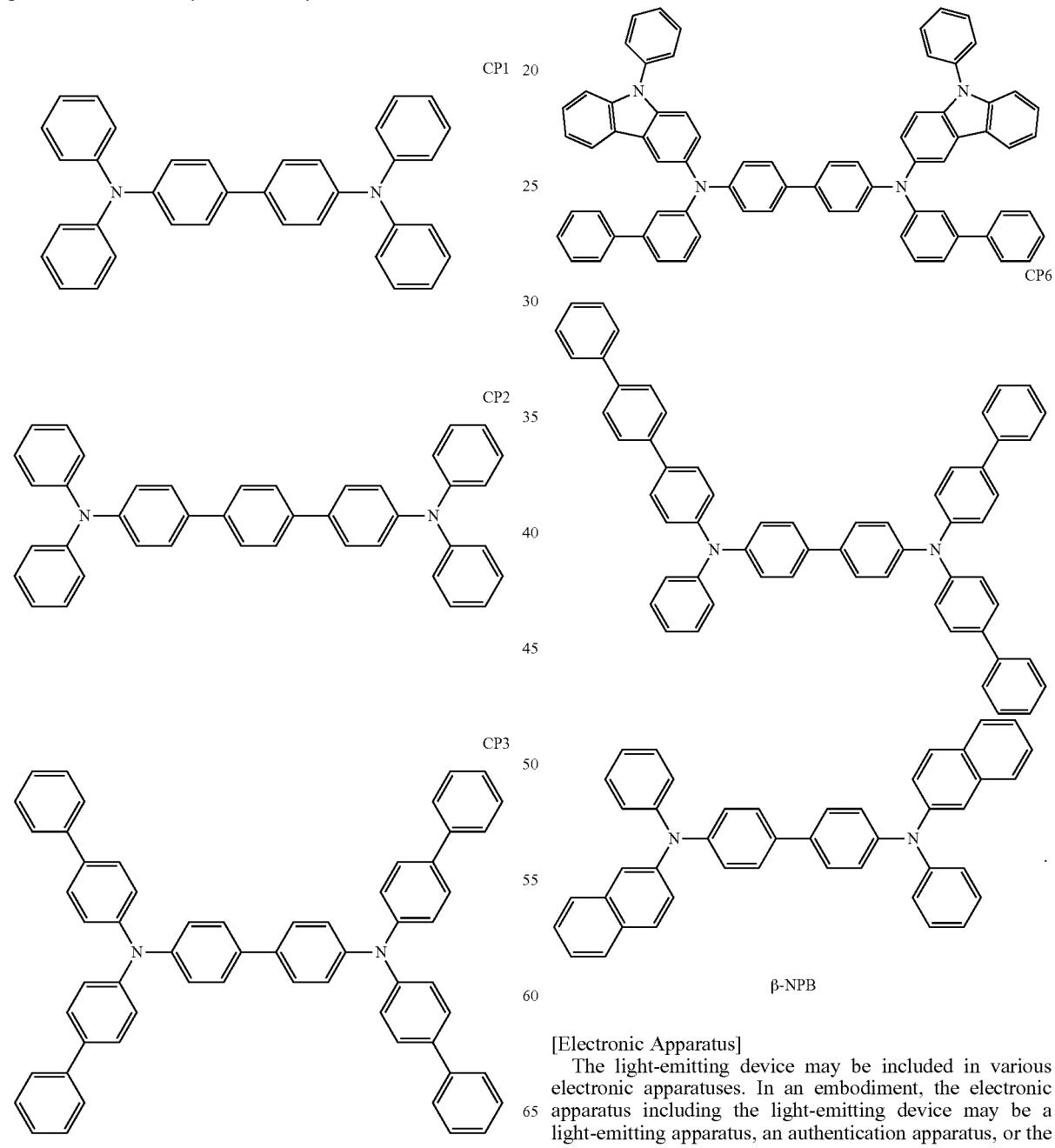

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, a light-emitting apparatus) may further include, in addition to the light-emitting device, a color filter, a color conversion layer, or a color filter and a color conversion layer. The color filter and/or the color conversion layer may be located in at least one traveling direction of light emitted from the light-emitting device. In an embodiment, the light emitted from the light-emitting device may be blue light. The light-emitting device may be the same as described above. In an embodiment, the color conversion layer may include quantum dots. The quantum dot may be, for example, a quantum dot as described herein.

The electronic apparatus may include a first substrate. The first substrate may include subpixels, the color filter may include color filter areas respectively corresponding to the subpixels, and the color conversion layer may include color conversion areas respectively corresponding to the subpixels.

A pixel-defining film may be located between the subpixels to define each subpixel.

The color filter may further include color filter areas and light-shielding patterns located between the color filter areas, and the color conversion layer may include color conversion areas and light-shielding patterns located between the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. For example, the first area may include a red quantum dot, the second area may include a green quantum dot, and the third area may not include a quantum dot. The quantum dot may be the same as described in the specification. The first area, the second area, and/or the third area may each further include a scatterer.

In an embodiment, the light-emitting device may emit first light, the first area may absorb the first light to emit first first-color light, the second area may absorb the first light to emit second first-color light, and the third area may absorb the first light to emit third first-color light. The first first-color light, the second first-color light, and the third first-color light may have different maximum emission wavelengths from one another. For example, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein at least one of the source electrode and the drain electrode may be electrically connected to the first electrode or the second electrode of the light-emitting device.

The thin-film transistor may further include a gate electrode, a gate insulating film, etc.

The active layer may include crystalline silicon, amorphous silicon, organic semiconductor, oxide semiconductor, or the like.

The electronic apparatus may further include a sealing portion for sealing the light-emitting device. The sealing portion may be located between the color filter and/or the color conversion layer and the light-emitting device. The sealing portion may allow light from the light-emitting device to be extracted to the outside, and may simultaneously prevent ambient air and moisture from penetrating into the light-emitting device. The sealing portion may be a sealing substrate including a transparent glass substrate or a plastic substrate. The sealing portion may be a thin-film encapsulation layer including an organic layer and/or an inorganic layer. When the sealing portion is a thin film encapsulation layer, the electronic apparatus may be flexible.

Various functional layers may be further included on the sealing portion, in addition to the color filter and/or the color conversion layer, according to the use of the electronic apparatus. The functional layers may include a touch screen layer, a polarizing layer, an authentication apparatus, and the like. The touch screen layer may be a pressure-sensitive touch screen layer, a capacitive touch screen layer, or an infrared touch screen layer. The authentication apparatus may be, for example, a biometric authentication apparatus that authenticates an individual by using biometric information of a living body (for example, fingertips, pupils, etc.).

The authentication apparatus may further include, in addition to the light-emitting device, a biometric information collector.

The electronic apparatus may be applied to various displays, such as light sources, lighting, personal computers (for example, a mobile personal computer), mobile phones, digital cameras, electronic diaries, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
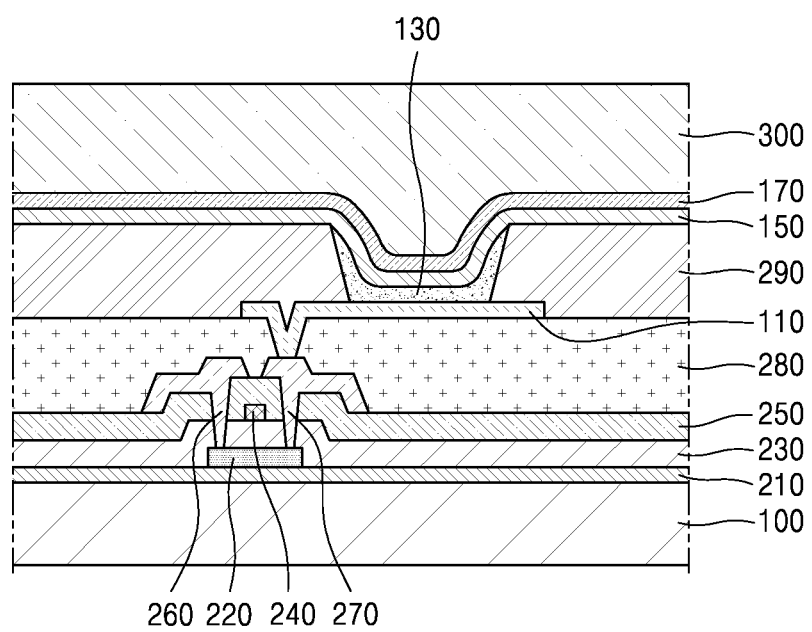
FIG. 2 is a schematic cross-sectional view of an electronic apparatus according to an embodiment.
Figure 3:
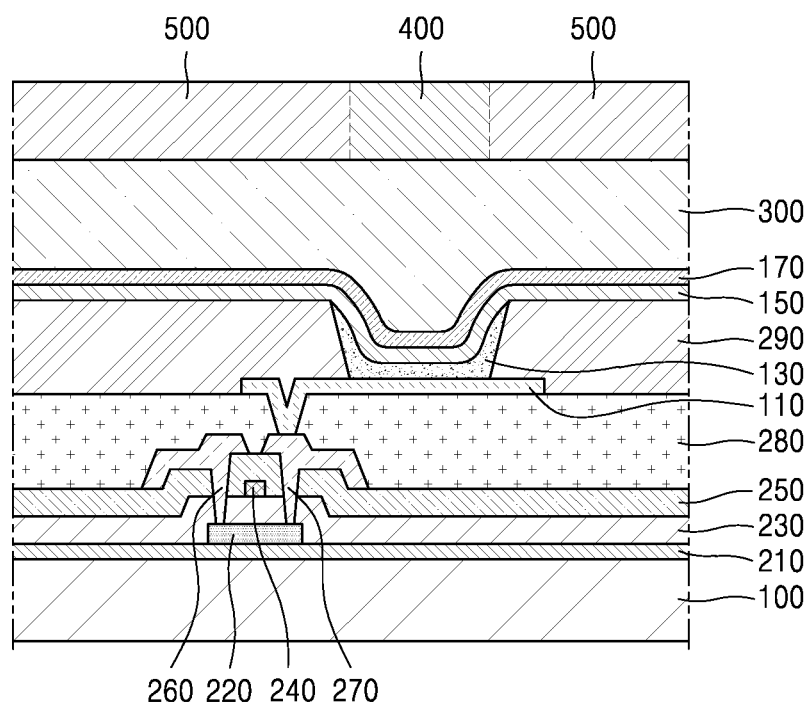
FIG. 3 is a schematic cross-sectional view of an electronic apparatus according to another embodiment.

[Description of FIGS. 2 and 3]

FIG. 2 is a schematic cross-sectional view of an electronic apparatus according to an embodiment.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may respectively contact the exposed portions of the source region and the drain region of the active layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 may not completely cover the drain electrode 270 and may expose a portion of the drain electrode 270, and the first electrode 110 may be electrically connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may include a polyimide or polyacrylic organic film. Although not shown in FIG. 2, at least some layers of the interlayer 130 may extend beyond the upper portion of the pixel defining layer 290 and may thus be provided in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, or the like), an epoxy-based resin (for example, aliphatic glycidyl ether (AGE), or the like), or a combination thereof; or a combination of the inorganic film and the organic film.

FIG. 3 is a schematic cross-sectional view of an electronic apparatus according to another embodiment.

The electronic apparatus of FIG. 3 may differ from the electronic apparatus of FIG. 2, at least in that a light-shielding pattern 500 and a functional region 400 are further included on the encapsulation portion 300. The functional region 400 may be a color filter area, a color conversion area, or a combination of the color filter area and the color conversion area. In an embodiment, the light-emitting device included in the electronic apparatus of FIG. 3 may be a tandem light-emitting device.

[Manufacture Method]

Respective layers included in the hole transport region, the emission layer, and respective layers included in the electron transport region may be formed in a specific region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, an emission layer, and layers constituting the electron transport region are formed by spin coating, the spin coating may be performed at a coating speed of about 2,000 rpm to about 5,000 rpm and at a heat treatment temperature of about 80° C. to 200° C. in consideration of a material to be included in a layer to be formed and the structure of a layer to be formed.

Definitions of Terms

The term "$C_3$-$C_{60}$ carbocyclic group" as used herein may be a cyclic group consisting of carbon atoms as the only ring-forming atoms and having three to sixty carbon atoms, and the term "$C_1$-$C_{60}$ heterocyclic group" as used herein may be a cyclic group that has one to sixty carbon atoms as ring-forming atoms and further includes, in addition to carbon, at least one heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group may have 3 to 61 ring-forming atoms.

The term "cyclic group" as used herein may include the $C_3$-$C_{60}$ carbocyclic group or the $C_1$-$C_{60}$ heterocyclic group.

The term "π electron-rich $C_3$-$C_{60}$ cyclic group" as used herein may be a cyclic group that has three to sixty carbon atoms and may not include *—N=*' as a ring-forming moiety, and the term "π electron-deficient nitrogen-containing $C_1$-$C_{60}$ cyclic group" as used herein may be a heterocyclic group that has one to sixty carbon atoms and may include *—N=*' as a ring-forming moiety.

In embodiments, the $C_3$-$C_{60}$ carbocyclic group may be a T1 group or a condensed cyclic group in which two or more T1 groups are condensed with each other (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be a T2 group, a condensed cyclic group in which two or more T2 groups are condensed with each other, or a condensed cyclic group in which at least one T2 group and at least one T1 group are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be a T1 group, a condensed cyclic group in which two or more T1 groups are condensed with each other, a T3 group, a condensed cyclic group in which two or more T3 groups are condensed with each other, or a condensed cyclic group in which at least one T3 group and at least one T1 group are condensed with each other (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), and the π electron-deficient nitrogen-containing $C_1$-$C_{60}$ cyclic group may be a T4 group, a condensed cyclic group in which two or more T4 groups are condensed with each other, a condensed cyclic group in which at least one T4 group and at least one T1 group are condensed with each other, a condensed cyclic group in which at least one T4 group and at least one T3 group are condensed with each other, or a condensed cyclic group in which at least one T4 group, at least one T1 group, and at least one T3 group are condensed with one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each be a group condensed to any cyclic group or a polyvalent group (for example, a divalent group, a trivalent group, a tetravalent group, etc.), depending on the structure of a formula with which the terms are used. For example, a "benzene group" may be a benzo group, a phenyl group, a phenylene group, or the like, which may be readily understood by one of ordinary skill in the art according to the structure of a formula including the "benzene group."

Examples of a monovalent $C_3$-$C_{60}$ carbocyclic group and a monovalent $C_1$-$C_{60}$ heterocyclic group may include a $C_3$-$C_{10}$ cycloalkyl group, a $C_1$-$C_{10}$ Cheterocycloalkyl group, a $C_3$-$C_{10}$ cycloalkenyl group, a $C_1$-$C_{10}$ Cheterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group. Examples of a divalent $C_3$-$C_{60}$ carbocyclic group and a divalent $C_1$-$C_{60}$ heterocyclic group may include a $C_3$-$C_{10}$ cycloalkylene group, a $C_1$-$C_{10}$ Cheterocycloalkylene group, a $C_3$-$C_{10}$ cycloalkenylene group, a $C_1$-$C_{10}$ Cheterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein may be a linear or branched aliphatic hydrocarbon monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein may be a divalent group having a same structure as the $C_1$-$C_{60}$ alkyl group.

The term "$C_2$-$C_{60}$ alkenyl group" as used herein may be a monovalent hydrocarbon group having at least one carbon-carbon double bond in the middle or at a terminus of a $C_2$-$C_{60}$ alkyl group, and examples thereof may include an ethenyl group, a propenyl group, and a butenyl group. The term "$C_2$-$C_{60}$ alkenylene group" as used herein may be a divalent group having a same structure as the $C_2$-$C_{60}$ alkenyl group.

The term "$C_2$-$C_{60}$ alkynyl group" as used herein may be a monovalent hydrocarbon group having at least one carbon-carbon triple bond in the middle or at a terminus of a $C_2$-$C_{60}$ alkyl group, and examples thereof may include an ethynyl group and a propynyl group. The term "$C_2$-$C_{60}$ alkynylene group" as used herein may be a divalent group having a same structure as the $C_2$-$C_{60}$ alkynyl group.

The term "$C_1$-$C_{60}$ alkoxy group" as used herein may be a monovalent group represented by —O($A_{101}$) (wherein $A_{101}$ is a $C_1$-$C_{60}$ alkyl group), and examples thereof may include a methoxy group, an ethoxy group, and an isopropyloxy group.

The term "$C_3$-$C_{10}$ cycloalkyl group" as used herein may be a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein may be a divalent group having a same structure as the $C_3$-$C_{10}$ cycloalkyl group.

The term "$C_1$-$C_{10}$ heterocycloalkyl group" as used herein may be a monovalent cyclic group that further includes, in addition to a carbon atom, at least one heteroatom as a ring-forming atom and has 1 to 10 carbon atoms, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein may be a divalent group having a same structure as the $C_1$-$C_{10}$ heterocycloalkyl group.

The term "$C_3$-$C_{10}$ cycloalkenyl group" used herein may be a monovalent cyclic group that has three to ten carbon atoms and at least one carbon-carbon double bond in the cyclic structure thereof and no aromaticity, and examples thereof may include a cyclopentenyl group, a cyclohexenyl group, and a cycloheptenyl group. The term "$C_3$-$C_{10}$ cycloalkenylene group" as used herein may be a divalent group having a same structure as the $C_3$-$C_{10}$ cycloalkenyl group.

The term "$C_1$-$C_{10}$ heterocycloalkenyl group" as used herein may be a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein may be a divalent group having a same structure as the $C_1$-$C_{10}$ heterocycloalkenyl group.

The term "$C_6$-$C_{60}$ aryl group" as used herein may be a monovalent group having a carbocyclic aromatic system having six to sixty carbon atoms, and the term "$C_6$-$C_{60}$ arylene group" as used herein may be a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with each other.

The term "$C_1$-$C_{60}$ heteroaryl group" as used herein may be a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein may be a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with each other.

The term "monovalent non-aromatic condensed polycyclic group" as used herein may be a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein may be a divalent group having a same structure as a monovalent non-aromatic condensed polycyclic group.

The term "monovalent non-aromatic condensed heteropolycyclic group" as used herein may be a monovalent group having two or more rings condensed to each other, at least one heteroatom in addition to carbon atoms (for example, having 1 to 60 carbon atoms) as a ring-forming atom, and non-aromaticity in its molecular structure when considered as a whole. Examples of the monovalent non-aromatic condensed heteropolycyclic group may include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indeno carbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphtho silolyl group, a benzofurodibenzofuranyl group, a benzofurodibenzothiophenyl group, and a benzothienodibenzothiophenyl group. The term "divalent non-aromatic condensed heteropolycyclic group" as used herein may be a divalent group having a same structure as a monovalent non-aromatic condensed heteropolycyclic group.

The term "$C_6$-$C_{60}$ aryloxy group" as used herein may be represented by —O($A_{102}$) (wherein $A_{102}$ is a $C_6$-$C_{60}$ aryl group), and the term "$C_6$-$C_{60}$ arylthio group" as used herein may be represented by —S($A_{103}$) (wherein $A_{103}$ is a $C_6$-$C_{60}$ aryl group).

The term "$C_7$-$C_{60}$ arylalkyl group" as used herein may be represented by -($A_{104}$)($A_{105}$) (wherein $A_{104}$ may be a $C_1$-$C_{54}$ alkylene group, and $A_{105}$ may be a $C_6$-$C_{59}$ aryl group), and the term "$C_2$-$C_{60}$ heteroaryl alkyl group" as used herein may be represented by -($A_{106}$)($A_{107}$) (wherein $A_{106}$ may be a $C_1$-$C_{59}$ alkylene group, and $A_{107}$ may be a $C_1$-$C_{59}$ heteroaryl group).

The substituent $R_{10a}$ as used herein may be:
deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroarylalkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each substituted with deuterium, —F, a cyano group, a $C_1$-$C_{60}$ alkyl group, a $C_1$-$C_{60}$ alkoxy group, a phenyl group, a biphenyl group, or any combination thereof.

The term "heteroatom" as used herein may be any atom other than a carbon atom or a hydrogen atom. Examples of the heteroatom may include O, S, N, P, Si, B, Ge, Se, or any combination thereof.

The term "third-row transition metal" as used herein may be hafnium (Hf), tantalum (Ta), tungsten (W), rhenium (Re), osmium (Os), iridium (Ir), platinum (Pt), gold (Au), etc.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein may be a phenyl group substituted with a phenyl group. For example, the "biphenyl group" may be a substituted phenyl group having a $C_6$-$C_{60}$ aryl group as a substituent.

The term "terphenyl group" as used herein may be a phenyl group substituted with a biphenyl group. For example, the "terphenyl group" may be a substituted phenyl group having, as a substituent, a $C_6$-$C_{60}$ aryl group substituted with a $C_6$-$C_{60}$ aryl group.

The maximum number of carbon atoms in this substituent definition section is only presented as an example. For example, the maximum number of 60 carbon atoms in the $C_1$-$C_{60}$ alkyl group is only presented an example, and the definition of the alkyl group is equally applied to a $C_1$-$C_{20}$ alkyl group. The same applies to other cases.

The symbols * and *' as used herein, unless defined otherwise, each refer to a binding site to a neighboring atom in a corresponding formula or moiety.

Hereinafter, a compound and light-emitting device according to embodiments will be described in detail with reference to Examples.

EXAMPLES

Manufacture of Light-Emitting Device

Comparative Example 1

An ITO glass substrate (a product of Corning Inc.) was cut to a size of 50 millimeters (mm)×50 mm×0.5 mm, sonicated in isopropyl alcohol and pure water each for 10 minutes, and cleaned by irradiation of ultraviolet rays and exposure of ozone thereto for 10 minutes. The glass substrate was mounted to a vacuum-deposition apparatus.

TCTA was deposited on the ITO anode of the glass substrate to form a hole injection layer having a thickness of 40 Å, and NPB was deposited on the hole injection layer to form a hole transport layer having a thickness of 10 Å.

HTH-8 as a first hole transport compound and ETH-15 as a first electron transport compound, which were mixed in a weight ratio of 7:3, and BD3 as a third compound, were co-deposited (doping ratio of 10 wt %) on the hole transport layer to form an emission layer having a thickness of 400 Å.

ETH-9 was deposited on the emission layer to form a buffer layer having a thickness of 50 Å. ET-15 and LiQ were co-deposited on the buffer layer at a weight ratio of 5:5 to form an electron transport layer having a thickness of 310 Å.

Mg was deposited to form a cathode having a thickness of 800 Å, thereby completing the manufacture of a light-emitting device.

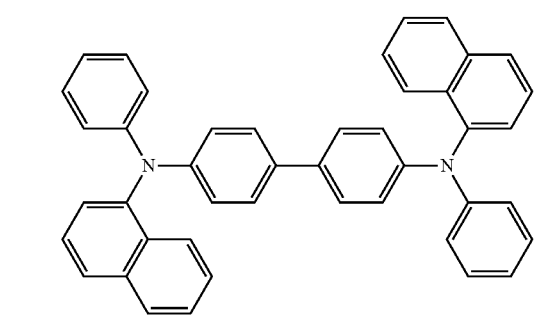

NPB

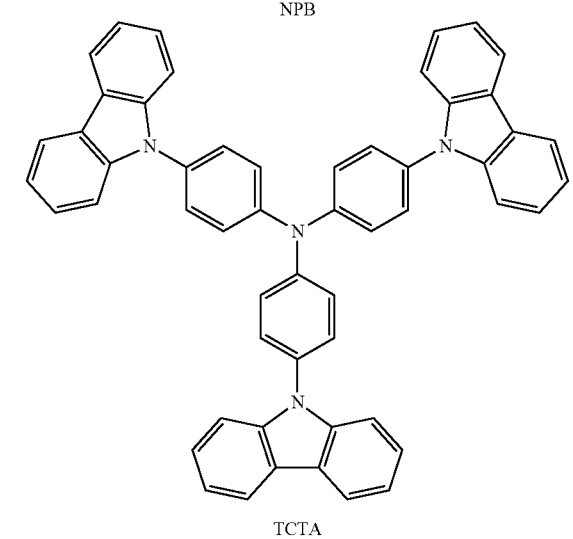

TCTA

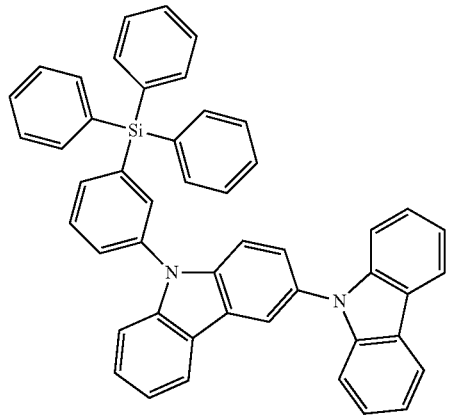

HTH-8

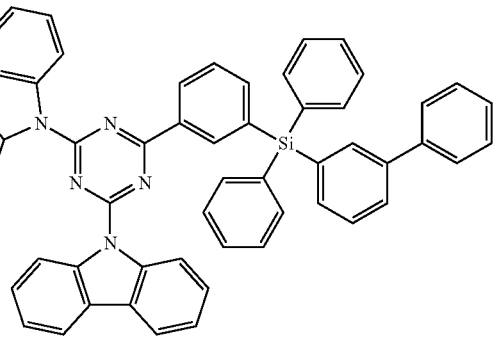

ETH-15

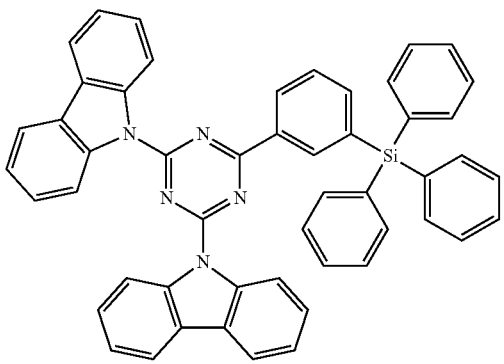

ETH-25

-continued

ETH-27

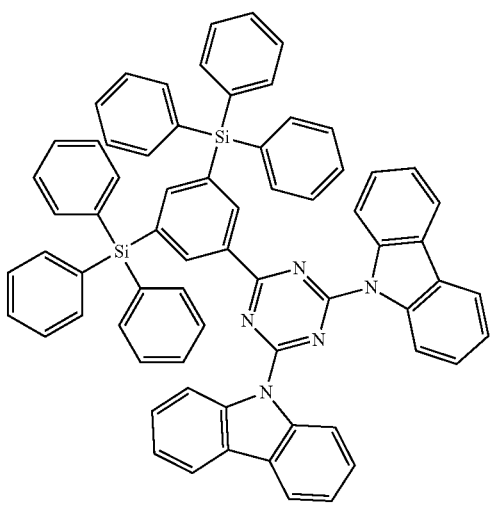

BD3

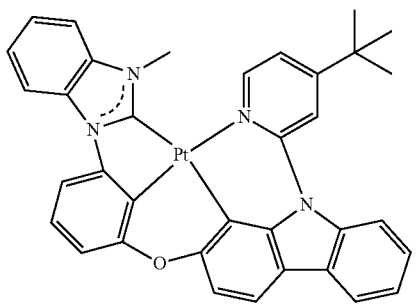

Example 1

A light-emitting device was manufactured in the same manner as in Comparative Example 1, except that, in forming the electron transport layer, ETH-15 was doped at 3 wt %.

Example 2

A light-emitting device was manufactured in the same manner as in Comparative Example 1, except that, in forming the electron transport layer, ETH-15 was doped at 5 wt %.

Example 3

A light-emitting device was manufactured in the same manner as in Comparative Example 1, except that, in forming the electron transport layer, ETH-15 was doped at 9 wt %.

Comparative Example 2

A light-emitting device was manufactured in the same manner as in Comparative Example 1, except that, in forming the electron transport layer, ETH-15 was doped at 25 wt %.

Comparative Example 3

A light-emitting device was manufactured in the same manner as in Comparative Example 1, except that, in forming the electron transport layer, ETH-15 was doped at 50 wt %.

Comparative Example 4

A light-emitting device was manufactured in the same manner as in Comparative Example 1, except that, in forming the emission layer, ETH-25 was used as the first electron transport compound instead of ETH-15.

Example 4

A light-emitting device was manufactured in the same manner as in Example 1, except that, in forming the emission layer, ETH-25 was used as the first electron transport compound instead of ETH-15.

Example 5

A light-emitting device was manufactured in the same manner as in Example 2, except that, in forming the emission layer, ETH-25 was used as the first electron transport compound instead of ETH-15.

Example 6

A light-emitting device was manufactured in the same manner as in Example 3, except that, in forming the emission layer, ETH-25 was used as the first electron transport compound instead of ETH-15.

Comparative Example 5

A light-emitting device was manufactured in the same manner as in Comparative Example 2, except that, in forming the emission layer, ETH-25 was used as the first electron transport compound instead of ETH-15.

Comparative Example 6

A light-emitting device was manufactured in the same manner as in Comparative Example 3, except that, in forming the emission layer, ETH-25 was used as the first electron transport compound instead of ETH-15.

Comparative Example 7

A light-emitting device was manufactured in the same manner as in Comparative Example 1, except that, in forming the emission layer, ETH-27 was used as the first electron transport compound instead of ETH-15.

Example 7

A light-emitting device was manufactured in the same manner as in Example 1, except that, in forming the emission layer, ETH-27 was used as the first electron transport compound instead of ETH-15.

Example 8

A light-emitting device was manufactured in the same manner as in Example 2, except that, in forming the emission layer, ETH-27 was used as the first electron transport compound instead of ETH-15.

Example 9

A light-emitting device was manufactured in the same manner as in Example 3, except that, in forming the emission layer, ETH-27 was used as the first electron transport compound instead of ETH-15.

Comparative Example 8

A light-emitting device was manufactured in the same manner as in Comparative Example 2, except that, in forming the emission layer, ETH-27 was used as the first electron transport compound instead of ETH-15.

Comparative Example 9

A light-emitting device was manufactured in the same manner as in Comparative Example 3, except that, in forming the emission layer, ETH-27 was used as the first electron transport compound instead of ETH-15.

To evaluate the characteristics of the light-emitting devices manufactured according to Comparative Examples 1 to 9 and Examples 1 to 9, the driving voltage at a current density of 10 mA/cm$^2$, efficiency, and lifespan were measured. The results are shown in Table 1 (efficiencies are expressed as relative efficiencies).

The driving voltage and current density of the light-emitting devices were measured using a source meter (2400 series, Keithley Instruments Inc.), and the efficiency was measured using a measurement system of Hamamatsu Photonics Inc. (C9920-2-12)

TABLE 1

| | EML | | | | | | |
|---|---|---|---|---|---|---|---|
| | First hole transport compound | First electron transport compound | ETL doping compound | ETL doping concentration (wt %) | Driving voltage (V) | Relative efficiency (Cd/A/y) | Relative lifespan (T95) |
| Comparative Example 1 | HTH-8 | ETH-15 | ETH-15 | 0 | 4.8 | 80.4 | 60.7 |
| Example 1 | | | | 3 | 4.5 | 98.2 | 65.9 |
| Example 2 | | | | 5 | 4.5 | 94.3 | 64.8 |
| Example 3 | | | | 9 | 4.5 | 90.1 | 63.1 |
| Comparative Example 2 | | | | 25 | 4.7 | 80.4 | 50.8 |
| Comparative Example 3 | | | | 50 | 5.0 | 70.9 | 48.7 |
| Comparative Example 4 | | ETH-25 | | 0 | 4.6 | 84.6 | 78.7 |
| Example 4 | | | | 3 | 4.3 | 97.6 | 95.1 |
| Example 5 | | | | 5 | 4.3 | 90.2 | 84.8 |
| Example 6 | | | | 9 | 4.4 | 90.1 | 84.1 |
| Comparative Example 5 | | | | 25 | 4.7 | 88.4 | 75.3 |
| Comparative Example 6 | | | | 50 | 5.1 | 84.9 | 70.1 |
| Comparative Example 7 | | ETH-27 | | 0 | 4.6 | 84.8 | 85.6 |
| Example 7 | | | | 3 | 4.4 | 100.0 | 100.0 |
| Example 8 | | | | 5 | 4.4 | 94.2 | 88.6 |
| Example 9 | | | | 9 | 4.6 | 90.6 | 87.9 |
| Comparative Example 8 | | | | 25 | 5.0 | 82.7 | 75.3 |
| Comparative Example 9 | | | | 50 | 5.3 | 71.3 | 70.4 |

Referring to Table 1, it was confirmed that the light-emitting devices of Examples 1 to 9 had low driving voltage and showed improved results in terms of efficiency and lifespan, as compared to the light-emitting devices of Comparative Examples 1 to 9.

Comparative Example 10

A light-emitting device was manufactured in the same manner as in Comparative Example 1, except that the buffer layer was not formed.

Example 10

A light-emitting was manufactured in the same manner as in Example 1, except that the buffer layer was not formed, and ETH-25 was used as the electron transport layer doping compound instead of ETH15.

Example 11

A light-emitting was manufactured in the same manner as in Example 2, except that the buffer layer was not formed, and ETH-25 was used as the electron transport layer doping compound instead of ETH15.

Example 12

A light-emitting was manufactured in the same manner as in Example 3, except that the buffer layer was not formed, and ETH-25 was used as the electron transport layer doping compound instead of ETH15.

Comparative Example 11

A light-emitting was manufactured in the same manner as in Comparative Example 2, except that the buffer layer was not formed, and ETH-25 was used as the electron transport layer doping compound instead of ETH15.

Comparative Example 12

A light-emitting was manufactured in the same manner as in Comparative Example 3, except that the buffer layer was not formed, and ETH-25 was used as the electron transport layer doping compound instead of ETH15.

Comparative Example 13

A light-emitting device was manufactured in the same manner as in Comparative Example 4, except that the buffer layer was not formed.

Example 13

A light-emitting device was manufactured in the same manner as in Example 10, except that, in forming the emission layer, ETH-25 was used as the first electron transport compound instead of ETH-15.

Example 14

A light-emitting device was manufactured in the same manner as in Example 11, except that, in forming the emission layer, ETH-25 was used as the first electron transport compound instead of ETH-15.

Example 15

A light-emitting device was manufactured in the same manner as in Example 12, except that, in forming the emission layer, ETH-25 was used as the first electron transport compound instead of ETH-15.

Comparative Example 14

A light-emitting device was manufactured in the same manner as in Comparative Example 11, except that, in forming the emission layer, ETH-25 was used as the first electron transport compound instead of ETH-15.

Comparative Example 15

A light-emitting device was manufactured in the same manner as in Comparative Example 12, except that, in forming the emission layer, ETH-25 was used as the first electron transport compound instead of ETH-15.

Comparative Example 16

A light-emitting device was manufactured in the same manner as in Comparative Example 7, except that the buffer layer was not formed.

Example 16

A light-emitting device was manufactured in the same manner as in Example 10, except that, in forming the emission layer, ETH-27 was used as the first electron transport compound instead of ETH-15.

Example 17

A light-emitting device was manufactured in the same manner as in Example 11, except that, in forming the emission layer, ETH-27 was used as the first electron transport compound instead of ETH-15.

Example 18

A light-emitting device was manufactured in the same manner as in Example 12, except that, in forming the emission layer, ETH-27 was used as the first electron transport compound instead of ETH-15.

Comparative Example 17

A light-emitting device was manufactured in the same manner as in Comparative Example 11, except that, in forming the emission layer, ETH-27 was used as the first electron transport compound instead of ETH-15.

Comparative Example 18

A light-emitting device was manufactured in the same manner as in Comparative Example 12, except that, in forming the emission layer, ETH-27 was used as the first electron transport compound instead of ETH-15.

To evaluate the characteristics of the light-emitting devices manufactured according to Comparative Examples 10 to 18 and Examples 10 to 18, the driving voltage at a current density of 10 mA/cm$^2$, efficiency, and lifespan were measured. The results are shown in Table 2 (efficiencies are expressed as relative efficiencies).

TABLE 2

| | EML | | | | | | |
|---|---|---|---|---|---|---|---|
| | First hole transport compound | First electron transport compound | ETL doping compound | ETL doping concentration (wt %) | Driving voltage (V) | Relative efficiency (Cd/A/y) | Relative lifespan (T95) |
| Comparative Example 10 | HTH-8 | ETH-15 | ETH-25 | 0 | 4.8 | 80.4 | 60.7 |
| Example 10 | | | | 3 | 4.6 | 97.4 | 66.8 |
| Example 11 | | | | 5 | 4.5 | 95.6 | 64.9 |
| Example 12 | | | | 9 | 4.5 | 91.8 | 63.8 |
| Comparative Example 11 | | | | 25 | 4.6 | 81.4 | 50.6 |
| Comparative Example 12 | | | | 50 | 4.9 | 72.6 | 47.7 |
| Comparative Example 13 | | | ETH-25 | 0 | 4.6 | 84.6 | 78.7 |
| Example 13 | | | | 3 | 4.3 | 100.0 | 88.6 |
| Example 14 | | | | 5 | 4.4 | 95.9 | 87.2 |
| Example 15 | | | | 9 | 4.4 | 93.7 | 86.9 |
| Comparative Example 14 | | | | 25 | 4.7 | 88.4 | 77.2 |
| Comparative Example 15 | | | | 50 | 5.1 | 85.9 | 71.1 |
| Comparative Example 16 | | | ETH-27 | 0 | 4.6 | 84.8 | 85.6 |
| Example 16 | | | | 3 | 4.4 | 99.3 | 100.0 |
| Example 17 | | | | 5 | 4.5 | 94.1 | 89.6 |
| Example 18 | | | | 9 | 4.6 | 92.6 | 88.4 |
| Comparative Example 17 | | | | 25 | 5.0 | 87.5 | 77.2 |
| Comparative Example 18 | | | | 50 | 5.3 | 70.2 | 73.4 |

Referring to Table 2, it was confirmed that the light-emitting devices of Examples 10 to 18 had lower driving voltage and showed better results in terms of efficiency and lifespan than the light-emitting devices of Comparative Examples 10 to 18.

Comparative Example 19

A light-emitting device was manufactured in the same manner as in Comparative Example 1, except that, in forming the electron transport layer, ET-D2 was used instead of LiQ.

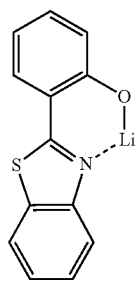

ET-D2

Example 19

A light-emitting device was manufactured in the same manner as in Example 1, except that, in forming the electron transport layer, ET-D2 was used instead of LiQ, and ETH-27 was used as the electron transport layer doping compound instead of ETH-15.

Example 20

A light-emitting device was manufactured in the same manner as in Example 2, except that, in forming the electron transport layer, ET-D2 was used instead of LiQ, and ETH-27 was used as the electron transport layer doping compound instead of ETH-15.

Example 21

A light-emitting device was manufactured in the same manner as in Example 3, except that, in forming the electron transport layer, ET-D2 was used instead of LiQ, and ETH-27 was used as the electron transport layer doping compound instead of ETH-15.

Comparative Example 20

A light-emitting device was manufactured in the same manner as in Comparative Example 2, except that, in forming the electron transport layer, ET-D2 was used instead of LiQ, and ETH-27 was used as the electron transport layer doping compound instead of ETH-15.

Comparative Example 21

A light-emitting device was manufactured in the same manner as in Comparative Example 3, except that, in forming the electron transport layer, ET-D2 was used instead of LiQ, and ETH-27 was used as the electron transport layer doping compound instead of ETH-15.

Comparative Example 22

A light-emitting device was manufactured in the same manner as in Comparative Example 4, except that, in forming the electron transport layer, ET-D2 was used instead of LiQ.

Example 22

A light-emitting device was manufactured in the same manner as in Example 19, except that, in forming the emission layer, ETH-25 was used as the first electron transport compound instead of ETH-15.

Example 23

A light-emitting device was manufactured in the same manner as in Example 20, except that, in forming the emission layer, ETH-25 was used as the first electron transport compound instead of ETH-15.

Example 24

A light-emitting device was manufactured in the same manner as in Example 21, except that, in forming the emission layer, ETH-25 was used as the first electron transport compound instead of ETH-15.

Comparative Example 23

A light-emitting device was manufactured in the same manner as in Comparative Example 20, except that, in forming the emission layer, ETH-25 was used as the first electron transport compound instead of ETH-15.

Comparative Example 24

A light-emitting device was manufactured in the same manner as in Comparative Example 21, except that, in forming the emission layer, ETH-25 was used as the first electron transport compound instead of ETH-15.

Comparative Example 25

A light-emitting device was manufactured in the same manner as in Comparative Example 7, except that, in forming the electron transport layer, ET-D2 was used instead of LiQ.

Example 25

A light-emitting device was manufactured in the same manner as in Example 19, except that, in forming the emission layer, ETH-27 was used as the first electron transport compound instead of ETH-15.

Example 26

A light-emitting device was manufactured in the same manner as in Example 20, except that, in forming the emission layer, ETH-27 was used as the first electron transport compound instead of ETH-15.

Example 27

A light-emitting device was manufactured in the same manner as in Example 21, except that, in forming the emission layer, ETH-27 was used as the first electron transport compound instead of ETH-15.

Comparative Example 26

A light-emitting device was manufactured in the same manner as in Comparative Example 20, except that, in forming the emission layer, ETH-27 was used as the first electron transport compound instead of ETH-15.

Comparative Example 27

A light-emitting device was manufactured in the same manner as in Comparative Example 21, except that, in forming the emission layer, ETH-27 was used as the first electron transport compound instead of ETH-15.

To evaluate the characteristics of the light-emitting devices manufactured according to Comparative Examples 19 to 27 and Examples 19 to 27, the driving voltage at a current density of 10 mA/cm$^2$, efficiency, and lifespan were measured. The results are shown in Table 3 (efficiencies are expressed as relative efficiencies).

TABLE 3

| | EML | | | | | | |
|---|---|---|---|---|---|---|---|
| | First hole transport compound | First electron transport compound | ETL doping compound | ETL doping concentration (wt %) | Driving voltage (V) | Relative efficiency (Cd/A/y) | Relative lifespan (T95) |
| Comparative Example 19 | HTH-8 | ETH-15 | ETH-27 | 0 | 4.8 | 80.4 | 60.7 |
| Example 19 | | | | 3 | 4.7 | 98.6 | 70.8 |
| Example 20 | | | | 5 | 4.5 | 92.4 | 74.5 |
| Example 21 | | | | 9 | 4.5 | 90.8 | 73.2 |
| Comparative Example 20 | | | | 25 | 4.7 | 80.3 | 62.4 |
| Comparative Example 21 | | | | 50 | 4.9 | 75.4 | 48.6 |
| Comparative Example 22 | | ETH-25 | | 0 | 4.6 | 84.6 | 78.7 |
| Example 22 | | | | 3 | 4.2 | 100.0 | 89.2 |
| Example 23 | | | | 5 | 4.4 | 98.2 | 86.7 |
| Example 24 | | | | 9 | 4.4 | 96.7 | 86.1 |
| Comparative Example 23 | | | | 25 | 4.7 | 84.7 | 70.1 |
| Comparative Example 24 | | | | 50 | 5.0 | 82.4 | 71.6 |
| Comparative Example 25 | | ETH-27 | | 0 | 4.6 | 84.8 | 85.6 |

TABLE 3-continued

| | EML | | | ETL doping concentration (wt %) | Driving voltage (V) | Relative efficiency (Cd/A/y) | Relative lifespan (T95) |
|---|---|---|---|---|---|---|---|
| | First hole transport compound | First electron transport compound | ETL doping compound | | | | |
| Example 25 | | | | 3 | 4.2 | 99.8 | 100.0 |
| Example 26 | | | | 5 | 4.5 | 97.6 | 99.6 |
| Example 27 | | | | 9 | 4.6 | 95.3 | 98.7 |
| Comparative Example 26 | | | | 25 | 5.0 | 80.4 | 92.1 |
| Comparative Example 27 | | | | 50 | 5.1 | 70.1 | 85.4 |

Referring to Table 3, it was confirmed that the light-emitting devices of Examples 19 to 27 had lower driving voltage and showed better results in terms of efficiency and lifespan than the light-emitting devices of Comparative Examples 19 to 27.

Comparative Examples 28 to 36

Light-emitting devices were manufactured in the same manner as in Example 25, except that compounds in Table 4 were used as the first hole transport compound, the first electron transport compound, and the electron transport layer doping compound (doping concentration of 3 wt %).

TABLE 4

| | EML | | | ETL doping concentration (wt %) | Driving voltage (V) | Relative efficiency (Cd/A/y) | Relative lifespan (T95) |
|---|---|---|---|---|---|---|---|
| | First hole transport compound | First electron transport compound | ETL doping compound | | | | |
| Example 25 | HTH-8 | ETH-27 | ETH-27 | 3 | 4.2 | 99.8 | 100.0 |
| Comparative Example 28 | RH1 | RE1 | RE1 | | 5.2 | 64.1 | 60.4 |
| Comparative Example 29 | | RE2 | | | 5.3 | 65.9 | 45.7 |
| Comparative Example 30 | | RE3 | | | 5.3 | 62.6 | 39.5 |
| Comparative Example 31 | | RE1 | RE2 | | 5.2 | 52.8 | 55.7 |
| Comparative Example 32 | | RE2 | | | 5.3 | 51.3 | 41.3 |
| Comparative Example 33 | | RE3 | | | 5.3 | 57.3 | 34.3 |
| Comparative Example 34 | | RE1 | RE3 | | 5.5 | 51.7 | 53.2 |
| Comparative Example 35 | | RE2 | | | 5.5 | 50.4 | 54.1 |
| Comparative Example 36 | | RE3 | | | 5.5 | 50.6 | 52.9 |

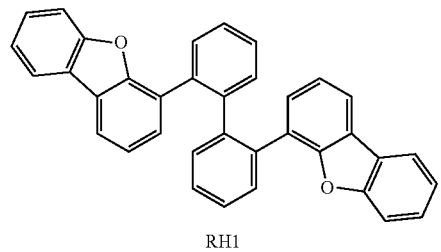

RH1

TABLE 4-continued

| | EML | | | | | | |
|---|---|---|---|---|---|---|---|
| | | First electron | ETL | ETL doping | Driving | Relative | Relative |
| | First hole transport compound | transport compound | doping compound | concentration (wt %) | voltage (V) | efficiency (Cd/A/y) | lifespan (T95) |

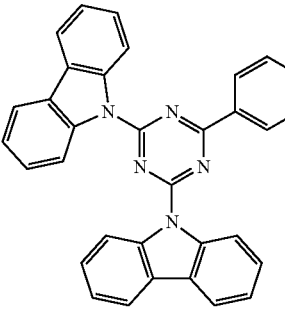

RE1

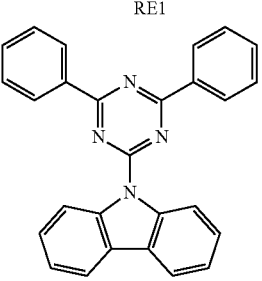

RE2

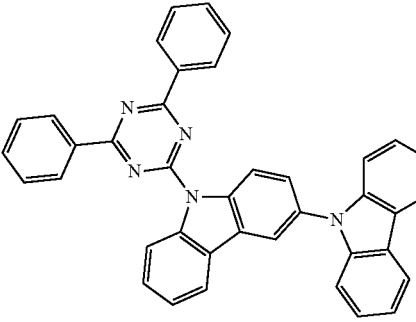

RE3

Referring to Table 4, the driving voltage, efficiency, and lifespan of the light-emitting device of Example 25, in which the electron transport layer was doped with Compound ETH-27 having a bulky Si moiety, were better than the driving voltage, efficiency, and lifespan of the light-emitting devices of Comparative Examples 28 to 36, in which the electron transport layer was doped with Compounds RE1, RE2, and RE3 having no bulky Si moiety.

These results were obtained because Compound ETH-27 having a bulky Si moiety effectively inhibited π-π stacking in the electron transport layer, thereby allowing charge balance in the emission layer to be secured and inducing exciton confinement to the center of a light-emitting zone.

A light-emitting device according to an embodiment exhibits improved results in terms of driving voltage, efficiency, and lifespan, as compared with devices in the related art.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting device comprising: a first electrode; a second electrode facing the first electrode; and an interlayer disposed between the first electrode and the second electrode, wherein the interlayer comprises: an emission layer; and a layer, the emission layer comprises: a first hole transport compound; a first electron transport compound; and a third compound, and the layer comprises: the first electron transport compound; a metal-containing material; and a second electron transport compound, and the layer is disposed between the emission layer and the second electrode, wherein the first hole transport compound comprises a carbazole moiety and comprises neither a triazine moiety, a pyrimidine moiety, nor a pyridine moiety, the first electron transport compound comprises a Si moiety and comprises a triazine moiety, a pyrimidine moiety, or a pyridine moiety, and the second electron transport compound comprises a triazine moiety.

2. The light-emitting device of claim 1, wherein
the layer is doped with the first electron transport compound, and
the layer has a doping concentration greater than 0 wt % and equal to or less than about 20 wt %.

3. The light-emitting device of claim 1, wherein the layer and the emission layer contact each other.

4. The light-emitting device of claim 1, further comprising a buffer layer disposed between the emission layer and the layer.

5. The light-emitting device of claim 4, wherein the buffer layer contacts the emission layer and the layer.

6. The light-emitting device of claim 1, wherein the first hole transport compound is represented by Formula 1:

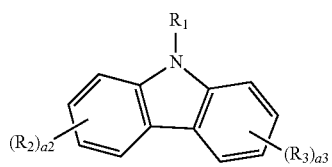

[Formula 1]

wherein in Formula 1,
$R_1$ to $R_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ Cheterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ Cheterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —Si($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), a triazine moiety, a pyrimidine moiety, and a pyridine moiety are excluded from $R_1$ to $R_3$, a2 and a3 are each independently an integer from 1 to 4, $R_{10a}$ is:

deuterium, —F, —Cl, —Br, —I, a hydroxyl group, a cyano group, or a nitro group;

a $C_1$-$C_6$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

7. The light-emitting device of claim 1, wherein the first hole transport compound is selected from Compounds HTH-1 to HTH-32:

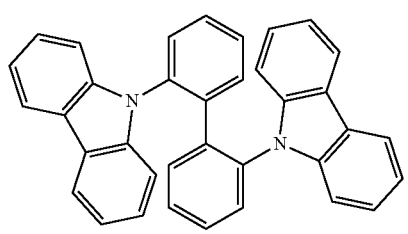

HTH-1

HTH-2
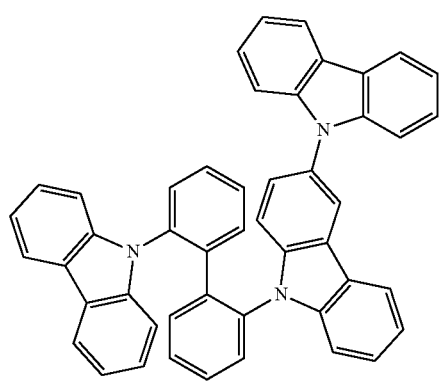
HTH-6
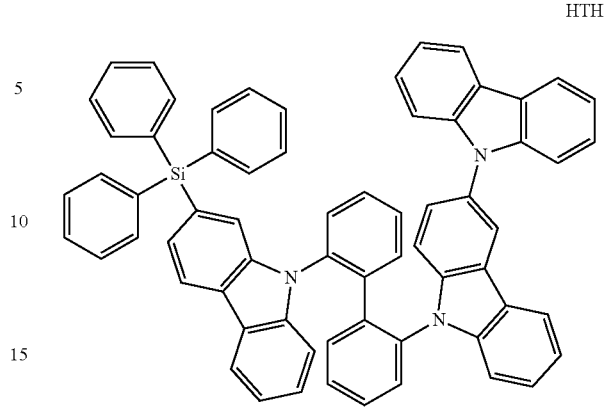
HTH-3
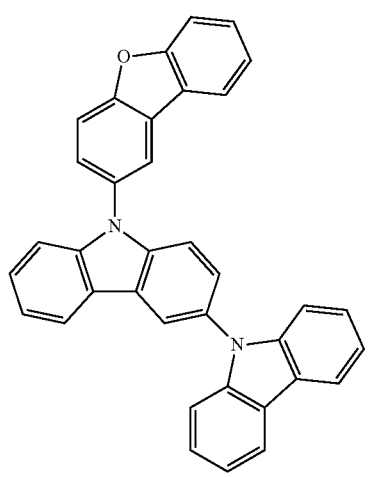
HTH-7
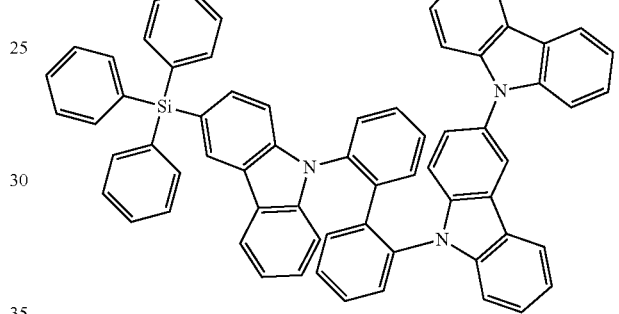
HTH-4
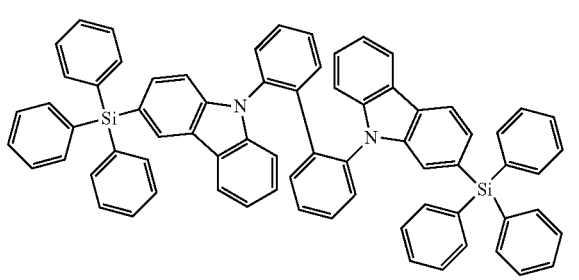
HTH-8
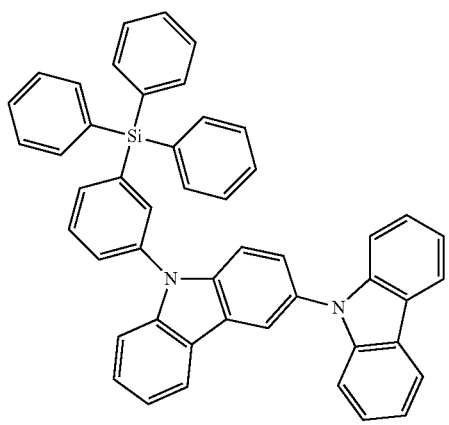
HTH-5
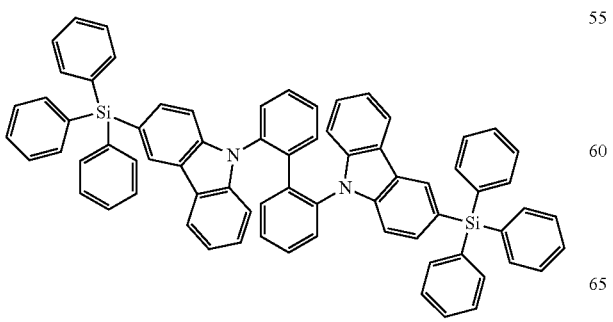
HTH-9
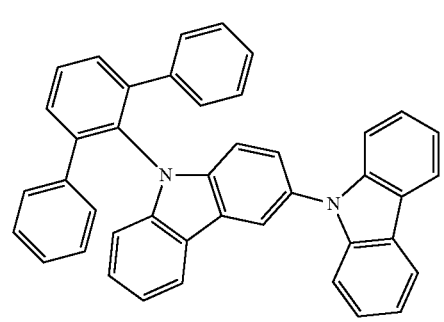

HTH-10
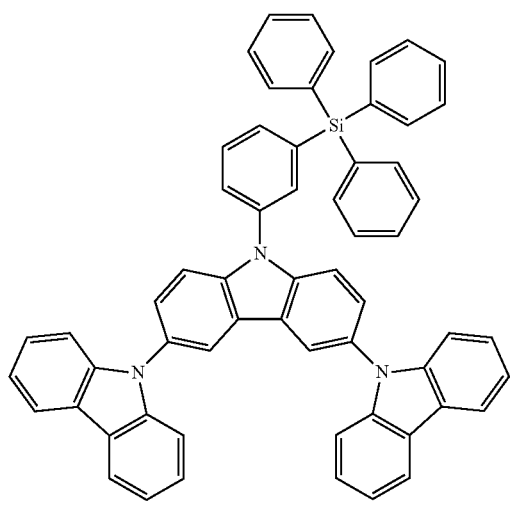
HTH-11
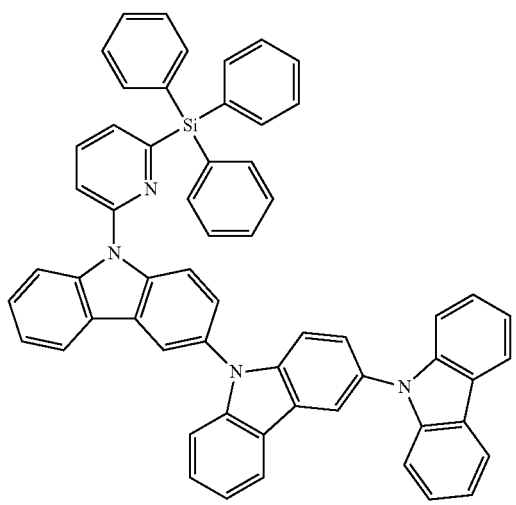
HTH-12
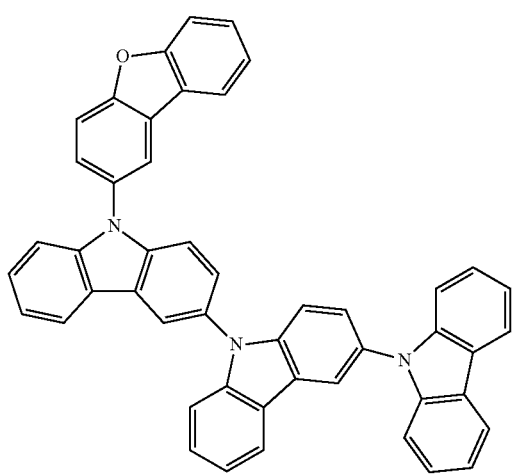
HTH-13
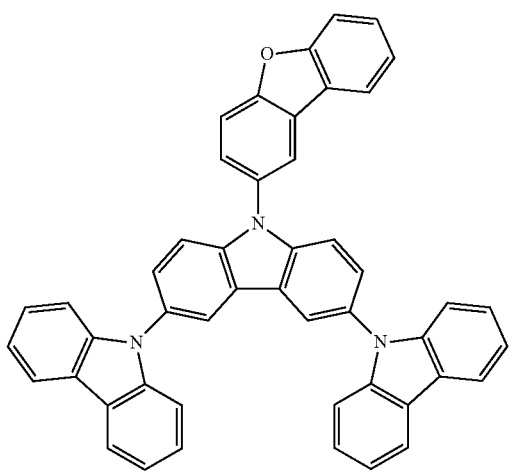
HTH-14
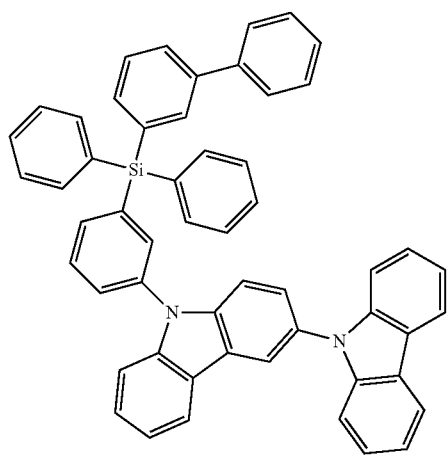
HTH-15
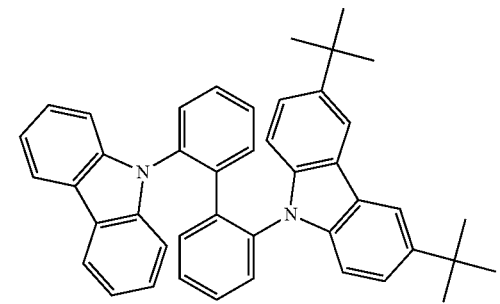

HTH-16
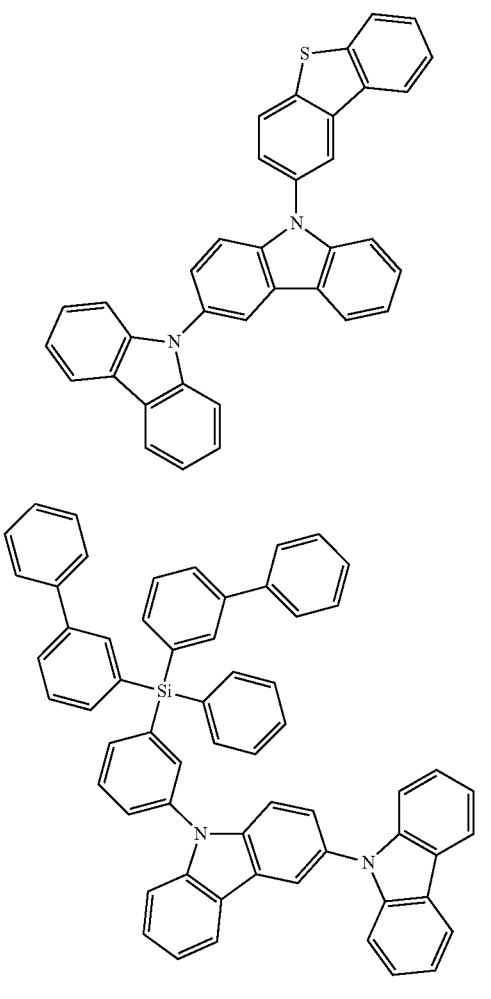
HTH-17
HTH-18
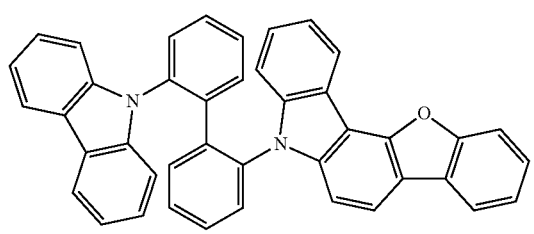
HTH-19
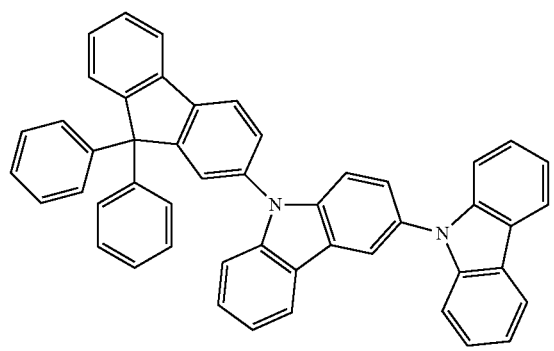
HTH-20
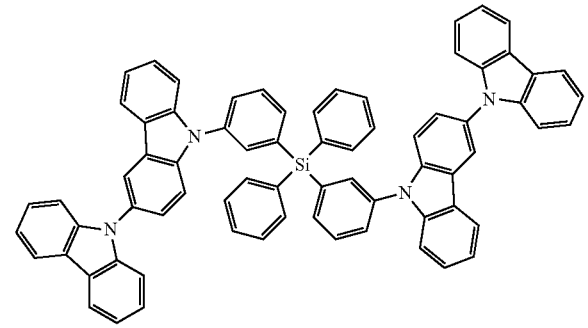
HTH-21
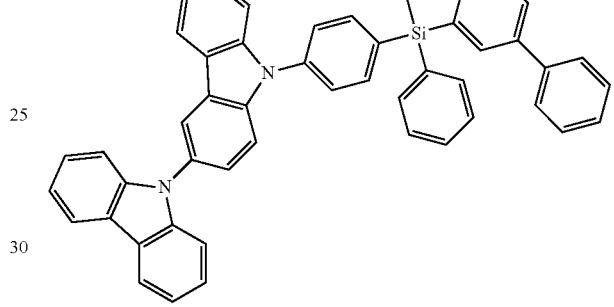
HTH-22
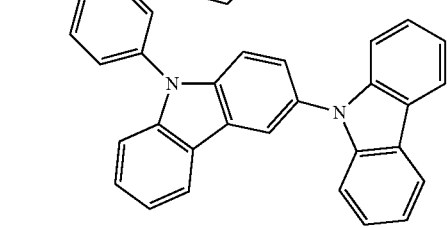
HTH-23
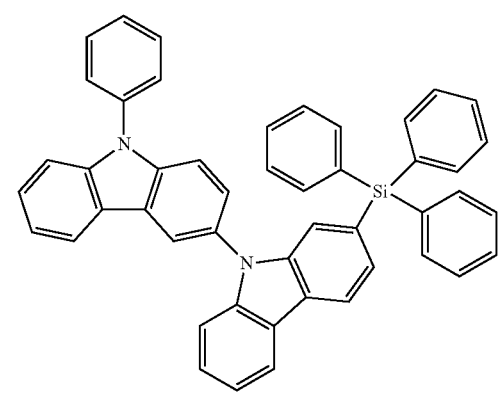

HTH-24
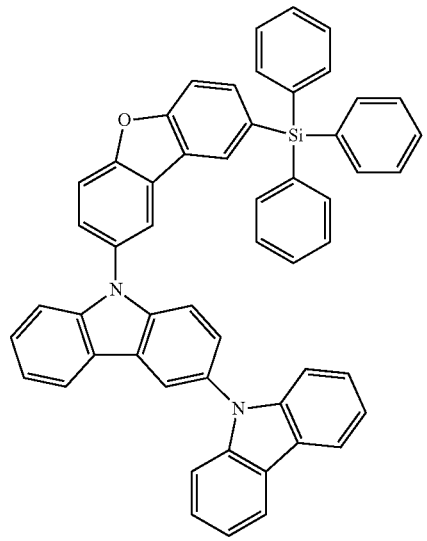
HTH-25
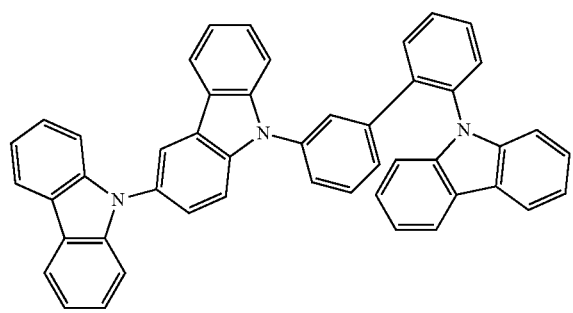
HTH-26
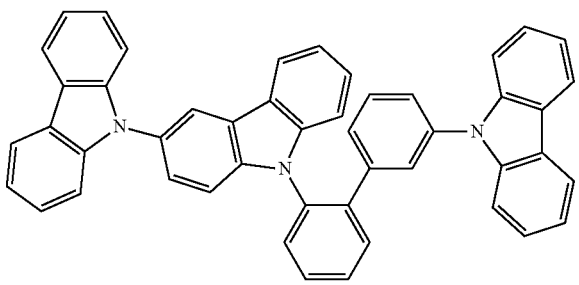
HTH-27
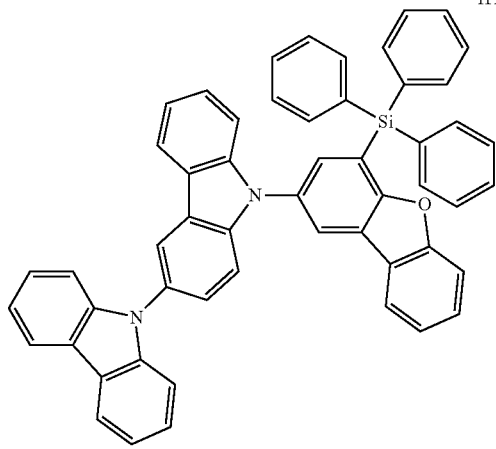
HTH-28
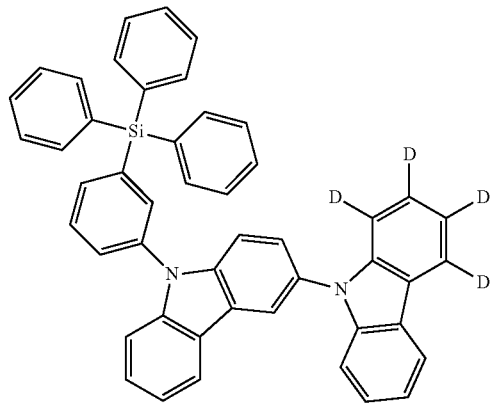
HTH-29
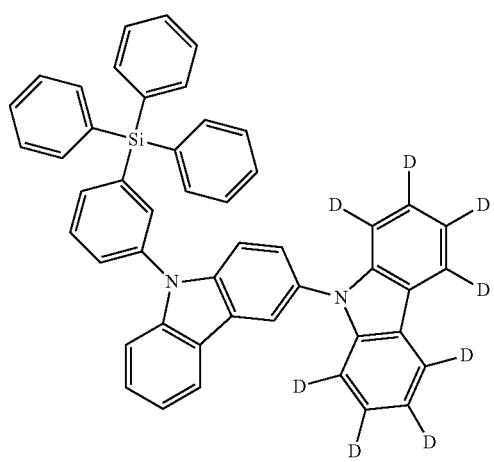
HTH-30
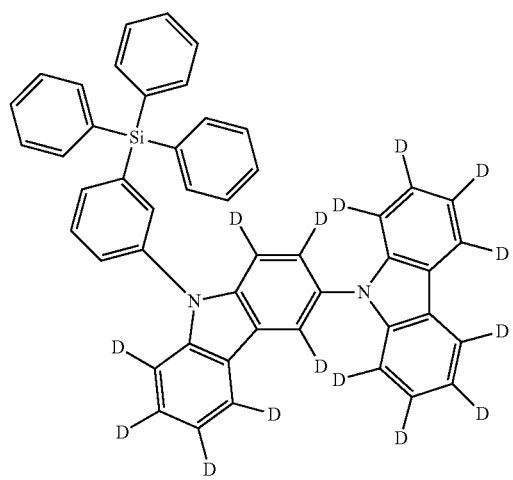

-continued

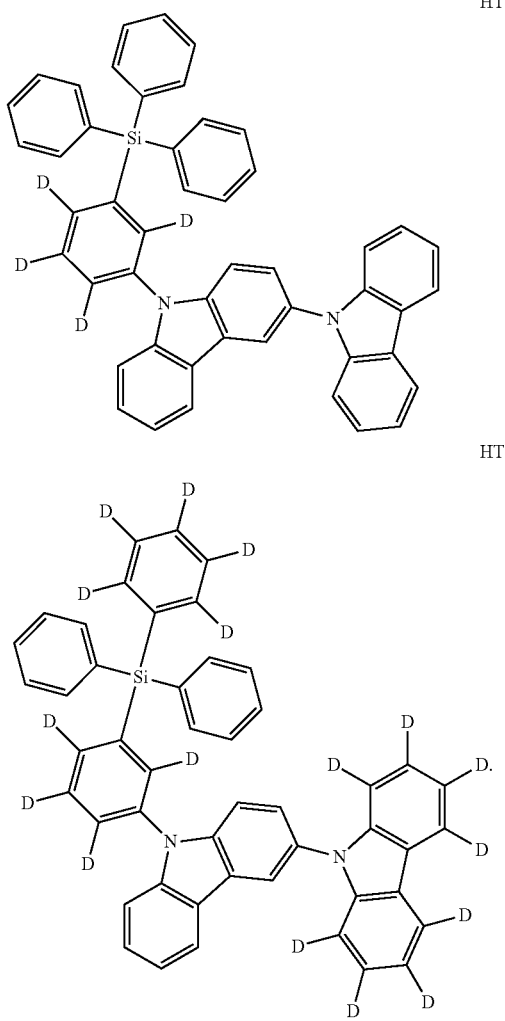

HTH-31

HTH-32

8. The light-emitting device of claim 1, wherein the first electron transport compound is represented by Formula 2:

[Formula 2]

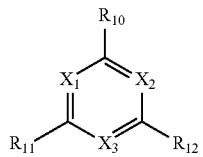

[Formula 2-1]

*—(L)$_l$—Si(R'$_1$R'$_2$R'$_3$)

wherein in Formula 2, $X_1$ to $X_3$ are each independently CH or N, at least one of $X_1$ to $X_3$ is N, $R_{10}$ to $R_{12}$ are each independently a group represented by Formula 2-1, hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{10}$ cycloalkyl group unsubstituted or substituted with at least one $R_{10a}$, a $C_1$-$C_{10}$ heterocycloalkyl group unsubstituted or substituted with at least one $R_{10a}$, a $C_3$-$C_{10}$ cycloalkenyl group unsubstituted or substituted with at least one $R_{10a}$, a $C_1$-$C_{10}$ heterocycloalkenyl group unsubstituted or substituted with at least one $R_{10a}$, a $C_6$-$C_{60}$ aryl group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, a $C_1$-$C_{60}$ heteroaryl group unsubstituted or substituted with at least one $R_{10a}$, a $C_1$-$C_{60}$ heteroaryloxy group unsubstituted or substituted with at least one $R_{10a}$, a $C_1$-$C_{60}$ heteroarylthio group unsubstituted or substituted with at least one $R_{10a}$, a monovalent non-aromatic condensed polycyclic group unsubstituted or substituted with at least one $R_{10a}$, a monovalent non-aromatic condensed heteropolycyclic group unsubstituted or substituted with at least one $R_{10a}$, —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), at least one of $R_{10}$ to $R_{12}$ is a group represented by Formula 2-1, $R'_1$ to $R'_3$ are each independently a branched $C_3$-$C_8$ alkyl group unsubstituted or substituted with at least one $R_{10a}$, a $C_3$-$C_{10}$ cycloalkyl group unsubstituted or substituted with at least one $R_{10a}$, or a $C_6$-$C_{16}$ aryl group unsubstituted or substituted with at least one $R_{10a}$, L is a $C_1$-$C_{20}$ alkylene group unsubstituted or substituted with at least one $R_{10a}$, a $C_1$-$C_{20}$ alkenylene group unsubstituted or substituted with at least one $R_{10a}$, a $C_1$-$C_{20}$ alkynylene group unsubstituted or substituted with at least one $R_{10a}$, a $C_3$-$C_{10}$ cycloalkylene group unsubstituted or substituted with at least one $R_{10a}$, a $C_1$-$C_{10}$ heterocycloalkylene group unsubstituted or substituted with at least one $R_{10a}$, a $C_3$-$C_{10}$ cycloalkenylene group unsubstituted or substituted with at least one $R_{10a}$, a $C_1$-$C_{10}$ heterocycloalkenylene group unsubstituted or substituted with at least one $R_{10a}$, a $C_6$-$C_{60}$ arylene group unsubstituted or substituted with at least one $R_{10a}$, a $C_1$-$C_{60}$ heteroarylene group unsubstituted or substituted with at least one $R_{10a}$, a divalent non-aromatic condensed polycyclic group unsubstituted or substituted with at least one $R_{10a}$, or a divalent non-aromatic condensed heteropolycyclic group unsubstituted or substituted with at least one $R_{10a}$, l is an integer from 0 to 3,

* indicates a binding site, $R_{10a}$ is:

deuterium, —F, —Cl, —Br, —I, a hydroxyl group, a cyano group, or a nitro group;

a $C_1$-$C_6$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), and $Q_1$ to $Q_3$, $Q_{11}$ to $Q_{13}$, $Q_{21}$ to $Q_{23}$, and $Q_{31}$ to $Q_{32}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

9. The light-emitting device of claim 8, further comprising a buffer layer disposed between the emission layer and the layer, wherein
the buffer layer comprises the first electron transport compound, and
the first electron transport compound is represented by Formula 2.

10. The light-emitting device of claim 1, wherein the first electron transport compound is selected from Compounds ETH-1 to ETH-44:

ETH-1

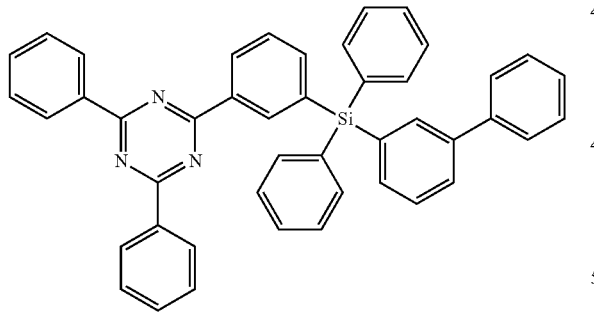

ETH-2

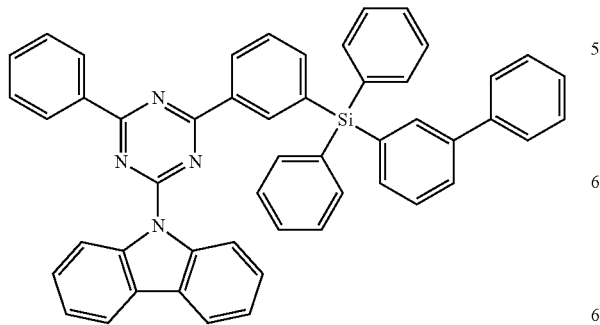

-continued

ETH-3

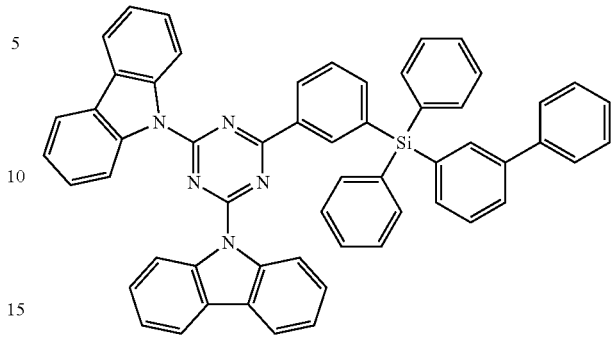

ETH-4

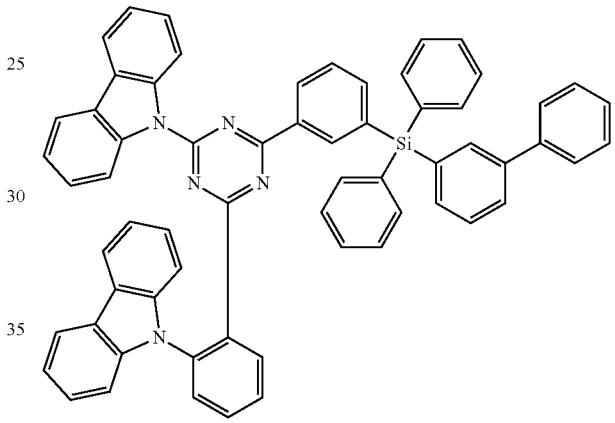

ETH-5

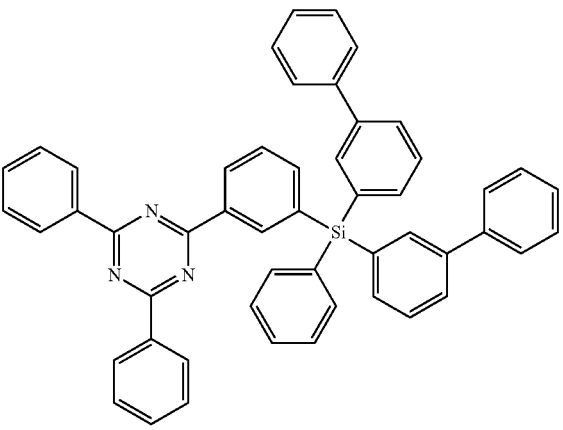

ETH-6
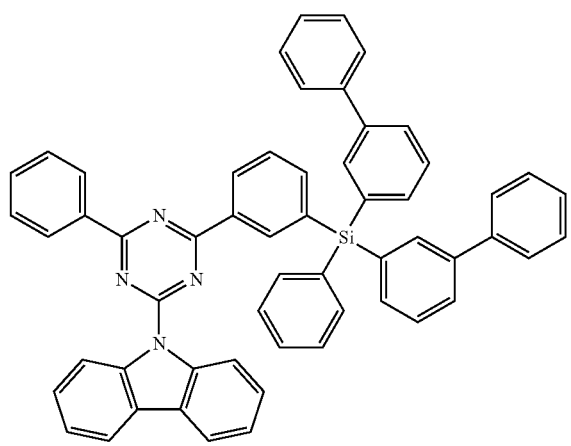
ETH-7
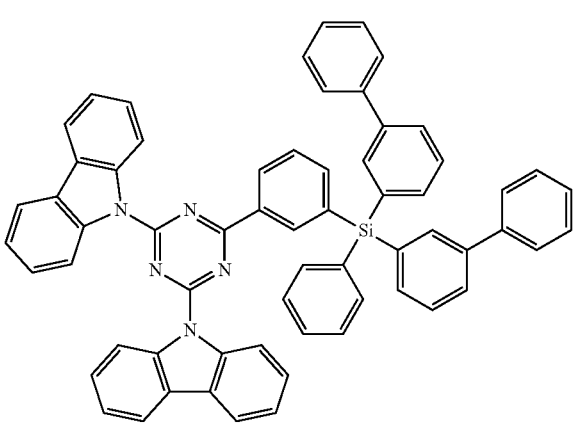
ETH-8
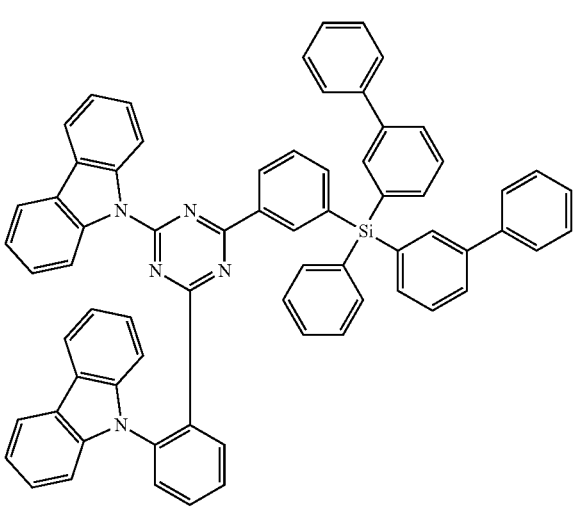
ETH-9
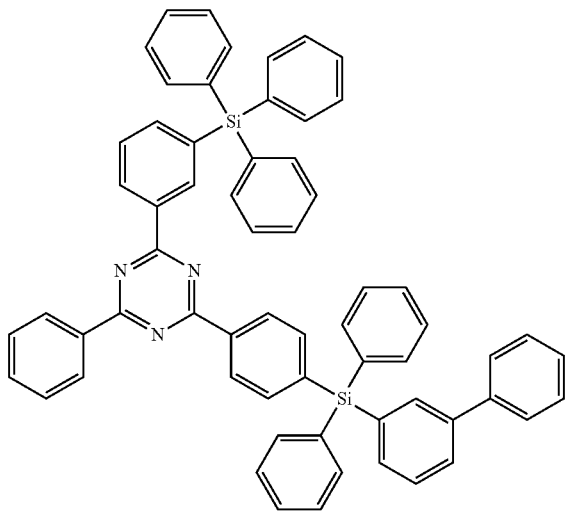
ETH-10
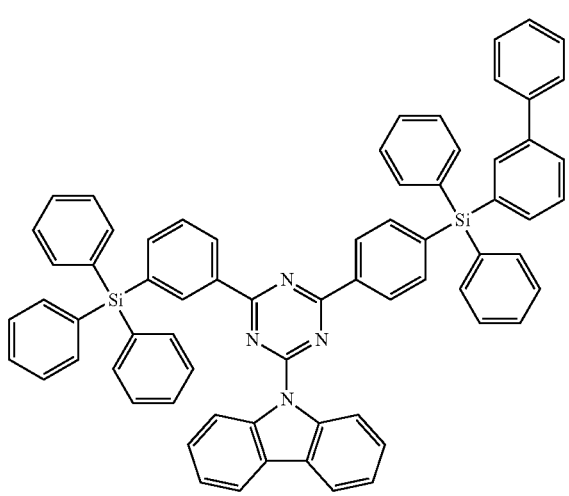
ETH-11
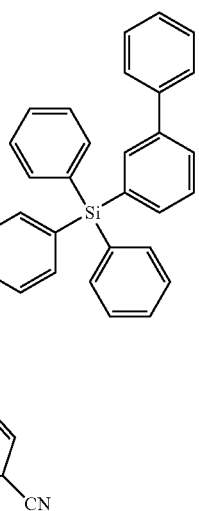

ETH-12
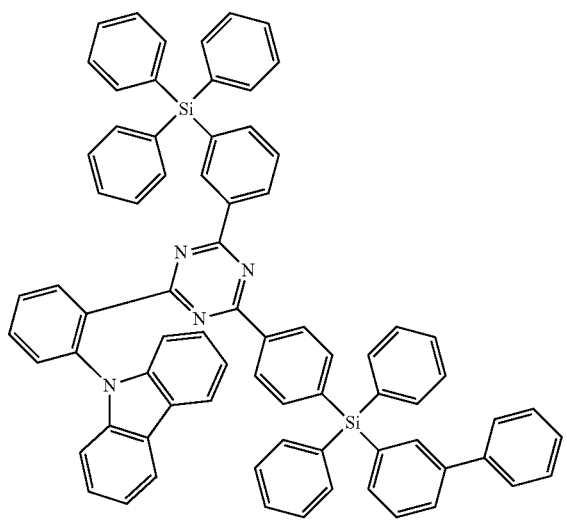
ETH-13
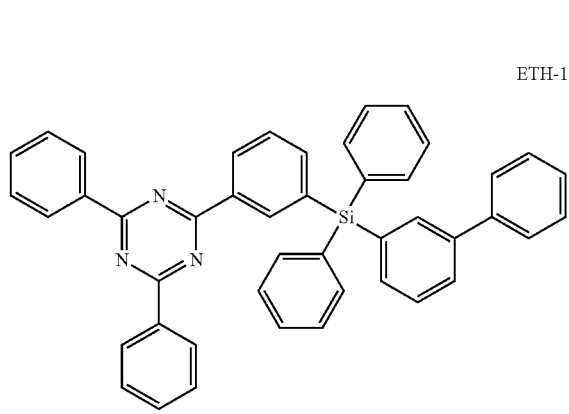
ETH-14
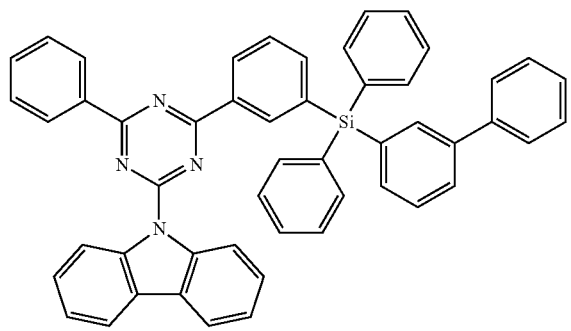
ETH-15
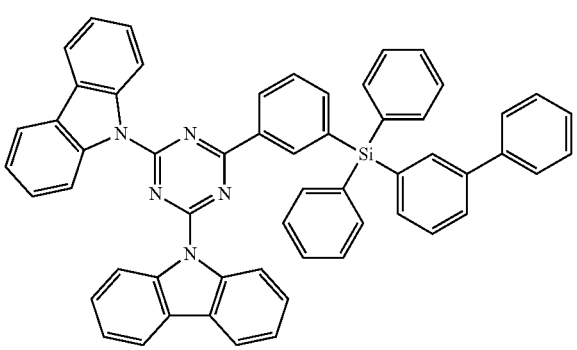
ETH-16
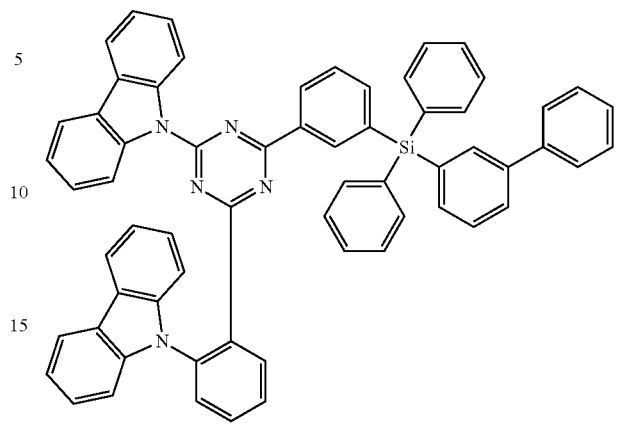
ETH-17
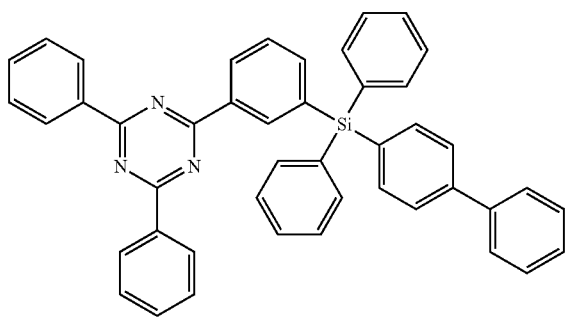
ETH-18
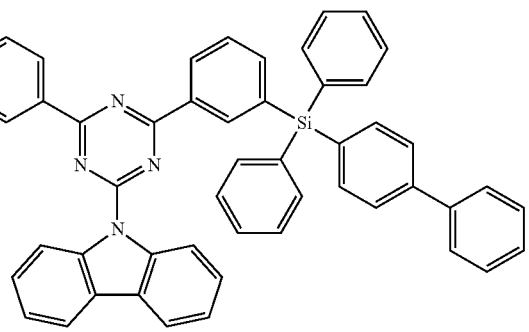
ETH-19
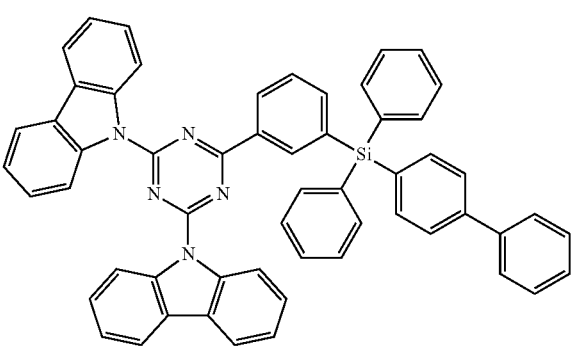

ETH-20
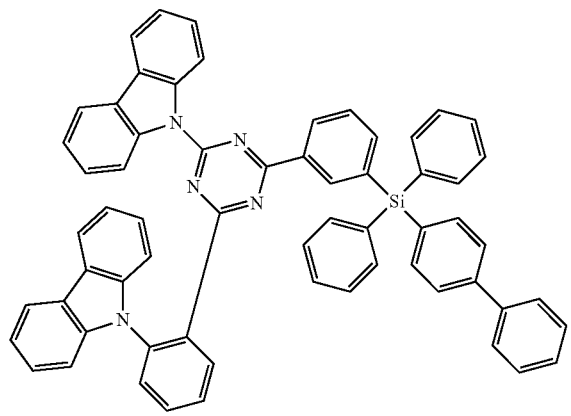
ETH-21
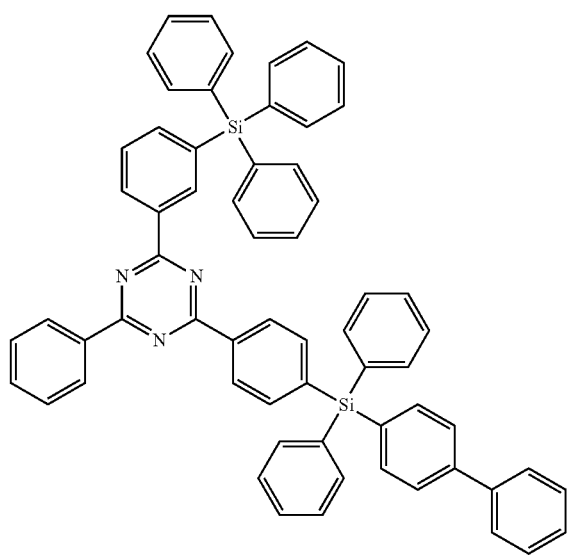
ETH-22
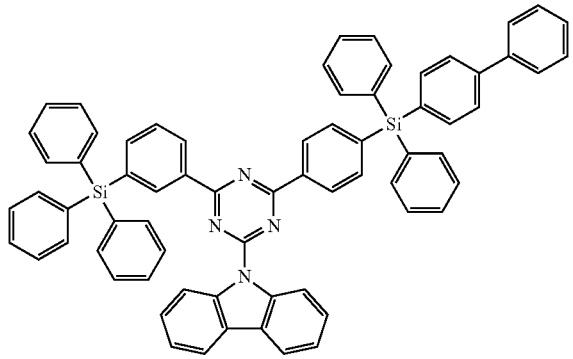
ETH-23
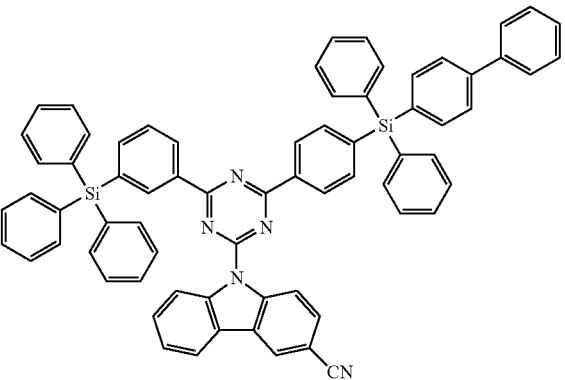
ETH-24
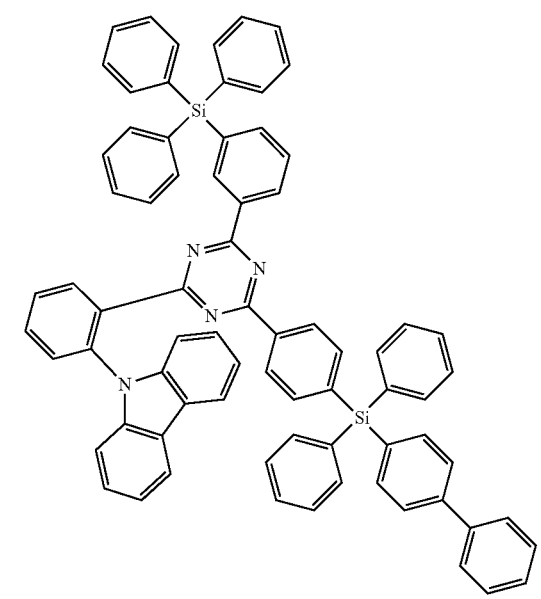
ETH-25
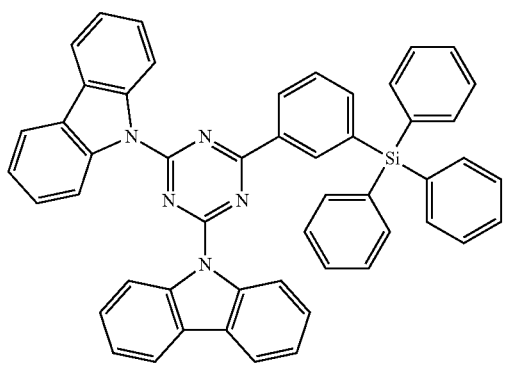

ETH-26
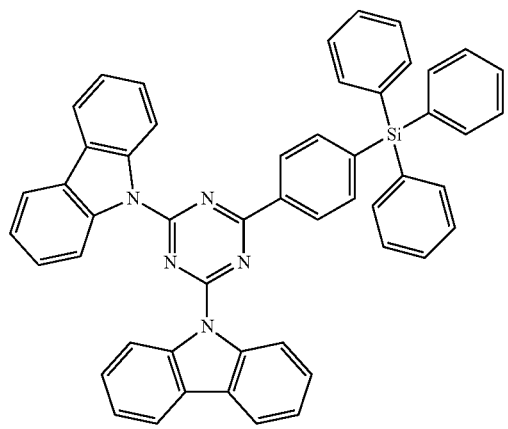
ETH-27
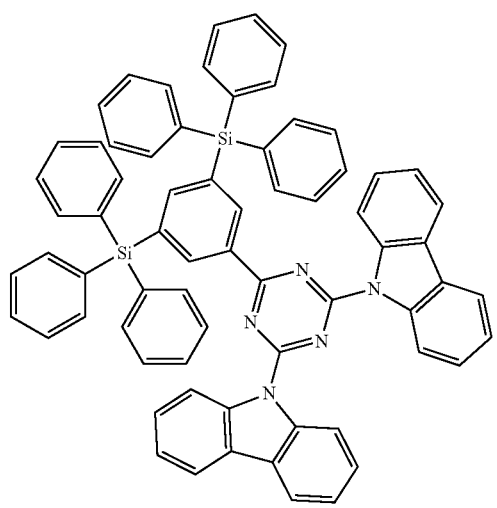
ETH-28
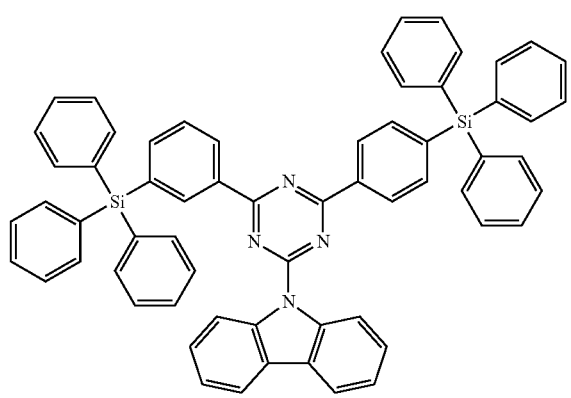
ETH-29
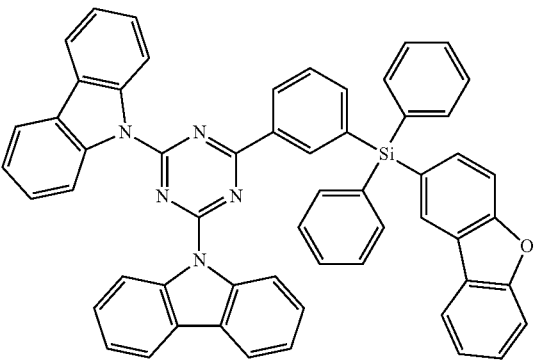
ETH-30
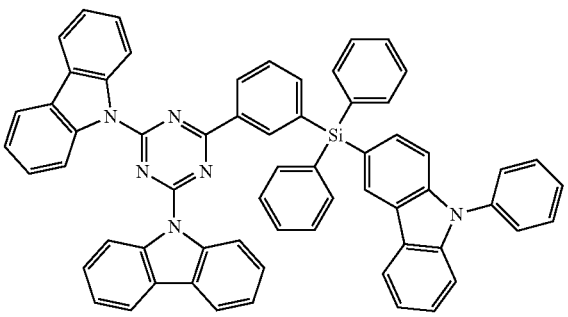
ETH-31
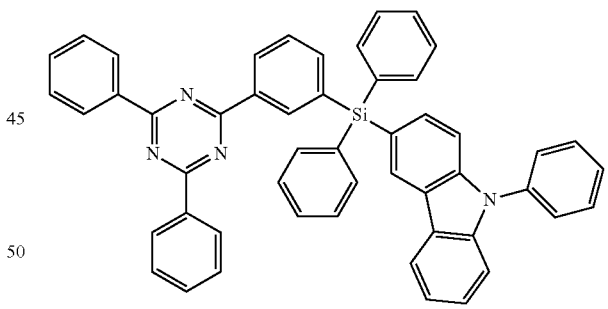
ETH-32
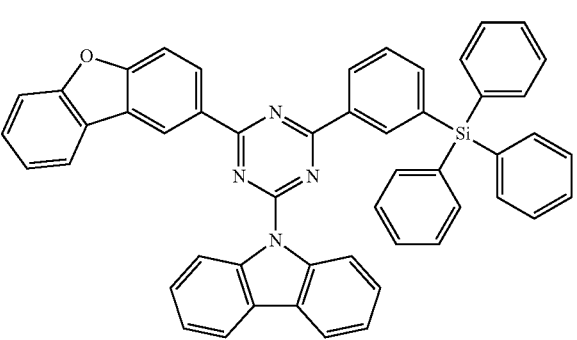

ETH-33
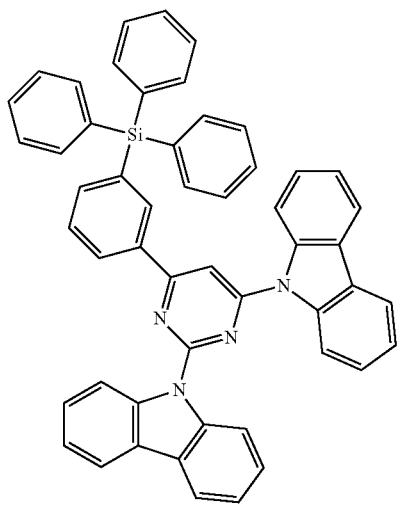
ETH-34
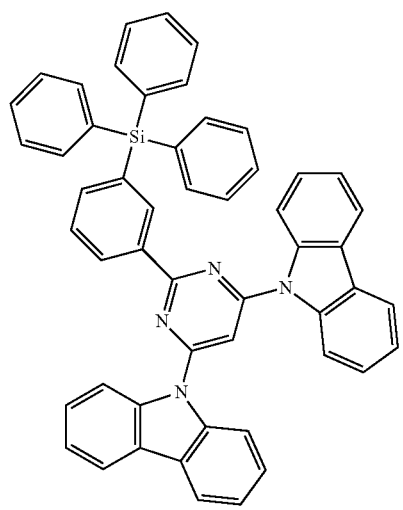
ETH-35
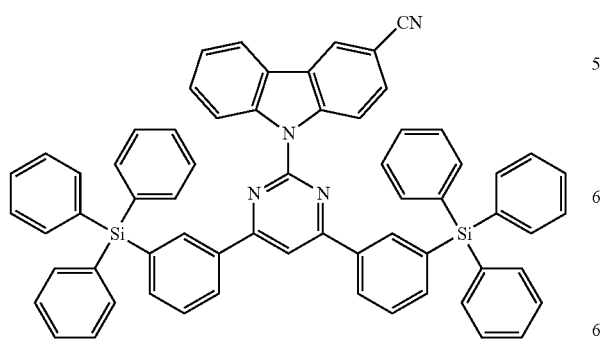
ETH-36
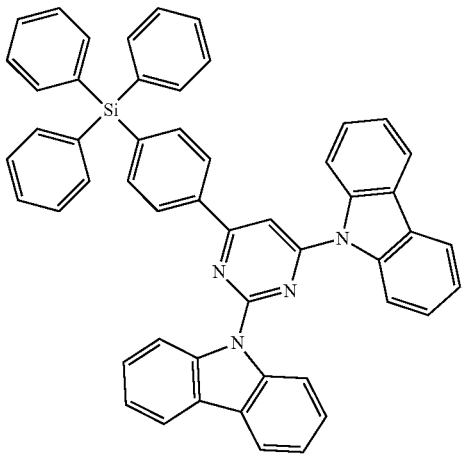
ETH-37
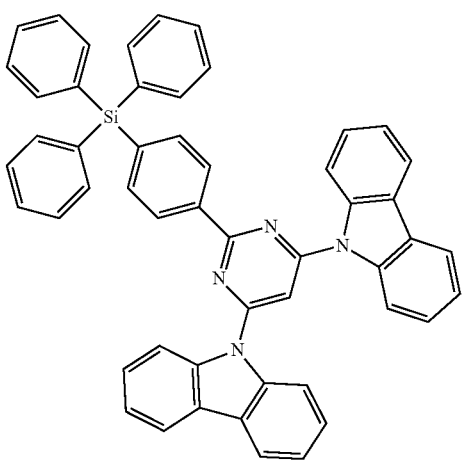
ETH-38
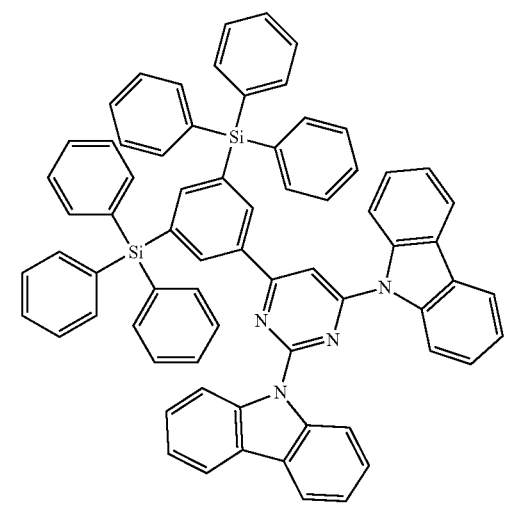

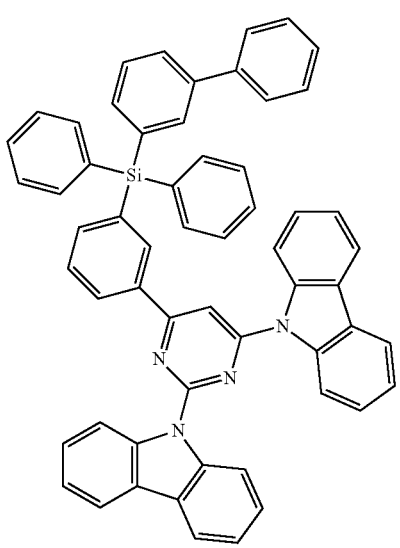
ETH-39
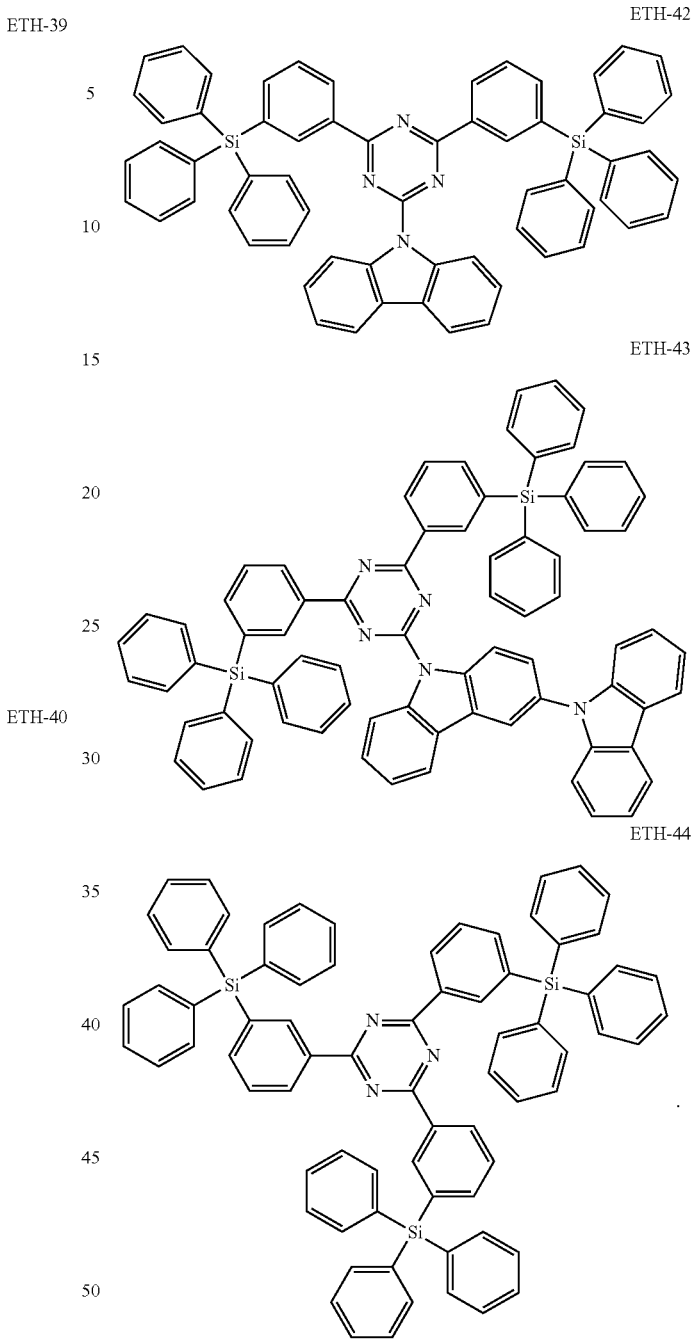
ETH-42
ETH-43
ETH-44
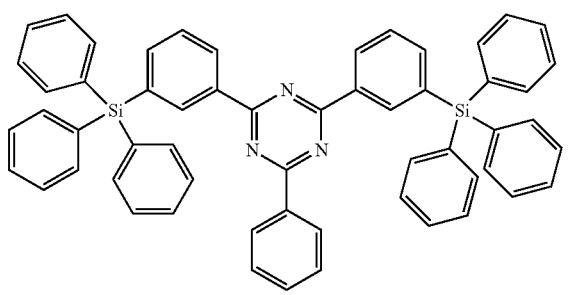
ETH-40
ETH-41
11. The light-emitting device of claim 1, wherein the second electron transport compound is represented by Formula 3:
$$\underset{R_{32}}{\underset{N}{\overset{R_{30}}{\triangle}}\underset{N}{\overset{N}{\triangle}}\overset{R_{31}}{}}$$ [Formula 3]

wherein in Formula 3, $R_{30}$ to $R_{32}$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group unsubstituted or substituted with at least one $R_{10b}$, a $C_2$-$C_{60}$ alkenyl group unsubstituted or substituted with at least one $R_{10b}$, a $C_2$-$C_{60}$ alkynyl group unsubstituted or substituted with at least one $R_{10b}$, a $C_1$-$C_{60}$ alkoxy group unsubstituted or substituted with at least one $R_{10b}$, a $C_3$-$C_{10}$ cycloalkyl group unsubstituted or substituted with at least one $R_{10b}$, a $C_1$-$C_{10}$ heterocycloalkyl group unsubstituted or substituted with at least one $R_{10b}$, a $C_3$-$C_{10}$ cycloalkenyl group unsubstituted or substituted with at least one $R_{10b}$, a $C_1$-$C_{10}$ heterocycloalkenyl group unsubstituted or substituted with at least one $R_{10b}$, a $C_6$-$C_{60}$ aryl group unsubstituted or substituted with at least one $R_{10b}$, a $C_6$-$C_{60}$ aryloxy group unsubstituted or substituted with at least one $R_{10b}$, a $C_6$-$C_{60}$ arylthio group unsubstituted or substituted with at least one $R_{10b}$, a $C_1$-$C_{60}$ heteroaryl group unsubstituted or substituted with at least one $R_{10b}$, a $C_1$-$C_{60}$ heteroaryloxy group unsubstituted or substituted with at least one $R_{10b}$, a $C_1$-$C_{60}$ heteroarylthio group unsubstituted or substituted with at least one $R_{10b}$, a monovalent non-aromatic condensed polycyclic group unsubstituted or substituted with at least one $R_{10b}$, a monovalent non-aromatic condensed heteropolycyclic group unsubstituted or substituted with at least one $R_{10b}$, —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), or —P(=S)($Q_1$)($Q_2$), $R_{10b}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ arylalkyl group, a $C_2$-$C_{60}$ heteroaryl alkyl group, —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —N($Q_{31}$)($Q_{32}$), —B($Q_{31}$)($Q_{32}$), —C(=O)($Q_{31}$), —S(=O)$_2$($Q_{31}$), —P(=O)($Q_{31}$)($Q_{32}$), or —Si($Q_{41}$)($Q_{42}$)($Q_{43}$), $Q_1$ to $Q_1$, $Q_{11}$ to $Q_{13}$, $Q_{21}$ to $Q_{23}$, and $Q_{31}$ to $Q_{32}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof, at least one of $Q_{41}$ to $Q_{43}$ is: a $C_6$-$C_{20}$ aryl group substituted with a $C_1$-$C_{20}$ heteroaryl group substituted with a $C_6$-$C_{20}$ aryl group; or a $C_6$-$C_{20}$ aryl group substituted with a $C_1$-$C_{20}$ heteroaryl group substituted with a $C_1$-$C_{20}$ heteroaryl group, and the remainder of $Q_{41}$ to $Q_{43}$ are the same as described in connection with $Q_1$.

12. The light-emitting device of claim 1, wherein the second electron transport compound is selected from Compounds ET-1 to ET-20:

ET-1

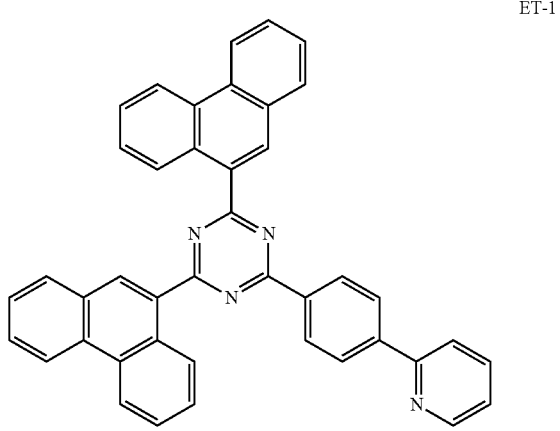

ET-2

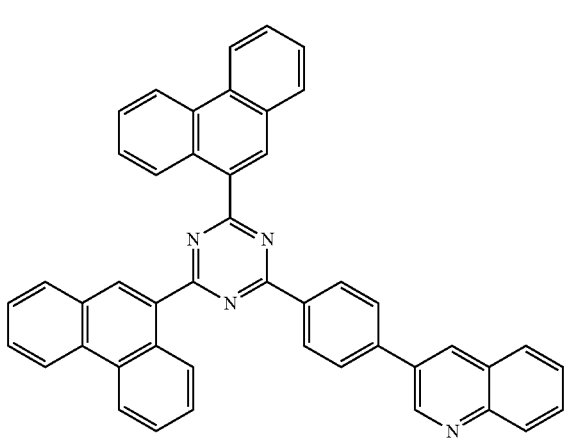

ET-3
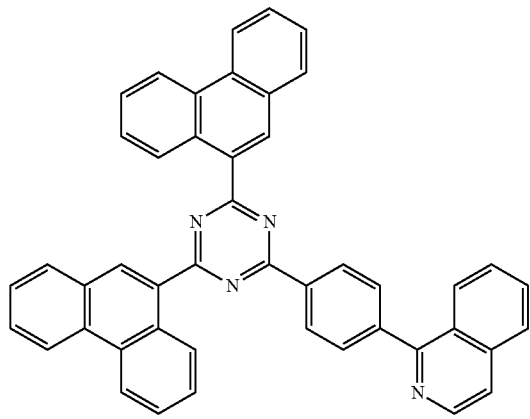
ET-4
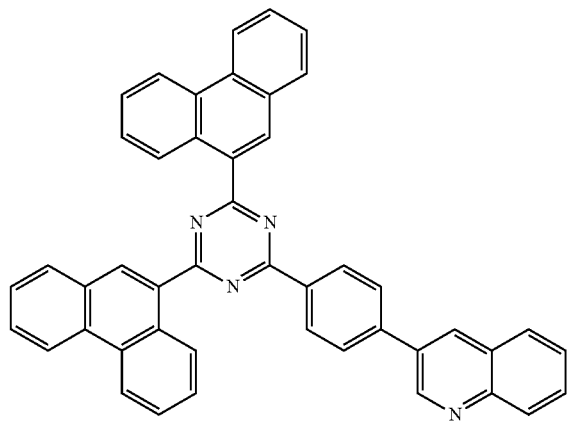
ET-5
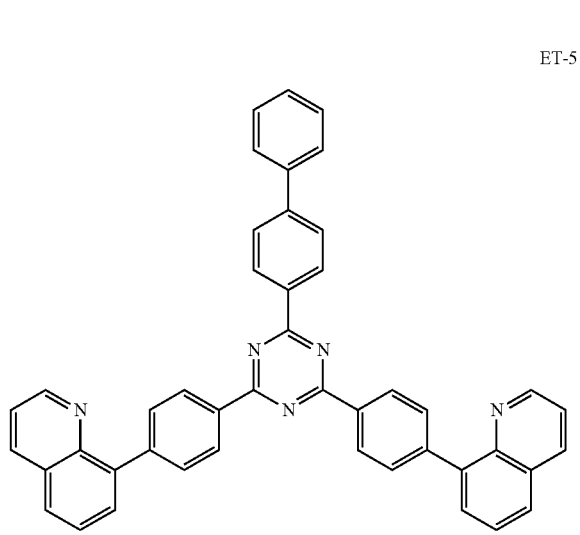
ET-6
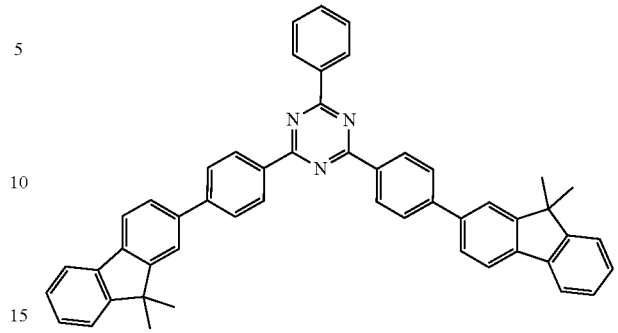
ET-7
ET-8
ET-9
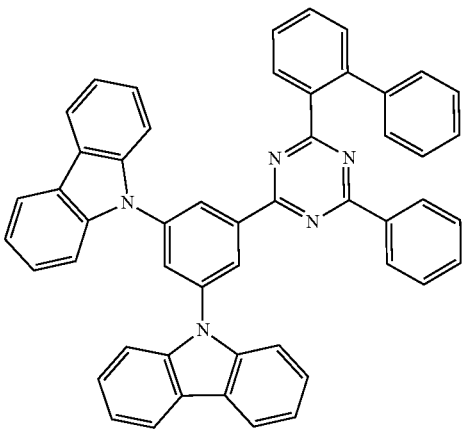

ET-10
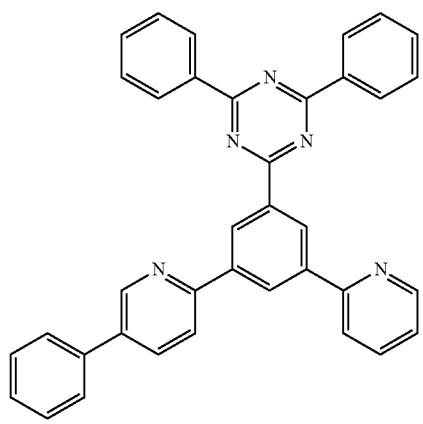
ET-11
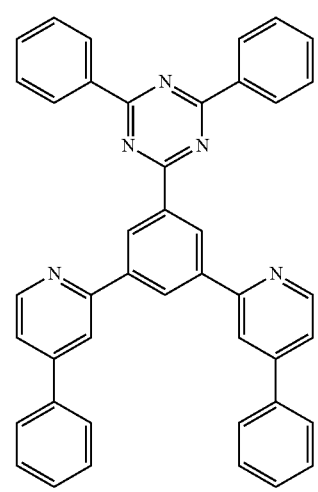
ET-12
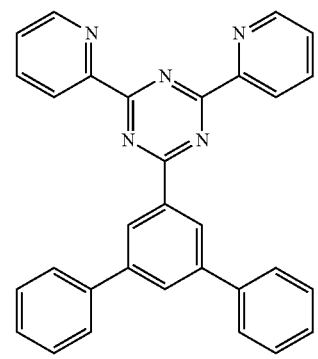
ET-13
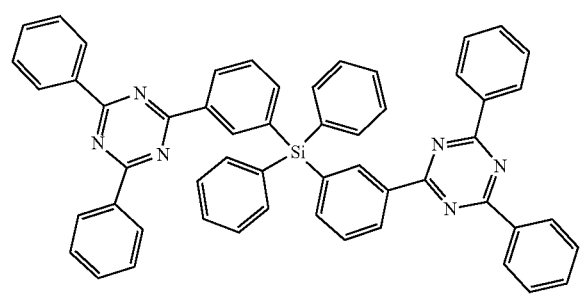
ET-14
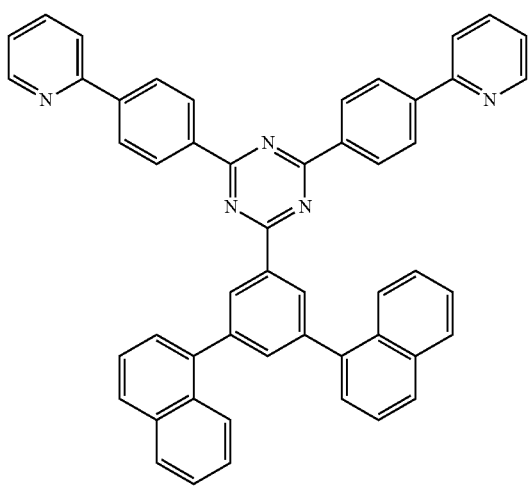
ET-15
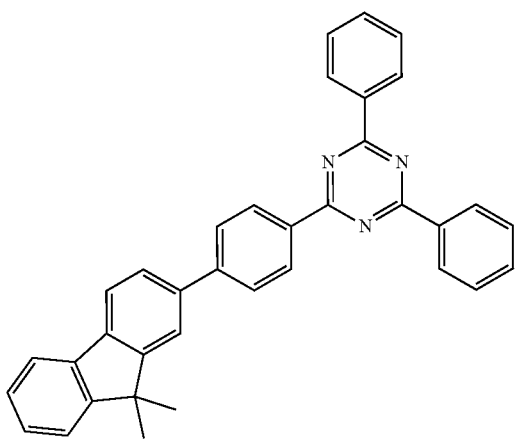
ET-16
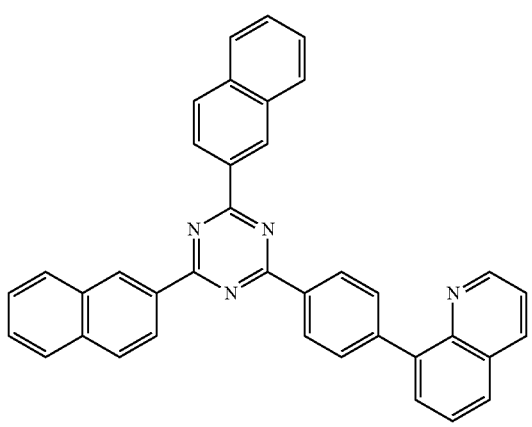

-continued

ET-17
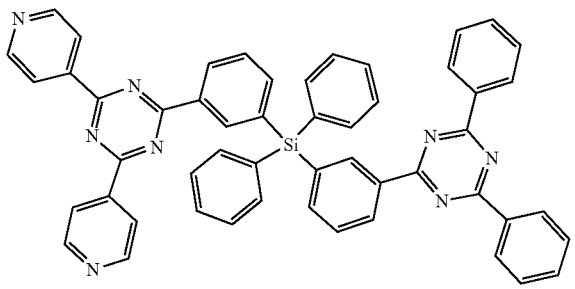

ET-18
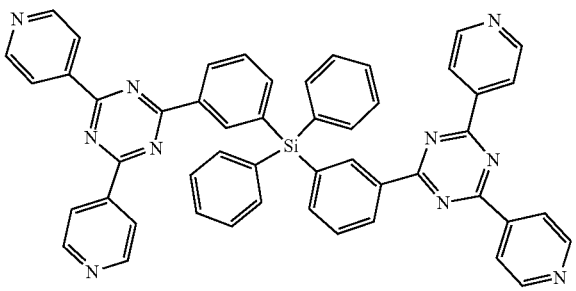

ET-19
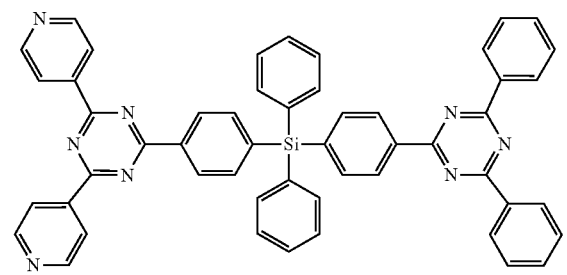

ET-20
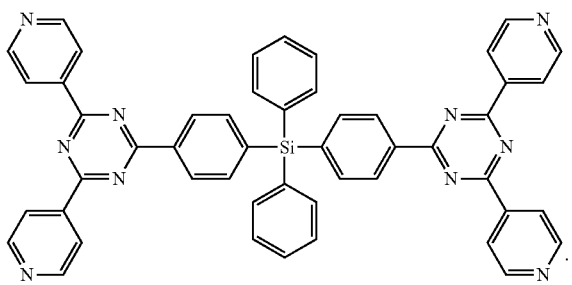

13. The light-emitting device of claim 1, wherein the third compound is represented by Formula 401:

$$M(L_{401})_{xc1}(L_{402})_{xc2}$$ [Formula 401]

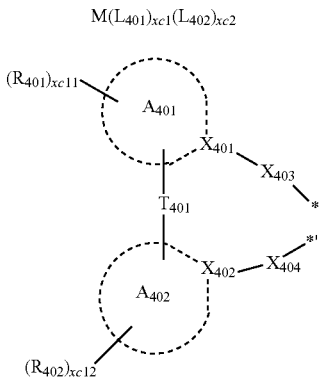

[Formula 402]

wherein in Formulae 401 and 402,

M is a transition metal, $L_{401}$ is a ligand represented by Formula 402, xc1 is 1, 2, or 3, when xc1 is 2 or more, two or more of $L_{401}$ are identical to or different from each other, $L_{402}$ is an organic ligand, xc2 is 0, 1, 2, 3, or 4, when xc2 is 2 or more, two or more of $L_{402}$ are identical to or different from each other, $X_{401}$ and $X_{402}$ are each independently nitrogen or carbon, ring $A_{401}$ and ring $A_{402}$ are each independently a $C_3$-$C_{60}$ carbocyclic group or a $C_1$-$C_{60}$ heterocyclic group, $T_{401}$ is a single bond, —O—, —S—, —C(=O)—, —N($Q_{411}$)—, —C($Q_{411}$)($Q_{412}$)—, —C($Q_{411}$)=C($Q_{412}$)—, —C($Q_{411}$)=, or =C=, $X_{403}$ and $X_{404}$ are each independently a chemical bond, O, S, N($Q_{413}$), B($Q_{413}$), P($Q_{413}$), C($Q_{413}$)($Q_{414}$), or Si($Q_{413}$)($Q_{414}$), $R_{401}$ and $R_{402}$ are each independently hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), xc11 and xc12 are each independently an integer from 0 to 10,

* and *' in Formula 402 each indicate a binding site to M in Formula 401, and $Q_{411}$ to $Q_{414}$ and $Q_{401}$ to $Q_{403}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, a $C_1$-$C_{60}$ heterocyclic group, a $C_7$-$C_{60}$ arylalkyl group, or a $C_2$-$C_{60}$ heteroaryl alkyl group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

14. The light-emitting device of claim 1, wherein the third compound is selected from Compounds BD1 to BD6:

BD1

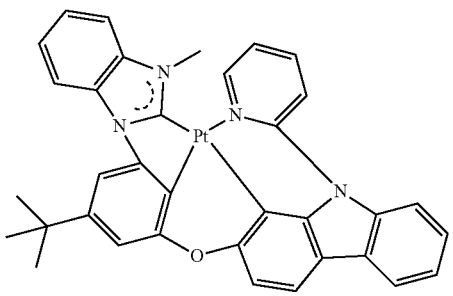

BD2

BD3

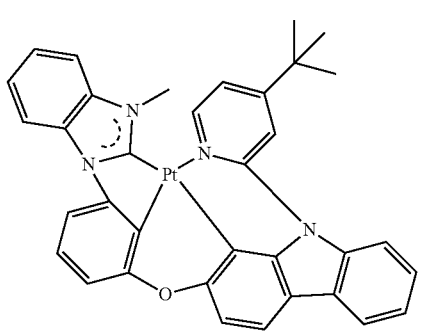

BD4

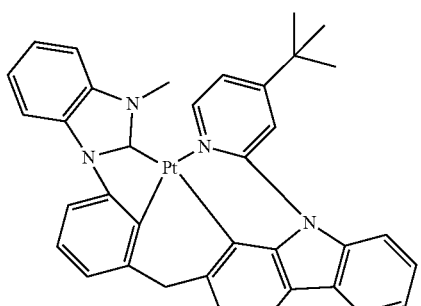

-continued

BD5

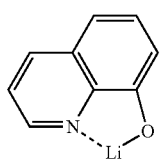

BD6

15. The light-emitting device of claim 1, wherein the metal-containing material comprises an alkali metal complex, an alkaline earth metal complex, or a combination thereof.

16. The light-emitting device of claim 1, wherein the metal-containing material comprises Compound ET-D1, Compound ET-D2, or LiF:

ET-D1

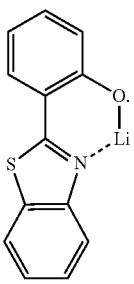

ET-D2

17. An electronic apparatus comprising the light-emitting device of claim 1.

18. The electronic apparatus of claim 17, further comprising a thin-film transistor, wherein
  the thin-film transistor comprises a source electrode and a drain electrode, and
  the first electrode of the light-emitting device is electrically connected to at least one of the source electrode or the drain electrode.

* * * * *